US012695059B2

(12) United States Patent
Drewery et al.

(10) Patent No.: US 12,695,059 B2
(45) Date of Patent: Jul. 28, 2026

(54) SYNCHRONIZATION OF RF PULSING SCHEMES AND OF SENSOR DATA COLLECTION

(71) Applicant: Lam Research Corporation, Fremont, CA (US)

(72) Inventors: John Stephen Drewery, San Jose, CA (US); Ying Wu, Livermore, CA (US); Alexander Miller Paterson, San Jose, CA (US); Luc Albarede, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 761 days.

(21) Appl. No.: 18/009,978

(22) PCT Filed: Oct. 15, 2021

(86) PCT No.: PCT/US2021/055152
§ 371 (c)(1),
(2) Date: Dec. 12, 2022

(87) PCT Pub. No.: WO2022/093551
PCT Pub. Date: May 5, 2022

(65) Prior Publication Data
US 2023/0230805 A1      Jul. 20, 2023

Related U.S. Application Data

(60) Provisional application No. 63/105,708, filed on Oct. 26, 2020.

(51) Int. Cl.
*H01J 37/32*      (2006.01)

(52) U.S. Cl.
CPC .. *H01J 37/32174* (2013.01); *H01J 37/32146* (2013.01)

(58) Field of Classification Search
CPC ..................... H01J 37/32174; H01J 37/32146
See application file for complete search history.

(56) References Cited

U.S. PATENT DOCUMENTS 9,378,931 B2      6/2016  Kwon et al.
9,754,767 B2      9/2017  Kawasaki
(Continued)

OTHER PUBLICATIONS

ISR & WO PCT/US2021/055152, dated Feb. 15, 2022, 9 pages.

*Primary Examiner* — Binh X Tran
*Assistant Examiner* — Christopher Remavege
(74) *Attorney, Agent, or Firm* — Polygon IP, LLP

(57)      ABSTRACT

Systems and methods for synchronization of radio frequency (RF) pulsing schemes and of sensor data collection are described. One of the methods includes receiving, by an RF generator, a first set of one or more variable levels and one or more duty cycles of an RF signal. The method further includes receiving, by the RF generator from a pulse controller, a synchronization signal having a plurality of pulses. The method also includes generating, during a clock cycle of a clock signal, multiple instances of a first plurality of states of the RF signal in synchronization with the plurality of pulses of the synchronization signal. Each of the first plurality of states of the RF signal has a corresponding one of the one or more variable levels of the first set and a corresponding one of the one or more duty cycles of the first set.

12 Claims, 15 Drawing Sheets

(Ether CAT to Minimize info Stored in RF Generators)

(56)                   References Cited

U.S. PATENT DOCUMENTS

| | | | | |
|---|---|---|---|---|
| 10,191,466 | B2 | 1/2019 | Valcore, Jr. et al. | |
| 10,269,540 | B1 | 4/2019 | Carter et al. | |
| 10,366,869 | B2 | 7/2019 | Riggs et al. | |
| 10,811,228 | B2 * | 10/2020 | Van Zyl ............ | H01J 37/32697 |
| 12,278,112 | B2 * | 4/2025 | Joi .................... | H01J 37/32146 |
| 2002/0029851 | A1 * | 3/2002 | Edamura ........... | H01J 37/32935 |
| | | | | 118/723 R |
| 2007/0115158 | A1 * | 5/2007 | Zoso ....................... | G06F 1/025 |
| | | | | 341/143 |
| 2009/0294061 | A1 | 12/2009 | Shannon et al. | |
| 2014/0020831 | A1 * | 1/2014 | Ohgoshi ........... | H01J 37/32192 |
| | | | | 156/345.24 |
| 2015/0279624 | A1 * | 10/2015 | Toyota .............. | H01J 37/32192 |
| | | | | 156/345.28 |
| 2017/0103873 | A1 * | 4/2017 | Kawasaki ......... | H01J 37/32183 |
| 2017/0323771 | A1 * | 11/2017 | Choi ................. | H01J 37/32155 |
| 2020/0144025 | A1 | 5/2020 | Radomski et al. | |
| 2020/0168438 | A1 * | 5/2020 | Shoeb ............... | H01J 37/32183 |

* cited by examiner

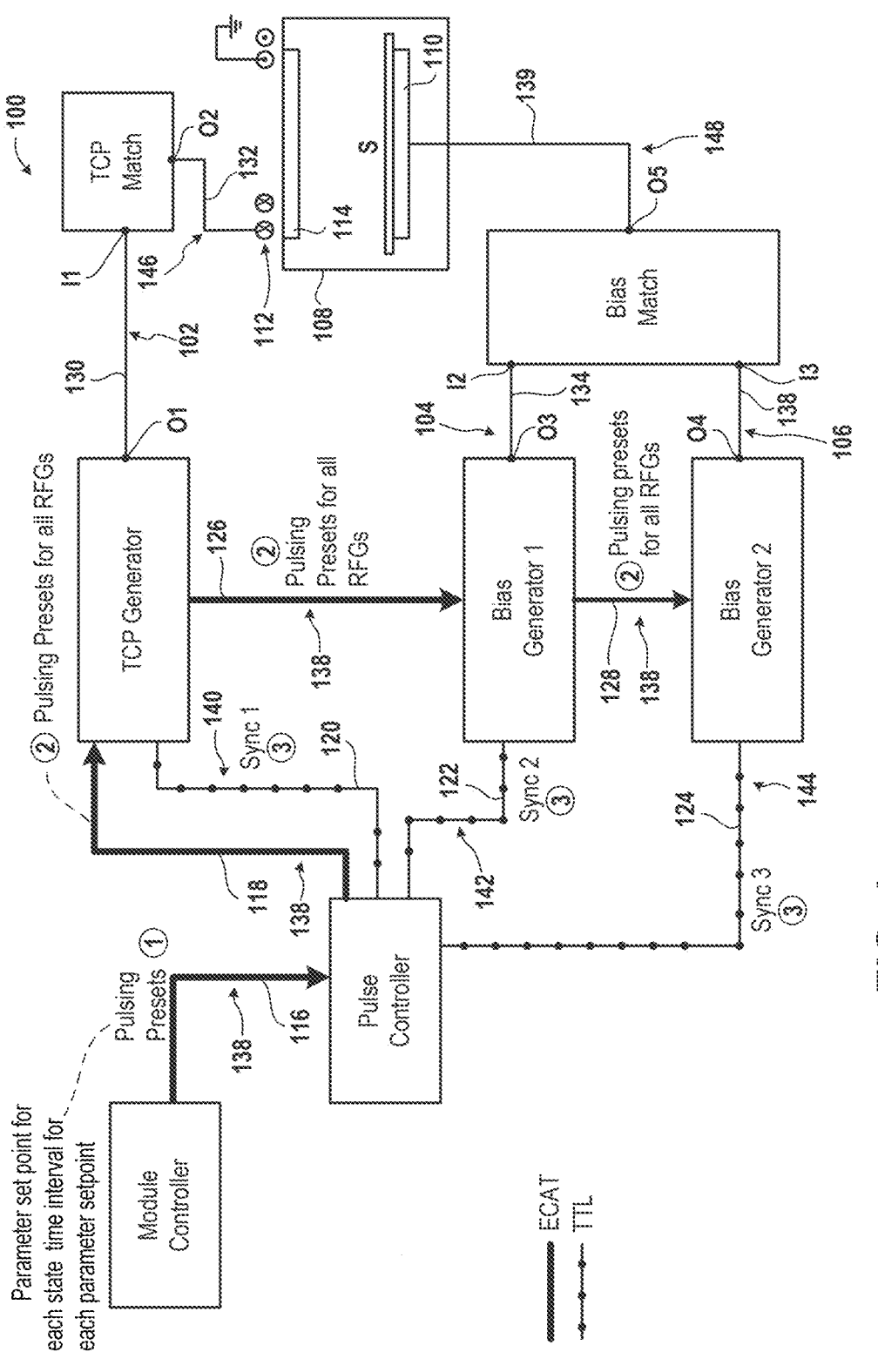
FIG. 1 (Ether CAT to Minimize info Stored in RF Generators)

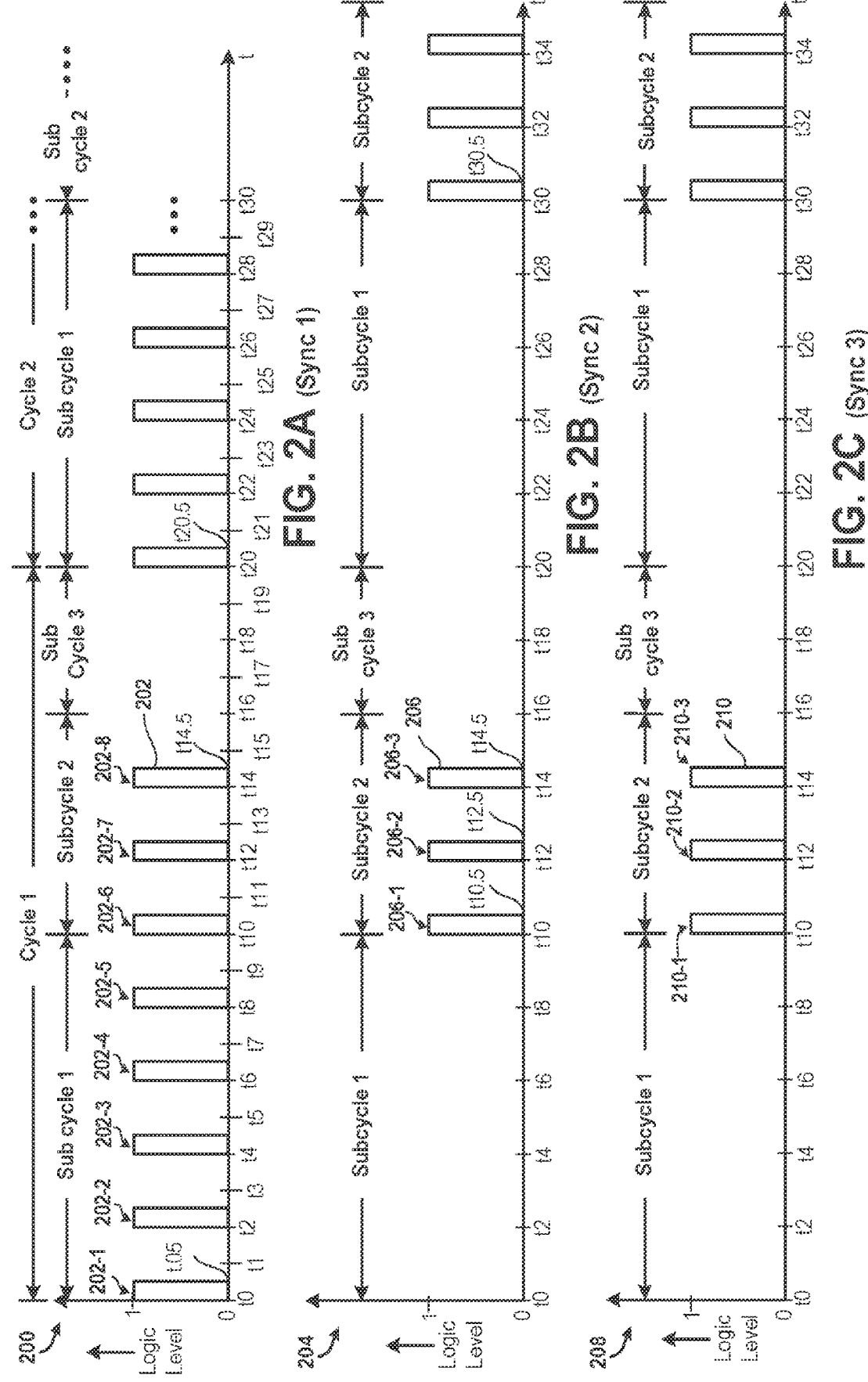
FIG. 2A (Sync 1)
FIG. 2B (Sync 2)
FIG. 2C (Sync 3)

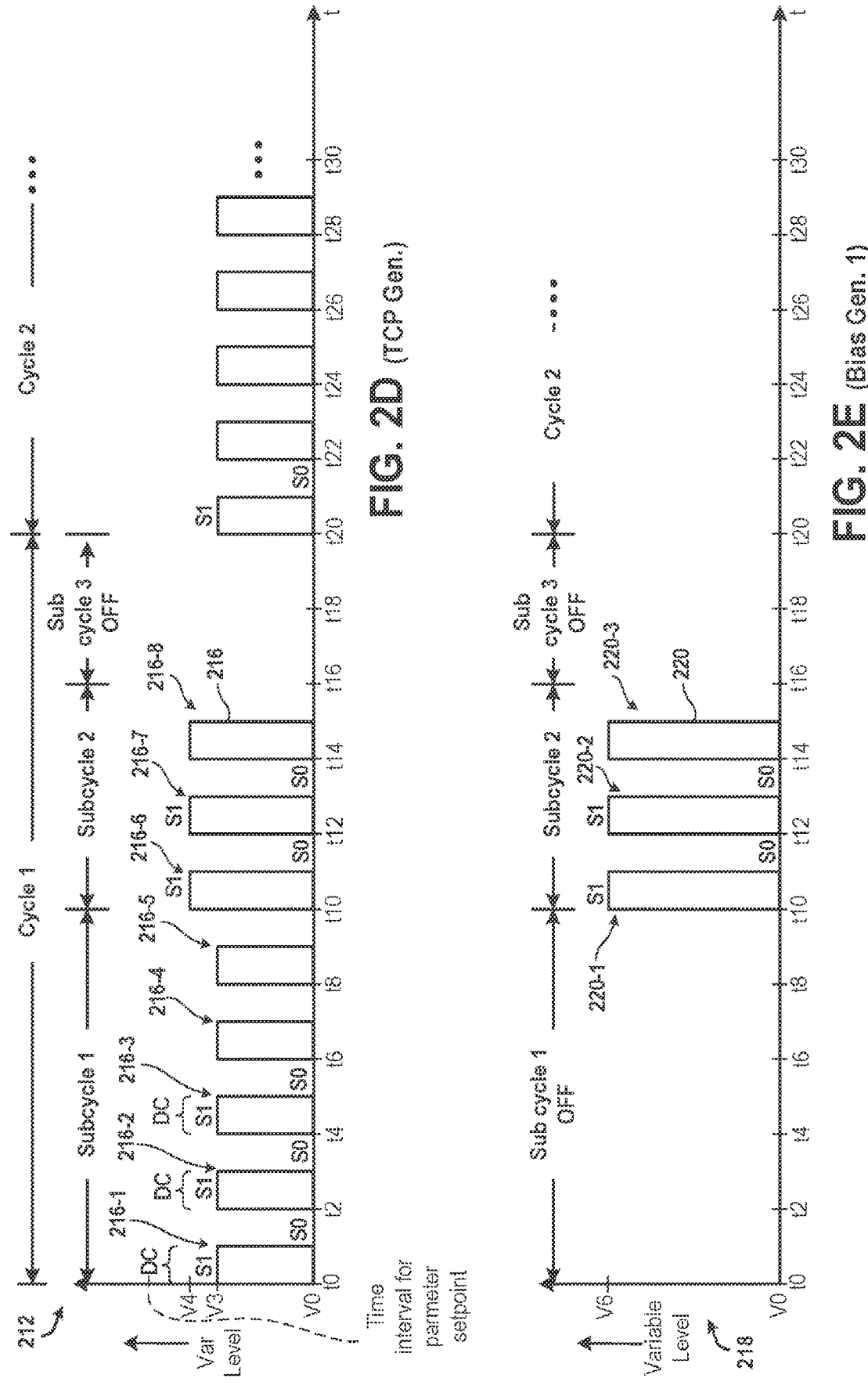
FIG. 2D (TCP Gen.)
FIG. 2E (Bias Gen. 1)

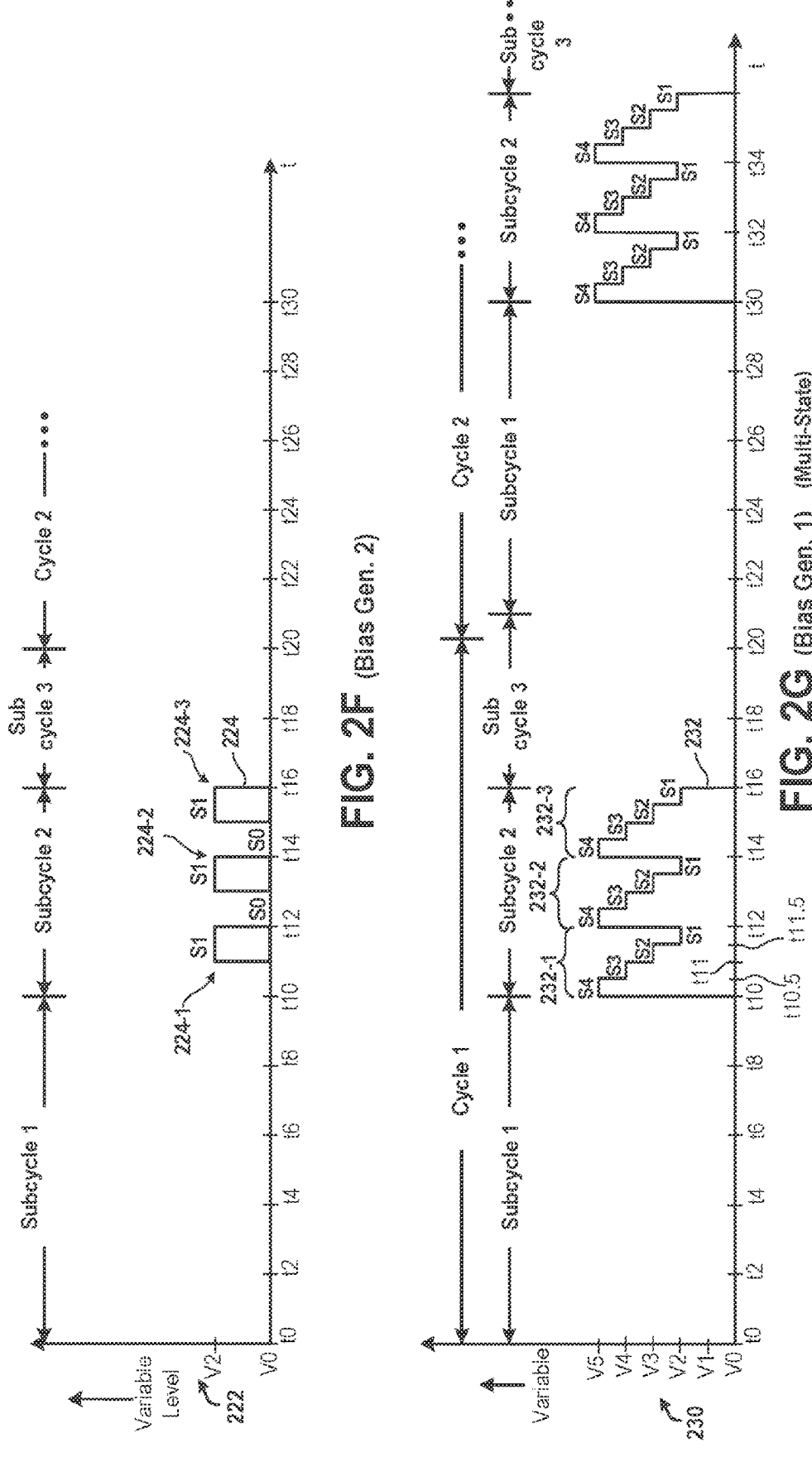
FIG. 2F (Bias Gen. 2)
FIG. 2G (Bias Gen. 1) (Multi-State)

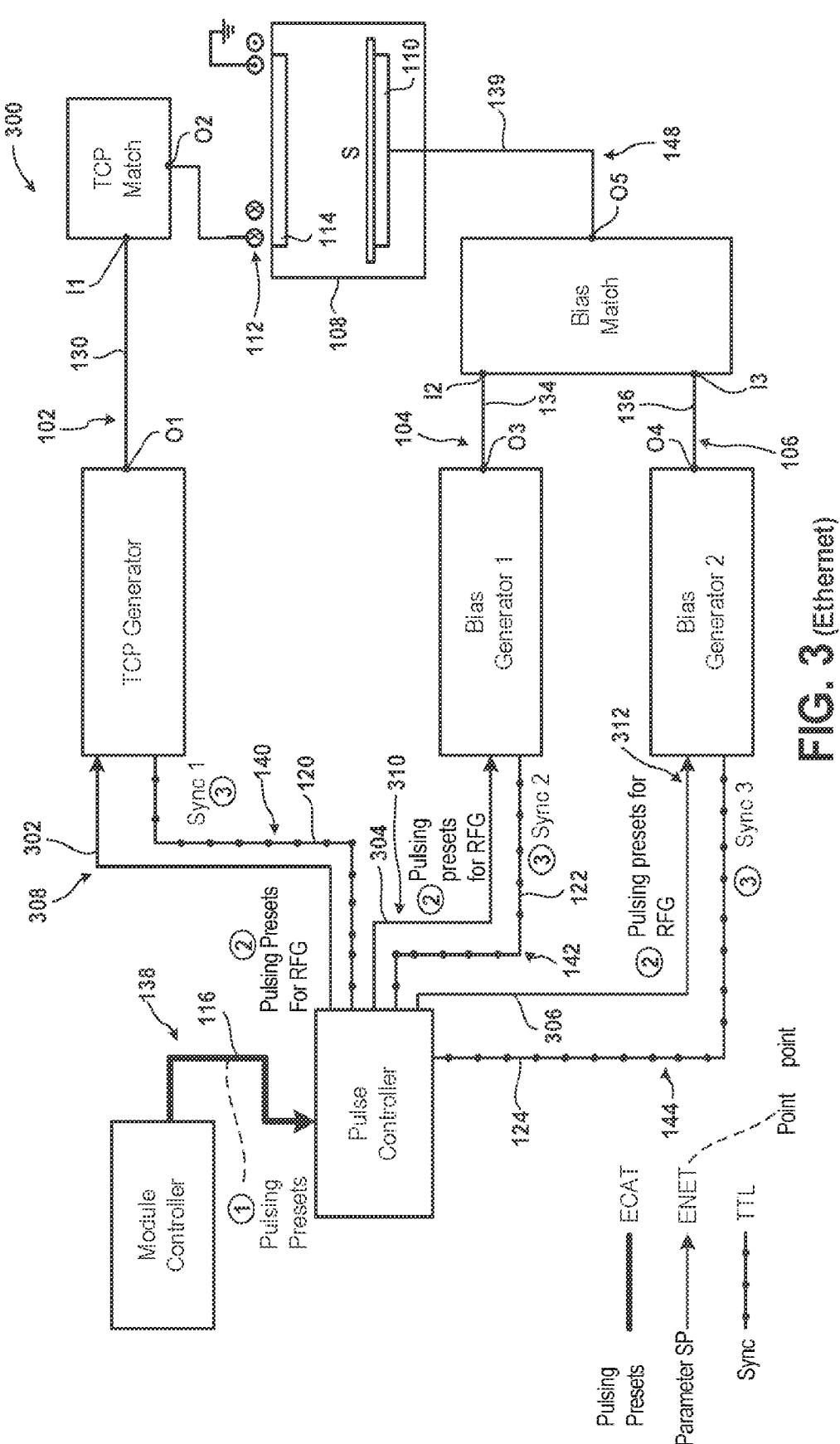
FIG. 3 (Ethernet)

(EtherCAT w. Sensors)

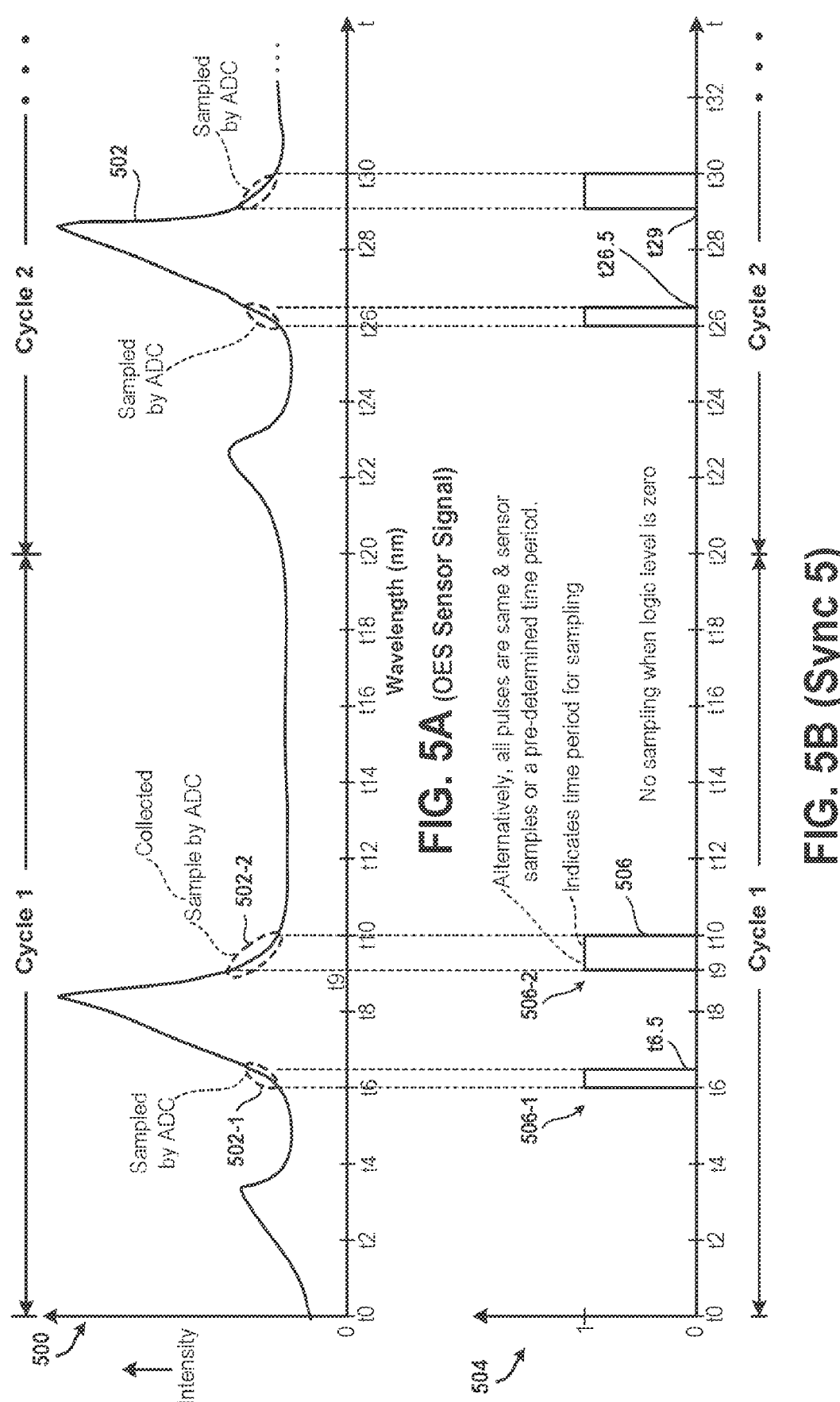
FIG. 5A (OES Sensor Signal)
FIG. 5B (Sync 5)

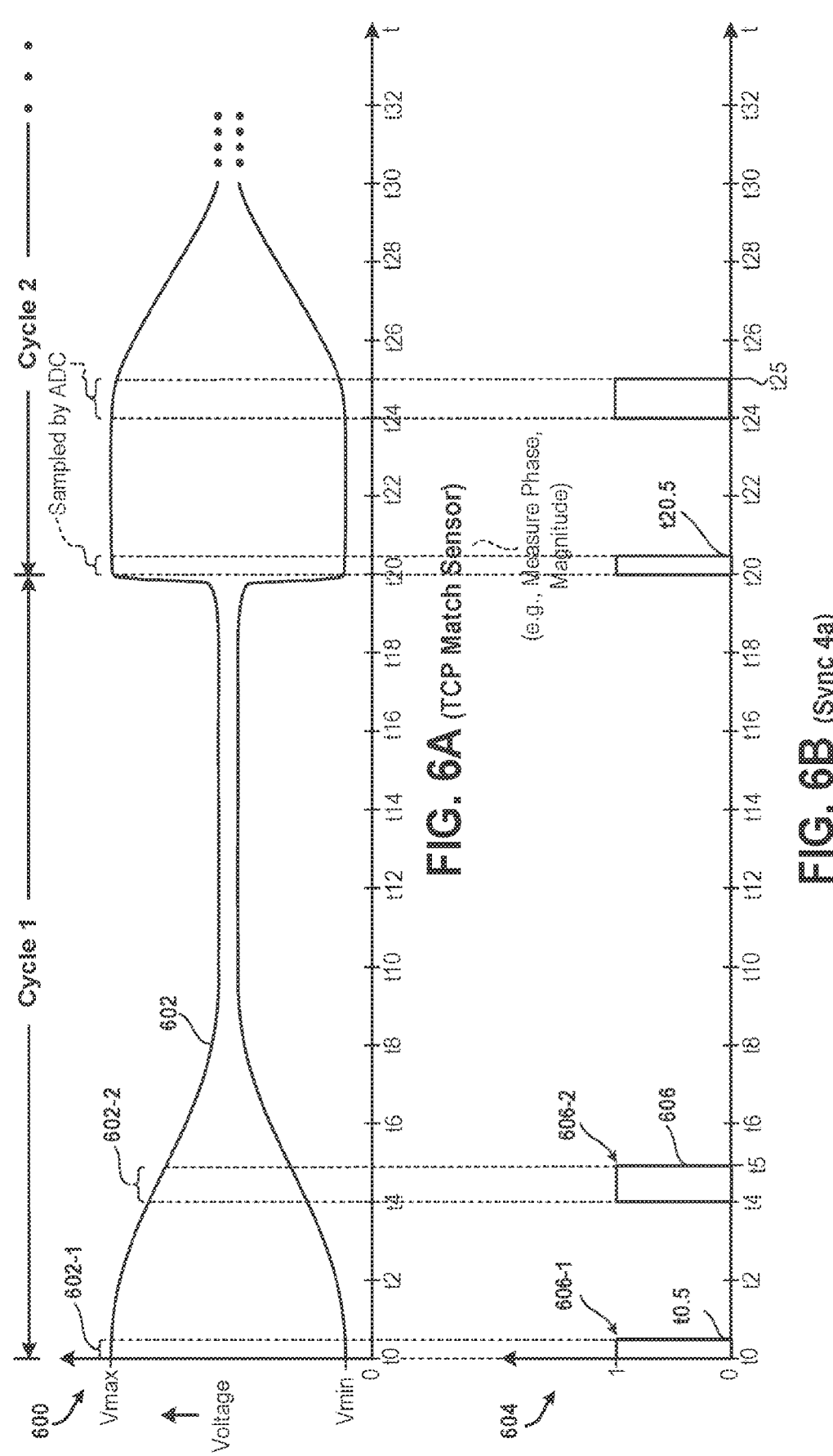
FIG. 6A (TCP Match Sensor)
FIG. 6B (Sync 4a)

(Bias Match Sensor)

FIG. 6D (Sync 4b)

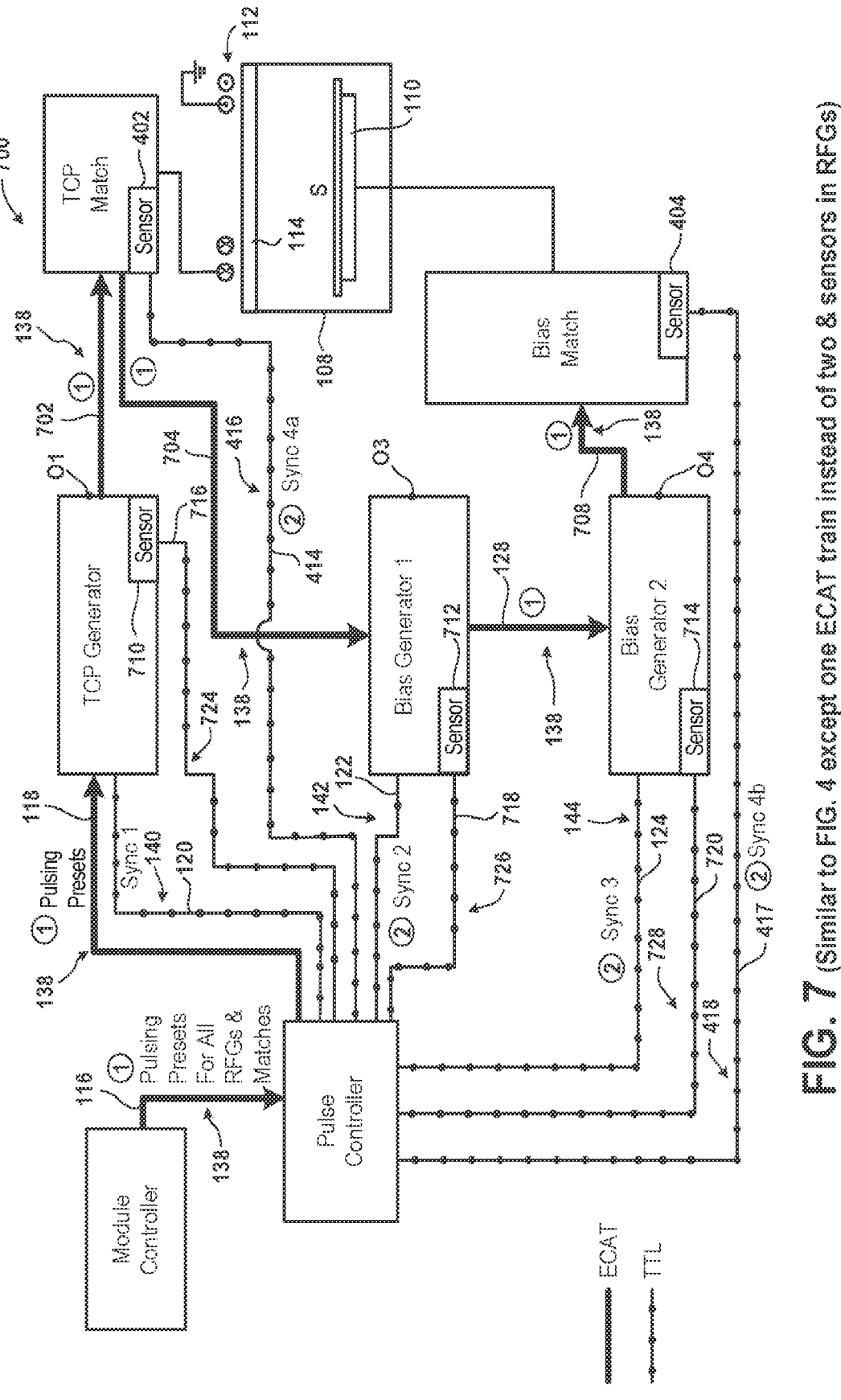
FIG. 7 (Similar to FIG. 4 except one ECAT train instead of two & sensors in RFGs)

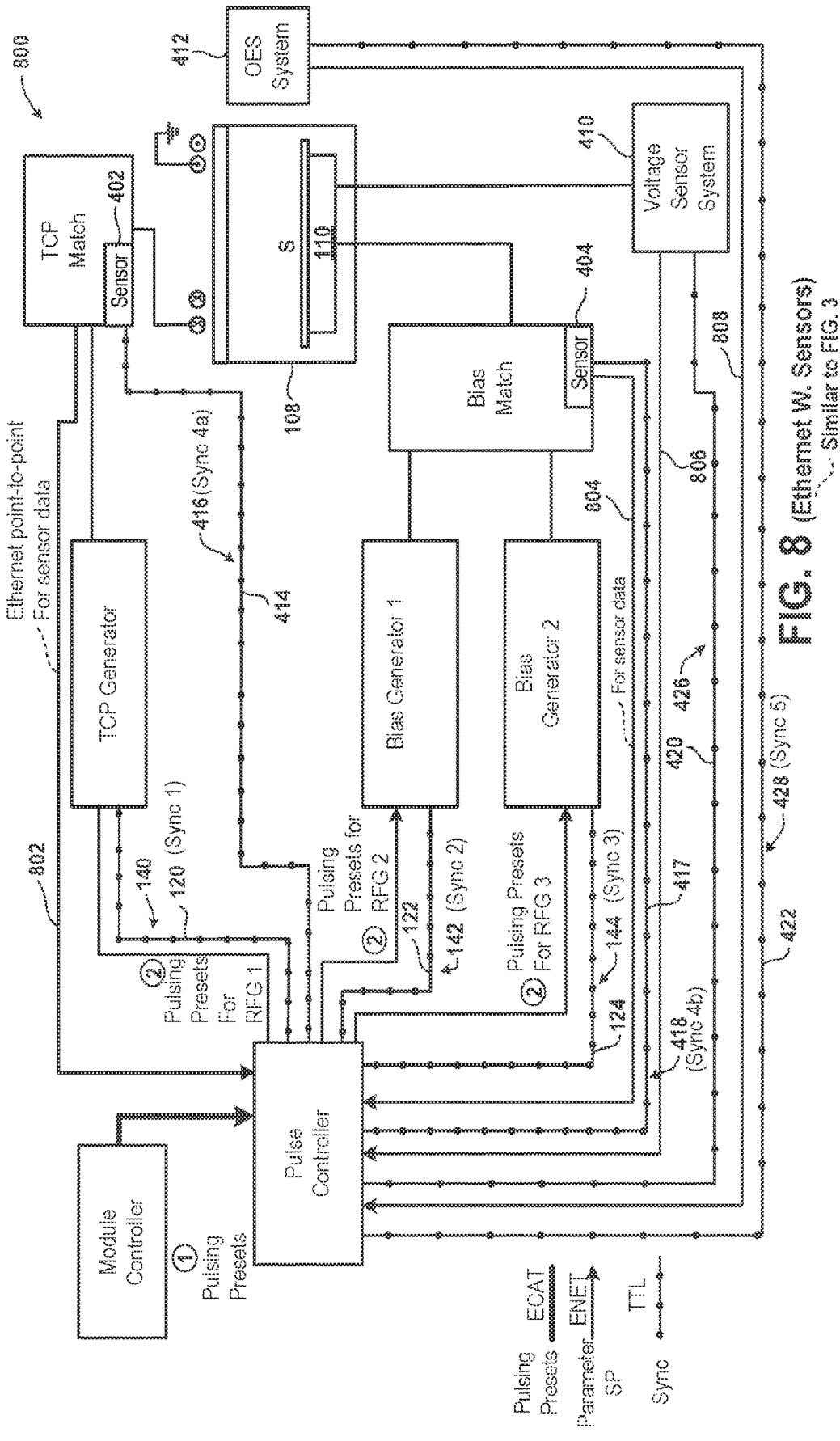
FIG. 8 (Ethernet W. Sensors)
Similar to FIG. 3

SYNCHRONIZATION OF RF PULSING SCHEMES AND OF SENSOR DATA COLLECTION

CLAIM OF PRIORITY

This application is a national stage filing of and claims priority, under 35 U.S.C. § 371, to PCT/US21/55152, filed on Oct. 15, 2021, and titled "SYNCHRONIZATION OF RF PULSING SCHEMES AND OF SENSOR DATA COLLEC-TION", which claims the benefit of and priority, under 35 U.S.C. § 119(e), to U.S. Provisional Patent Application No. 63/105,708, filed on Oct. 26, 2020, and titled "SYNCHRO-NIZATION OF RF PULSING SCHEMES AND OF SEN-SOR DATA COLLECTION", all of which are incorporated by reference herein in their entirety.

FIELD

The present embodiments relate to systems and methods for synchronization of radio frequency (RF) pulsing schemes and of sensor data collection.

BACKGROUND

The background description provided herein is for the purposes of generally presenting the context of the disclo-sure. Work of the presently named inventors, to the extent it is described in this background section, as well as aspects of the description that may not otherwise qualify as prior art at the time of filing, are neither expressly nor impliedly admit-ted as prior art against the present disclosure.

In a plasma tool, multiple radio frequency (RF) generators are used. The RF generators are coupled via a match to a plasma chamber. The RF generators generate RF signals and supply the RF signals to the match. The RF signals are combined to output a modified RF signal, which is sent to the plasma chamber.

A substrate is placed within the plasma chamber for processing. The modified signal is supplied with a variety of gases to process the substrate. It is desirable to process the substrate in a desirable manner.

It is in this context that embodiments described in the present disclosure arise.

SUMMARY

Embodiments of the disclosure provide systems, appara-tus, methods and computer programs for synchronization of radio frequency (RF) pulsing schemes and of sensor data collection. It should be appreciated that the present embodi-ments can be implemented in numerous ways, e.g., a pro-cess, an apparatus, a system, a device, or a method on a computer readable medium. Several embodiments are described below.

In some RF pulsing implementations for plasma etch tools, a series of parameter values, such as power values, and durations for a number of parameter levels are downloaded to an RF generator. An RF pulse is generated by the RF generator according to the power values and durations. On receiving a trigger pulse or internally generating the trigger pulse, the RF generator emits RF energy at multiple variable levels and for the durations. The RF generator may receive numerous other parameter values to improve a degree to which delivered RF power values during the variable levels matches pre-stored power values.

When multiple RF generators are present in a plasma system, it is desirable for the RF generators to emit RF signals on a synchronized schedule. As an example, this can be achieved by providing a logic-level synchronization pulse to each RF generator. The logic-level synchronization pulses are delivered to the RF generators with the same timing parameters, such as frequency, duty cycle, and phase. In order to change pulsing behavior of the RF generators, their setpoints are updated for timing and output levels of pulses of the RF signals. A module controller can be used to generate updates to the setpoints and send the updates via a fieldbus to the RF generators. Because the module controller is responsible for a very large number of other real-time control functions of the plasma system, it is difficult for the module controller to update the setpoints at precise times on timescales below about 0.5 seconds.

Advantageous processes exist when the setpoints are updated as frequently as 50 milliseconds time intervals. As an example, to execute the processes, embedded recipes can be downloaded to and executed by each of the RF genera-tors. The recipes, which include an extensive specification of pulse levels, widths, and number of pulses to be emitted, can be downloaded to the RF generators. However, synchroni-zation between phases of these recipes may not occur. That is, a recipe for one of the RF generators may need to start at a different time than a recipe for another one of the RF generators, or a change in pulse levels of an RF signal generated by one of the RF generators should be synchro-nized with a change in pulse levels of another RF signal generated by another one of the RF generators. To achieve the synchronization between the phases, synchronization cables can be added between the RF generators correspond-ing to each desired synchronized change, but this leads to rather a complex plasma system that is hard to configure and program. Further, it is difficult to synchronize subsystems, such as metrology subsystems, for endpoint detection or metrology for RF waveform analysis.

In one embodiment, a centralized synchronization device for RF pulsing schemes is described. An example of the centralized synchronization device is a pulse controller. The centralization synchronization device allows for changing pulsing parameter values repeatedly with time scales less than about 0.5 seconds. For example, the centralization synchronization device allows for changing the pulsing parameter values for time scales between 0.1 seconds and 0.5 seconds. As another example, the centralization synchro-nization device allows for changing the pulsing parameter values for time scales between 0.05 seconds and 0.6 sec-onds.

In an embodiment, changes to the pulsing parameter values are achieved using an existing control network, such as a fieldbus, of a plasma tool by a direct slave-to-slave transfer. In one embodiment, updates to the pulsing param-eter values are achieved using a separate high-speed point-to-point communications link, such as an Ethernet cable or a fast Ethernet cable or a direct system-on-chip to system-on-chip (SoC-to-SoC) link. For example, a main SoC is used to implement a pulse controller. The main SoC is directly connected via a separate high-speed point-to-point commu-nications link, such as a cable or an optical fiber, to an RFG controller of an RF generator. The RFG controller includes at least one of a communication controller, a digital signal processor (DSP), one or more power controllers, and one or more frequency controllers. The cable or the optical fiber is a transfer medium for transferring the updates to the pulsing parameter values. A protocol is applied by the pulse con-troller to transfer the updates to the RFG controller. A communication of the pulsing parameter values is sometimes referred to herein as central processing unit to central processing unit (CPU-to-CPU) communication. As another example, the pulse controller is directly connected via a separate high-speed point-to-point communications link, such as a cable or an optical fiber, to a controller of a match or to a controller of a sensor system. The controller of the match includes at least one of a communication controller and a processor. Also, the controller of the sensor system includes at least one of a communication controller and a processor. In this example, a protocol is applied by the pulse controller to transfer the updates to the controller of the match or of the sensor system.

In an embodiment, the systems and methods described herein include measurement functions that parameterize an RF signal and compare the RF signal seen at a certain point in an RF delivery system of the plasma tool with pre-stored parameter values. For example, an envelope or a pulse of a measured signal is compared with a pre-stored envelope. In the example, a result of the comparison can be used to update control parameters so as to optimize an agreement of between the measured signal and the pre-stored parameter values.

In one embodiment, the pulse controller, which is a centralized controller, separate from the module controller, is used to transmit setpoint changes to the RF generators, and emit individualized synchronization pulse trains to the RF generators for synchronization. The setpoint changes to the RF generators fall into two classes. A first one of the two classes includes per-step parameter values, which are unchanged during a recipe step as programmed in a system recipe editor and transmitted over the fieldbus at the start of each step. A second one of the two classes includes high-speed information, such as a smaller number of other parameter values that are transmitted over data channels with lower latency.

In the case of the RF generators, the lower latency data channels include the variable levels and the durations for pulses of the RF signals emitted when a synchronization signal is received. The RF generators do not make use of a higher-level downloaded recipe. Latency for these lower latency data channels is such that setpoint changes can be transmitted and acted on in a time shorter than a minimum pulse repetition time. For example, for pulse repetition rates of 10 milliseconds (ms), latency less than 10 ms is achieved. The lower latency is achieved, in one embodiment, by transporting data over the fieldbus by using a slave-to-slave technique, and where optimization within an RF generator has been performed to allow for the lower latency. In some cases, instead of the slave-to-slave technique, a completely separate data transport, such as a point-to-point communication, is provided for the high-speed information. For example, a data connection uses a protocol over a 1 Gigabits per second (Gbps) Ethernet physical link in a point-to-point configuration. Other more customized implementations using point-to-point links directly between processors can achieve low latency, such as less than 10 microseconds (μs) latency, over connections with up to 25 Gbps.

It should be noted that while the term RF generators has been used here for convenience, it would be possible to update in a similar way any subsystem that uses updates, which are synchronized with an embedded recipe. In one embodiment, synchronization of individual pulses is accomplished by emitting a pulse train to each of multiple subsystems for synchronization of the subsystems. For example, an optical emission spectrometer subsystem receives synchronization pulses that trigger collection of optical data when the synchronization pulses are at a certain logic level. Other subsystems use a signal rising or falling edge of the synchronization pulses to trigger a sequence of operations. Other subsystems that are synchronized include RF matching units, such as impedance matching circuits. The setpoint changes and pulse trains are emitted by the pulse controller on a schedule derived from a recipe that is transmitted to the pulse controller over the fieldbus. This recipe is changed in conjunction with a new system recipe step.

In one embodiment, the pulse controller includes metrology for assessment of an RF signal that is reaching a physically meaningful point in the plasma tool, such as an RF match output or a location near a wafer plane. An analog-to-digital converter is used to measure either an RF voltage at the point or an envelope of the RF voltage. The pulse controller can, in real time, determine whether an agreement of a metric that is measured and a pre-stored metric is achieved. These metrics can be used to modify parameters of the plasma tool. For example, settings of network components of the RF match or frequencies of the RF generators can be modified to achieve the agreement, such as by use of a feedback loop or an artificial intelligence system. The agreement can be applied in other equipment intelligence systems. Other functions related to human-level debugging of the plasma tool, such as capture of the RF voltage, for display can also be included.

In one embodiment, a method is described. The method includes receiving, by an RF generator, a first set of one or more variable levels and one or more duty cycles of an RF signal. The method further includes receiving, by the RF generator from a pulse controller, a synchronization signal having a plurality of pulses. The method also includes generating, during a clock cycle of a clock signal, multiple instances of a first plurality of states of the RF signal in synchronization with the plurality of pulses of the synchronization signal. Each of the first plurality of states of the RF signal has a corresponding one of the one or more variable levels of the first set and a corresponding one of the one or more duty cycles of the first set.

In an embodiment, a pulse controller is described. The pulse controller includes a processor configured to send a first set of one or more variable levels and one or more duty cycles of an RF signal to an RF generator. The processor is configured to send a synchronization signal having a plurality of pulses to the RF generator. The synchronization signal is sent to the RF generator to enable the RF generator to generate, during a clock cycle of a clock signal, multiple instances of a first plurality of states of the RF signal in synchronization with the plurality of pulses of the synchronization signal. Each of the first plurality of states of the RF signal has a corresponding one of the one or more variable levels of the first set and a corresponding one of the one or more duty cycles of the first set. The pulse controller further includes a memory device coupled to the processor.

In one embodiment, a method is described. The method includes measuring, by a sensor of a sensor system, sensor data. The method further includes receiving, by the sensor system, a synchronization signal having a plurality of pulses. The method also includes collecting, by the sensor system, portions of the sensor data in synchronization with the plurality of pulses of the synchronization signal during a clock cycle of a clock signal. The method includes sending the portions of the sensor data to a pulse controller.

Some advantages of the herein described systems and methods include co-locating the centralized synchronization device for synchronization of pulses, for measuring the pulses, and for updating setpoints. There is no need to download recipes to the RF generators and then find a way to synchronize the RF generators. A detailed pulsing behavior can then be programmed, with shorter and more precise process steps. Requirements for the RF generators are reduced, with resulting cost advantages.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 1 is a diagram of an embodiment of a system to illustrate use of Ethernet for Control Automation Technology (EtherCAT) and synchronization signals for synchronization of RF signals.

FIG. 2A depicts a graph to illustrate a first synchronization signal that is sent to a transformer coupled plasma (TCP) generator.

FIG. 2B depicts a graph of another synchronization signal that is provided to a first bias generator.

FIG. 2C depicts a graph of yet another synchronization signal that is provided to a second bias generator.

FIG. 2D depicts a graph to illustrate a variable of an RF signal that is generated by the TCP generator in synchronization with the synchronization signal of FIG. 2A.

FIG. 2E depicts a graph to illustrate a variable of an RF signal that is generated by the first bias generator in synchronization with the synchronization signal of FIG. 2B.

FIG. 2F depicts a graph to illustrate a variable of the RF signal that is generated by the second bias generator in synchronization with the synchronization signal of FIG. 2C.

FIG. 2G depicts a graph to illustrate a variable of the RF signal that is generated by the first bias generator in synchronization with the synchronization signal of FIG. 2B.

FIG. 3 is an embodiment of a system to illustrate use of Ethernet cables to transfer information regarding variable levels and duty cycles, and information regarding a portion of a cycle of a master clock signal for which multiple states of an RF signal are to be generated.

FIG. 5A depicts a graph to illustrate a plot of intensity of plasma versus time.

FIG. 5B depicts a graph for illustrating a synchronization signal versus the time.

FIG. 6A depicts a graph to illustrate a plot of voltage versus the time.

FIG. 6B depicts a graph for illustrating a synchronization signal versus the time.

FIG. 6D depicts a graph for illustrating a synchronization signal versus the time.

FIG. 7 is a diagram of an embodiment of a system to illustrate use of one EtherCAT train, instead of multiple EtherCAT trains, to transfer a pulsing preset signal from a module controller to the bias match.

FIG. 8 is a diagram of an embodiment of a system to illustrate that sensor data is sent from a sensor to a pulse controller via an Ethernet cable instead of via an EtherCAT train.

DETAILED DESCRIPTION

Figure 4:
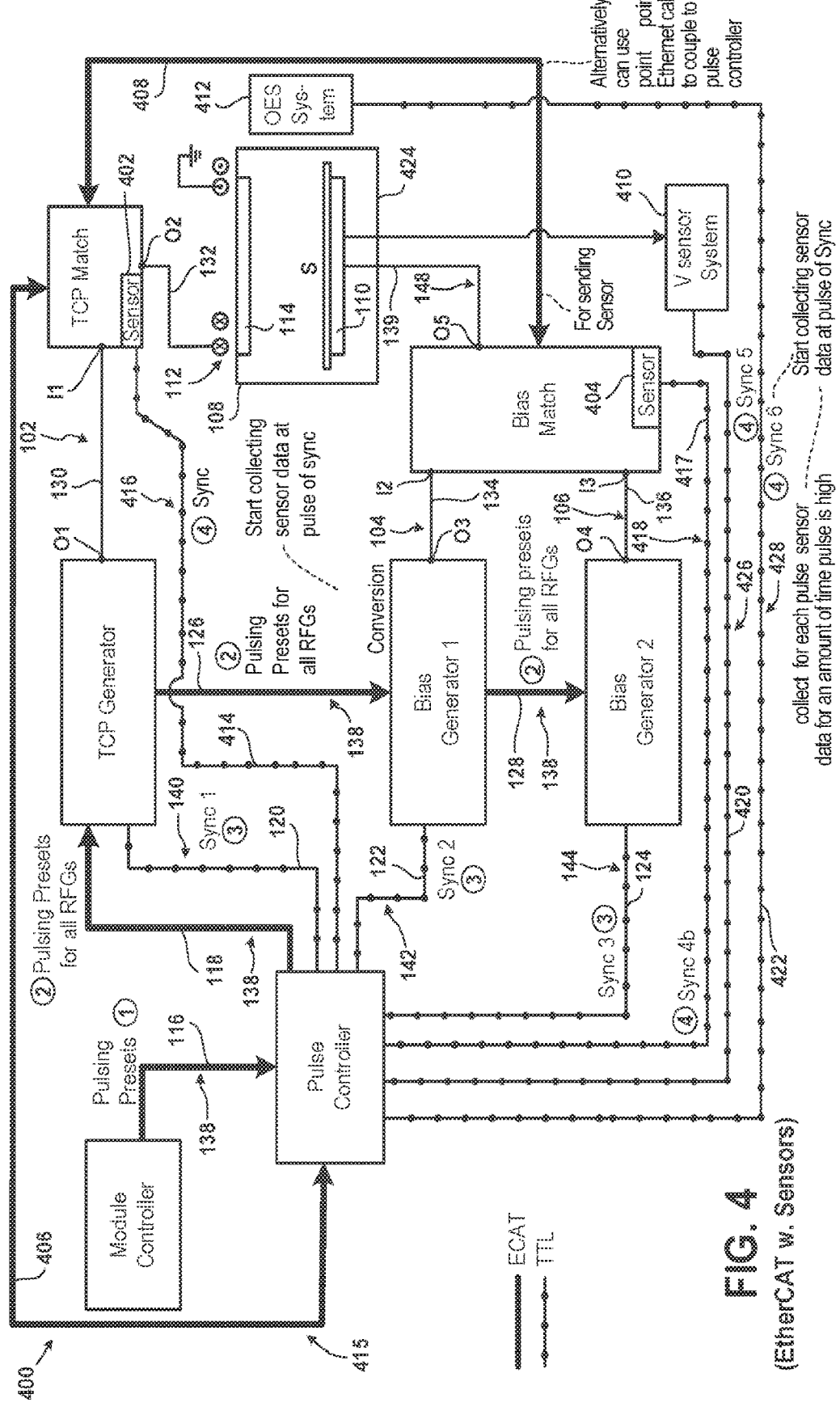
FIG. 4 is a diagram of an embodiment of a system to illustrate use of EtherCAT for sensing data from a sensor within a TCP match and a sensor within a bias match.

The following embodiments describe systems and methods for synchronization of radio frequency (RF) pulsing schemes and of sensor data collection. It will be apparent that the present embodiments may be practiced without some or all of these specific details. In other instances, well known process operations have not been described in detail in order not to unnecessarily obscure the present embodiments.

FIG. 1 is a diagram of an embodiment of the system 100 to illustrate use of Ethernet for Control Automation Technology (EtherCAT) and synchronization signals for synchronization of RF signals 102, 104, and 106, which are generated by multiple RF generators, such as a transformer control plasma (TCP) generator, a bias generator 1, and a bias generator 2. The system 100 includes a module controller, a pulse controller, the TCP generator, the bias generator 1, the bias generator 2, a TCP match, a bias match, and a plasma chamber 108.

As used herein, an example of a controller includes a processor and a memory device. The processor is coupled to the memory device. Other examples of the controller include an application specific integrated circuit (ASIC) and a programmable logic device (PLD). Another example of the controller includes multiple processors and multiple memory devices. The processors are coupled to the memory devices. As used herein, the terms processor, microprocessor, and central processing unit (CPU) are used herein interchangeably.

Also, as used herein, an RF generator operates at a frequency of 400 kilohertz (kHz), or 2 megahertz (MHz), or 13.56 MHz, or 27 MHz, or 60 MHz. For example, the TCP generator operates at a frequency of 13.56 MHz, the bias generator 1 operates at a frequency of 400 kHz, and the bias generator 2 operates at a frequency of 60 MHz. As another example, TCP generator operates at a frequency of 27 MHz, the bias generator 1 operates at a frequency of 2 MHz, and the bias generator 2 operates at a frequency of 27 MHz.

An example of an impedance matching network, as used herein, includes an impedance matching circuit having a network of circuit components, such as inductors, resistors, and capacitors. To illustrate, the impedance matching network has one or more series circuits and one or more shunt circuits. Each series circuit includes one or more inductors and one or more capacitors, and the one or more inductors and the one or more capacitors are coupled in series with each other. Similarly, each shunt circuit includes one or more inductors and one or more capacitors that are coupled in series with each other. One of the one or more inductors and the one or more capacitors of the shunt circuit is coupled to a ground potential. Each of the one or more shunt circuits is coupled to a corresponding one of the one or more series circuits. The terms impedance matching network, impedance matching circuit, impedance matching housing, match housing, match enclosure, and match are used herein interchangeably.

The plasma chamber 108 includes a substrate support 110. Examples of the substrate support 110 include a chuck, such as an electrostatic chuck (ESC). To illustrate, the chuck includes a metal base and a dielectric layer on top of the metal base. A substrate S, such as a semiconductor wafer, is placed on a top surface of the substrate support 110 to be processed within the plasma chamber 108. The substrate support 110 includes a lower electrode, which is fabricated from a metal, such as aluminum or an alloy of aluminum. The lower electrode is embedded within the dielectric layer of the chuck. The plasma chamber 108 further includes a TCP coil 112 and a dielectric window 114. The TCP coil 112 is located above the dielectric window 114, and a gap is formed between the dielectric window 114 and the substrate support 110.

The module controller is coupled via a communication cable 116 to the pulse controller, which is coupled via a communication cable 118 to the TCP generator. Examples of a communication cable, as used herein, include an Ethernet cable. Examples of the Ethernet cable, as used herein, include a twisted pair cable. To illustrate, the Ethernet cable is a 100BASE-TX™ or a 100BASE-T4™ cable that is capable of transferring data at a speed of 100 megabits per second (Mbps) or greater. As another example, the Ethernet cable is a category 8 cable capable of transferring data at transfer rates of upto 40 gigabits per second (Gbps).

Moreover, the pulse controller is coupled via a transfer cable 122 to the TCP generator, via a transfer cable 122 to the bias generator 1, and via a transfer cable 124 to the bias generator 2. An example of a transfer cable, as used herein, includes a coaxial cable. To illustrate, the transfer cable is used for transfer of data in a serial manner, or in a parallel manner, or via a universal serial bus (USB) protocol. The TCP generator is coupled via a communication cable 126 to the bias generator 1, which is coupled via a communication cable 128 to the bias generator 2.

Also, an output O1 of the TCP generator is coupled via an RF cable 130 to an input I1 of the TCP match and an output O2 of the TCP match is coupled via an RF transmission line 132 to a first end of the TCP coil 112. As an example, the RF transmission line 132 includes an RF rod, an insulator material, and an RF sheath. The insulator material is located between the RF rod and the RF sheath. The insulator material surrounds the RF rod and the RF sheath surrounds the insulator material.

A second opposite end of the TCP coil is coupled to a ground potential or a ground connection. An output O3 of the bias generator 1 is coupled via an RF cable 134 to an input I2 of the bias match. Also, an output O4 of the bias generator 2 is coupled via an RF cable 136 to an input I3 of the bias match. An output O5 of the bias match is coupled via an RF transmission line 139 to the lower electrode of the substrate support 110. As an example, the RF transmission line 139 includes an RF rod, an insulator material, and an RF sheath. The insulator material is located between the RF rod and the RF sheath. The insulator material of the RF transmission line 139 surrounds the RF rod of the RF transmission line 139 and the RF sheath of the RF transmission line 139 surrounds the insulator material. The RF transmission line 139 further includes one or more RF straps, and an RF cylinder. The RF rod of the RF transmission line 139 is coupled to the output O5 of the bias match. The one or more RF straps of the RF transmission line 139 couple the RF rod to the RF cylinder, which is coupled to the lower electrode of the substrate support 110.

The module controller generates a pulsing preset signal 138 and sends the pulsing preset signal 138 via the communication cable 116 to the pulse controller. The pulsing preset signal 138 is an EtherCAT train. As an example, the pulsing preset signal 138 includes information regarding variable levels and duty cycles of the RF signals 102, 104, and 106. The information regarding the variable levels include a variable level for each state of the RF signal 102, a variable level for each state of the RF signal 104, and a variable level for each state of the RF signal 106. To illustrate, a variable is power or frequency. Also, in the example, the information regarding duty cycles include a duty cycle for each state of the variable of the RF signal 102, a duty cycle for each state of the variable of the RF signal 104, and a duty cycle for each state of the variable of the RF signal 106. To illustrate, a duty cycle of an RF signal provides a time interval or a time period for which each state of the variable of the RF signal is to be generated.

The pulse controller receives the pulsing preset signal 138 from the module controller and sends the pulsing preset signal 138 to the TCP generator via the communication cable 118. The TCP generator receives the pulsing preset signal 138, extracts from the pulsing preset signal 138, information regarding the variable levels and duty cycles for generating the RF signal 102, and after extracting the information, sends the pulsing preset signal 138 via the communication cable 126 to the bias generator 1. Also, the TCP generator stores the information regarding variable levels and duty cycles for generating the RF signal 102 in one or more memory devices of the TCP generator.

The bias generator 1 receives the pulsing preset signal 138, and parses the pulsing preset signal 138 to obtain information regarding the variable levels and duty cycles for generating the RF signal 104. Also, the bias generator 1 stores the information regarding variable levels and duty cycles for generating the RF signal 104 in one or more memory devices of the bias generator 1. After obtaining the information, the bias generator 1 sends the pulsing preset signal 138 via the communication cable 128 to the bias generator 2.

The bias generator 2 receives the pulsing preset signal 138, and analyzes the pulsing preset signal 138 to extract from the pulsing preset signal 138, information regarding the variable levels and duty cycles for generating the RF signal 106. The bias generator 2 stores the information regarding variable levels and duty cycles for generating the RF signal 106 in one or more memory devices of the bias generator 2. After extracting the information, the bias generator 2 sends the pulsing preset signal 138 via the communication cable 128 back to the bias generator 1.

The bias generator 1 receives the pulsing preset signal 138 from the bias generator 2, and sends the pulsing preset signal 138 via the communication cable 126 back to the TCP generator. The TCP generator receives the pulsing preset signal 138 from the bias generator 1 and sends the pulsing preset signal 138 via the communication cable 118 back to the pulse controller. The pulse controller receives the pulsing preset signal 138 from the TCP generator and sends the pulsing preset signal 138 back to the module controller.

The pulse controller also generates a master clock signal 141 and sends the master clock signal 141 via the transfer cable 120 to the TCP generator. To illustrate, the pulse controller includes a master clock generator, such as a clock source or a digital clock, the generates a digital clock signal. The digital clock signal pulses between a logic level of one and zero with a 50% duty cycle. Also, the pulse controller sends the master clock signal 141 via the transfer cable 122 to the bias generator 1 and via the transfer cable 124 to the bias generator 2.

The pulse controller generates a synchronization signal 140 and sends the synchronization signal 140 via the transfer cable 120 to the TCP generator. An example of a synchronization signal, as used herein, is a transistor-transistor logic (TTL) signal. Also, the pulse controller generates another synchronization signal 142 and sends the synchronization signal via the transfer cable 122 to the bias generator 1. The pulse controller generates yet another synchronization signal 144 and sends the synchronization signal 144 via the transfer cable 124 to the bias generator 2. The synchronization signal 140 is labeled as sync1 in FIG. 1, the synchronization signal 142 is labeled as sync2 in FIG. 1, and the synchronization signal 144 is labeled as sync3 in FIG. 1.

As an example, the synchronization signal 144 includes one or more pulses that have a frequency different than a frequency of one or more pulses of the synchronization signal 142. To illustrate, the synchronization signal 144 has two consecutive pulses that are spaced apart from each other at a greater time interval compared to two consecutive pulses of the synchronization signal 142. Similarly, as another example, the synchronization signal 146 includes one or more pulses that have a frequency different than a frequency of one or more pulses of the synchronization signal 142. Also, as another example, the synchronization signal 146 includes one or more pulses that have a frequency different than a frequency of one or more pulses of the synchronization signal 144.

Moreover, as an example, the synchronization signal 144 includes a different number, such as a greater or lower number, of pulses compared to a number of pulses of the synchronization signal 142. To illustrate, within a time interval, the synchronization signal 144 includes 10 pulses and the synchronization signal 142 includes four pulses. As another illustration, within a time interval, the synchronization signal 144 includes five pulses and the synchronization signal 142 includes 10 pulses. In a similar manner, as an example, the synchronization signal 144 includes a different number, such as a greater or lower number, of pulses compared to a number of pulses of the synchronization signal 140. Also, as an example, the synchronization signal 144 includes a different number, such as a greater or lower number, of pulses compared to a number of pulses of the synchronization signal 142.

As an example, the synchronization signals 140, 142, and 144 are generated and sent after the information regarding variable levels and duty cycle of the RF signal 102 is stored in the one or more memory devices of the TCP generator, the information regarding variable levels and duty cycle of the RF signal 104 is stored in the one or more memory devices of the bias generator 1, and the information regarding variable levels and duty cycle of the RF signal 106 is stored in the one or more memory devices of the bias generator 2.

As an example, the pulse controller sends the synchronization signals 140, 142 and 144 in synchronization with clock cycles of the master clock signal 141. Each of the synchronization signals 140, 142, and 144 has a series of pulses that repeat during each cycle of the master clock signal 141. In this example, the pulsing preset signal 138 includes information regarding a portion of a cycle of the master clock signal 141 for which multiple states of an RF signal are to be generated. To illustrate, the pulsing preset signal 138 includes a first time interval during a cycle 1 of the master clock signal 141 for which a first series of pulses of the RF signal 102 is to be generated by the TCP generator. During the cycle 1, each of the pulses of the first series transitions between a first variable level and a second variable level. The first variable level is different from the second variable level. Also, the pulsing preset signal 138 includes a second time interval during the cycle 1 of the master clock signal for which a second series of pulses of the RF signal 102 is to be generated by the TCP generator. During the cycle 1, each of the pulses of the second series transitions between a third variable level and the second variable level. The third variable level is different from the second variable level and the first variable level. The first time interval is an example of a first sub cycle of the cycle 1 of the master clock signal 141 and the second time interval is an example of a second sub cycle of the cycle 1 of the master clock signal 141.

As another illustration, the pulsing preset signal 138 includes information regarding a count of pulses of the synchronization signal 140. The information regarding the count of pulses includes a first count of a number of pulses of the synchronization signal 140 during the cycle 1 of the master clock signal 141 for which a first series of pulses of the RF signal 102 is to transition between the first variable level and the second variable level. Also, the information regarding the count includes a second count of a number of pulses of the synchronization signal 140 during the cycle 1 of the master clock signal 141 for which a second series of pulses of the RF signal 102 is to transition between the third variable level and the second variable level. The number of pulses of the first count is generated during the first time interval, which is an example of the first sub cycle of the cycle 1 of the master clock signal 141. The number of pulses of the second count is generated during the second time interval, which is an example of the second sub cycle of the cycle 1 of the master clock signal 141. The TCP generator includes a counter that determines whether the first count is exceeded, and upon determining so, applies the second and third variable levels instead of applying the first and second variable levels to generate the RF signal 102. The counter is coupled to a digital signal processor of the TCP generator.

The TCP generator receives the synchronization signal 140, and generates the RF signal 102 having the information regarding the variable level and duty cycle for each state of the RF signal 102 in synchronization with the synchronization signal 140. For example, a first instance of a set of one or more states of the variable of the RF signal 102 is generated in response to reception of a first pulse of the synchronization signal 140 and a second instance of the set of one or more states of the variable of the RF signal 102 is generated in response to a second pulse of the synchronization signal 140. The second pulse is consecutive to the first pulse in that there are no other pulses between the first and second pulses. To illustrate, the set of states includes a first state and a second state. The first state has a first variable level and a first duty cycle, and the second state has a second variable level and a second duty cycle. The information regarding variable levels and duty cycles of the RF signal 102 includes the first variable level, the first duty cycle, the second variable level, and the second duty cycle.

Similarly, the bias generator 1 receives the synchronization signal 142, and generates the RF signal 104 having the information regarding the variable level and duty cycle for each state of the RF signal 104 in synchronization with the synchronization signal 142. Also, the bias generator 2 receives the synchronization signal 144, and generates the RF signal 106 having the information regarding the variable level and duty cycle for each state of the RF signal 106 in synchronization with the synchronization signal 144.

The RF signal 102 is provided at the output O1, and sent via the RF cable 130 to the input I1 of the TCP match. The TCP match matches an impedance of a load coupled to the output O2 with an impedance of a source coupled to the input I1 to modify an impedance of the RF signal 102. An example of the source coupled to the input I1 includes the RF cable 130 and the TCP generator. An example of the load coupled to the output O2 includes the RF transmission line 132 and the plasma chamber 108. When the impedance of the RF signal 102 is modified, a modified RF signal 146 is provided at the output O2 of the TCP match. The modified RF signal 144 is supplied via the RF transmission line 132 to the TCP coil 112.

Also, the RF signal 104 is provided at the output O3 of the bias generator 1, and sent via the RF cable 134 to the input I2 of the bias match. Additionally, the RF signal 106 is provided at the output O4 of the bias generator 2, and sent via the RF cable 136 to the input I3 of the bias match. The bias match includes a first branch circuit and a second branch circuit. The first branch circuit includes one or more series circuits, or one or more shunt circuits, or a combination thereof. Also, the second branch circuit includes one or more series circuits, or one or more shunt circuits, or a combination thereof.

When the RF signal 104 is transferred via the first branch circuit of the bias match, the first branch circuit matches an impedance of a load coupled to the output O5 of the bias match with an impedance of a source coupled to the input I2 of the bias match to modify an impedance of the RF signal 104. An example of the source coupled to the input I2 is the RF cable 134 and the bias generator 1. An example of the load coupled to the output O5 is the RF transmission line 139 and the plasma chamber 108. When the impedance of the RF signal 104 is modified, a first modified RF signal is output from the first branch circuit.

Similarly, when the RF signal 106 is transferred via the second branch circuit of the bias match, the second branch circuit matches an impedance of the load coupled to the output O5 of the bias match with an impedance of a source coupled to the input I3 of the bias match to modify an impedance of the RF signal 106. An example of the source coupled to the input I3 is the RF cable 136 and the bias generator 2. When the impedance of the RF signal 106 is modified, a second modified RF signal is output from the second branch circuit.

The first and second modified RF signals are combined, such as added, within the bias match to provide a combined RF signal 148 at the output O5. The combined RF signal 148 is transferred via the RF transmission line 139 to the lower electrode of the substrate support 110.

Moreover, one or more process gases, such as, an oxygen containing gas, and a fluorine containing gas, are supplied to the gap between the substrate support 110 and the dielectric window 114. When the one or more process gases, modified RF signal 146, and the combined RF signal 148 are supplied to the gap within the plasma chamber 108, plasma is stricken or maintained within the plasma chamber 108. The plasma is used to process the substrate S. Examples of processing the substrate S include depositing one or more materials on the substrate S, or etching the substrate S, or cleaning the substrate S, or polishing the substrate S, or sputtering the substrate S, or a combination thereof.

By providing the synchronization signals 140, 142, and 144, there is no need to store information regarding the synchronization signals. For example, there is no need to store, within the one or more memory devices of the TCP generator, a frequency with which states of the RF signal 102 are to be repeated. As another example, there is no need to store, within the one or more memory devices of the bias generator 1, a frequency with which states of the RF signal

104 are to be repeated. Also, as an example, there is no need to store, within the one or more memory devices of the bias generator 2, a frequency with which states of the RF signal 106 are to be repeated.

In one embodiment, in addition to the bias generators 1 and 2, a third bias generator is coupled to a third input of the bias match.

In an embodiment, in addition to the TCP generator, a second TCP generator is coupled to a second input of the TCP match.

In one embodiment, in addition to the TCP generator, the second TCP generator is coupled to the second input of the TCP match and a third TCP generator is coupled to a third input of the TCP match.

In an embodiment, instead of the pulse controller generating the master clock signal 141, the module controller generates the master clock signal 141 and sends the master clock signal 141 via a transfer cable to the pulse controller. The transfer cable couples the module controller to the pulse controller. The pulse controller generates the synchronization signals 140, 142, and 144 in synchronization with the master clock signal 141 received from the module controller.

In one embodiment, each RF generator, such as the TCP generator, the bias generator 1, and the bias generator 2, has a clock source, which generates a clock signal including the cycles 1 and 2. For example, the TCP generator has a clock source that generates a clock signal having the clock cycles 1 and 2, the bias generator 1 has a clock source that generates a clock signal having the clock cycles 1 and 2, and the bias generator 2 has a clock source that generates a clock signal having the clock cycles 1 and 2. The clock signals of clock sources of the TCP generator, the bias generator 1, and the bias generator 2 are synchronized to the master clock signal 141. For example, the clock sources of the TCP generator, the bias generator 1, and the bias generator 2 receive the master clock signal 141, and generate the clock signals. The clock signals transition from the logic level 0 to the logic level 1 at the same time the master clock signal 141 pulses from the logic level 0 to the logic level 1 and transition from the logic level 1 to the logic level 0 at the same time the master clock signal 141 pulses from the logic level 1 to the logic level 0. In the embodiment, each component of the RF generator receives the clock signal that is generated in synchronization with the master clock signal 141 and operates in synchronization with the clock signal. For example, a controller of the TCP generator receives the clock signal from the clock source of the TCP generator and controls other components of the TCP generator to generate the RF signal 102 in synchronization with the clock signal.

In an embodiment, any synchronization signal, described herein, is generated by the pulse controller after the pulse controller receives a trigger signal via a transfer cable from the module controller. The transfer cable couples the pulse controller to the module controller. The trigger signal includes a single pulse for execution of a recipe, such as the variable levels and duty cycles within the pulsing preset signal 138.

In one embodiment, the pulsing preset signal 138 includes multiple schedules for generating multiple synchronization signals, such as the synchronization signals 140, 142, and 144. For example, the schedules include information for generating the synchronization signals. To illustrate, the schedules include one or more frequencies for generation of pulses of a synchronization signal. The pulse controller generates the synchronization signals according to the schedules. For example, the synchronization signal 140 is generated according to a first schedule and the synchronization signal 142 is generated according to a second schedule.

In an embodiment, the master clock signal 141 is sent from the pulse controller to the TCP generator via a different transfer cable than the transfer cable 120. Also, the master clock signal 141 is sent from the pulse controller to the bias generator 1 via a different transfer cable than the transfer cable 122, and is sent from the pulse controller to the bias generator 2 via a different transfer cable than the transfer cable 124.

FIG. 2A is depicts a graph 200 to illustrate a synchronization signal 202, which is an example of the synchronization signal 140 (FIG. 1) that is sent to the TCP generator. The graph 200 plots a logic level of the synchronization signal 202 versus the time t. The logic level of the synchronization signal 202 is plotted on a y-axis and the time t is plotted on an x-axis.

The time t is divided into multiple time intervals. For example, the time t is divided into a first time interval between a time t0 and a time t1, a second time interval between the time t1 and a time t2, the third time interval between the time t2 and a time t3, and so on. It should be noted that the first time interval is equal to the second time interval, which is equal to the third time interval. Additional times t4, t5, t6, t7, t8, t9, t10, t11, t12, t13, t14, t15, t16, t17, t18, t19, t20, t21, t22, t23, t24, t25, t26, t27, t28, t29, and t30 are shown in FIG. 2A.

The synchronization signal 202 pulses at the time t0 to create a pulse 202-1. For example, the synchronization signal 202 is at a logic level 1 at the time t0 and remains at the logic level 1 from the time t0 to a time t0.5, which is at half of a time interval between the times t0 and t1. Also, the synchronization signal 202 transitions from the logic level 1 to a logic level 0 at the time t0.5, and remains at the logic level t0.5 from the time t0.5 to the time t2 to create the pulse 202-1.

In the same manner, the synchronization signal 202 pulses at the time t2, the time t4, and so on until the time t16 to create multiple pulses 202-2, 202-3. 202-4, 202-5, 202-6, 202-7, and 202-8. As an example, a time interval between generation of two consecutive pulses of the synchronization signal 202 is less than about 0.5 seconds. To illustrate, a time difference between creation of the pulse 202-1 and the pulse 202-2 ranges from 0.05 seconds to 0.6 seconds. As another illustration, a time difference between creation of the pulse 202-1 and the pulse 202-2 ranges from 0.01 seconds to 0.55 seconds. As yet another illustration, a time difference between creation of the pulse 202-1 and the pulse 2-2 ranges from 0.005 seconds to 0.6 seconds.

The eighth pulse 202-8 of the synchronization signal 202 ends at the time t16. The synchronization signal 202 stops pulsing from the time t16 until the time t20. For example, the synchronization signal 202 is at the logic level 0 between a time t14.5 and the time t20. The time t14.5 is at half of a time interval between the times t14 and t15.

The cycle 1 of occurrence of the synchronization signal 202 is created between the times t0 and t20. The cycle 1 of the synchronization signal 202 includes the eight pulses 202-1 through 202-8 of the synchronization signal 202 followed by a time interval of no pulses between the times t14.5 and t20.

During the cycle 1 of the master clock signal 141, the synchronization signal 202, the synchronization signal 142, and the synchronization signal 144 (FIG. 1) are divided into multiple sub cycles. For example, a sub cycle 1 of the synchronization signal 202, the synchronization signal 142, and the synchronization signal 144 occurs between the time t0 and the time t10 of the cycle 1. A sub cycle 2 of the synchronization signal 202, the synchronization signal 142, and the synchronization signal 144 occurs between the time t10 and the time t16, and a sub cycle 3 of the synchronization signal 202, the synchronization signal 142, and the synchronization signal 144 occurs between the time t16 and the time t20. In the same manner as that of the cycle 1, during a cycle 2 of the master clock signal 141, each synchronization signal 202, 142, and 144 is divided into multiple sub cycles. As an example, during the cycle 2, a sub cycle 1 of the synchronization signal 202, the synchronization signal 142, and the synchronization signal 144 occurs between the times t20 and the time t30. The cycles 1 and 2 are clock cycles of the master clock signal 141 that is received by the TCP, bias 1, and bias 2 RF generators from the pulse controller (FIG. 1). The cycle 2 occurs between the time t20 and a time t40.

The synchronization signal 202 starts pulsing again at the time t20 and repeats eight pulses from the time t20 in the same manner in which eight pulses of the synchronization signal 202 are generated from the time t0. For example, the synchronization signal 202 is at the logic level 1 at the time t20 and remains at the logic level from the time t20 to a time t20.5, which is at half of a time interval between the times t20 and t21. As such, the synchronization signal 202 includes a first series of eight pulses 202-1 through 202-8, and a second series of eight pulses. During the cycle 2, the synchronization signal 202 includes eight pulses of the synchronization signal 202 followed by a time interval of no pulses between a time t34.4 and the time t40. The time t34.5 is at half of the time interval between the times t34 and t35. The cycle 2 of the master clock signal 141 is consecutive to the cycle 1 of the master clock signal 141. For example, there is no other cycle between the cycles 1 and 2.

In one embodiment, instead of eight consecutive pulses, the synchronization signal 202 includes another number, such as two or three, of consecutive pulses.

In one embodiment, instead of pulsing for a first time interval, which is half of a time period between two consecutive times, such as the times t0 and t1, each pulse of a synchronization signal, described herein, pulses for a second time interval that is greater than or less than the first time interval. For example, the synchronization signal 202 pulses for the second time interval, which ranges from the time t0 to a time t0.25, which is at a quarter of the time interval between the times t0 and t1. As another example, the synchronization signal 202 pulses for the second time interval, which ranges from the time t0 to a time t0.75, which is at three-quarters of the time interval between the times t0 and t1.

In an embodiment, a frequency of occurrence of pulses of the synchronization signal 202 is different from that illustrated in FIG. 2A. For example, instead of occurring at a time interval of two time units, the pulses of the synchronization signal 202 occur at a time interval of four time units. For example, instead of the pulse 202-2 occurring at the time t2, the pulse 202-2 occurs at the time t4 and the pulse 202-3 occurs at the time t6 and so on until the time t16. In this example, the cycle 1 includes four pulses instead of eight. In this example, a time unit is defined as a time interval between two consecutive times, such as the times t0 and t1 or the times t1 and t2. The frequency of occurrence of pulses of the synchronization signal 202 is modified by the pulse controller or the module controller.

In an embodiment, each sub cycle, as described herein, has a time interval that ranges between about 50 milliseconds to about 150 milliseconds. To illustrate, the sub cycle 1 ranges between 50 milliseconds and 75 milliseconds, the sub cycle 2 ranges between 45 milliseconds and 160 milliseconds, and the sub cycle 3 ranges between 55 milliseconds and 140 milliseconds.

In one embodiment, there is no change in one or more process gases that are supplied to the plasma chamber 108 (FIG. 1) and there is no change in pressure within the plasma chamber 108 during each cycle of the master clock signal 141 (FIG. 1). For example, the pressure within the plasma chamber 108 and a type of one or more process gases used within the plasma chamber 108 remains the same during the cycle 1. As another example, the pressure within the plasma chamber 108 and a type of one or more process gases used within the plasma chamber 108 remains the same during the cycle 2. There can be a change in the pressure and/or the type of process gases between the cycles 1 and 2.

FIG. 2B depicts a graph 204 of another synchronization signal 206, which is an example of the synchronization signal 142 that is provided to the bias generator 1 (FIG. 1). The graph 204 plots a logic level of the synchronization signal 206 versus the time t. The logic level of the synchronization signal 206 is plotted on a y-axis and the time t is plotted on an x-axis.

The synchronization signal 206 is at the logic level 0 from the time t0 to the time t10. The synchronization signal 206 pulses at the time t10 to create a pulse 206-1. For example, the synchronization signal 206 transitions from the logic level 0 to the logic level 1 at the time t10 and remains at the logic level 1 from the time t10 to a time t10.5, which is at half of a time interval between the times t10 and t11. Also, the synchronization signal 206 transitions from the logic level 1 to a logic level 0 at the time t10.5, and remains at the logic level 0 from the time t10.5 to the time t12 to create the pulse 206-1.

Similarly, the synchronization signal 206 pulses at the time t12 to create a second pulse 206-2 and at the time t14 to create a third pulse 206-3. As an example, a time interval between generation of two consecutive pulses of the synchronization signal 206 is less than about 0.5 seconds. To illustrate, a time difference between creation of the pulse 206-1 and the pulse 206-2 ranges from 0.05 seconds to 0.6 seconds. As another illustration, a time difference between creation of the pulse 206-1 and the pulse 206-2 ranges from 0.01 seconds to 0.55 seconds. As yet another illustration, a time difference between creation of the pulse 206-1 and the pulse 206-2 ranges from 0.005 seconds to 0.6 seconds.

The third pulse 206-3 of the synchronization signal 206 ends at the time t16. The synchronization signal 206 stops pulsing from the time t16 until the time t30. For example, the synchronization signal 206 is at the logic level 0 between the times t16 and t30.

A cycle 1 of occurrence of the synchronization signal 206 is created between the times t0 and t20. The cycle 1 of the synchronization signal 206 includes three pulses of the synchronization signal 206 preceded by a time interval of no pulses between the times t0 and t10.

The synchronization signal 206 starts pulsing again at the time t30 and repeats three pulses from the time t30 in the same manner in which three pulses of the synchronization signal 206 are generated from the time t10. For example, the synchronization signal 206 is at the logic level 1 at the time t30 and remains at the logic level from the time t30 to a time t30.5, which is at half of a time interval between the time t30 and a time t31. As such, the synchronization signal 206 includes a first series of three pulses and a second series of three pulses. During the cycle 2 of the master clock signal 141, the synchronization signal 206 includes three pulses of the synchronization signal 202 preceded by a time interval of no pulses between the times t20 and t30.

In one embodiment, instead of three consecutive pulses, the synchronization signal 206 includes another number, such as two or five, of consecutive pulses.

In an embodiment, a frequency of occurrence of pulses of the synchronization signal 206 is different from that illustrated in FIG. 2B. For example, instead of occurring at a time interval of two time units, the pulses of the synchronization signal 206 occur at a time interval of three time units. For example, instead of the pulse 206-2 occurring at the time t12, the pulse 206-2 occurs at the time t13 and the pulse 206-3 occurs at the time t16. There is no pulse after a time t16.5 during the cycle 1 of the master clock signal 141. The time t16.5 is at half of the time interval between the times t16 and t17. In this example, the cycle 1 includes three pulses of the synchronization signal 206. In this example, a time unit is defined as a time interval between two consecutive times, such as the times t0 and t1 or the times t1 and t2. The frequency of occurrence of pulses of the synchronization signal 206 is modified by the pulse controller or the module controller.

FIG. 2C depicts a graph 208 of another synchronization signal 210, which is an example of the synchronization signal 144 that is provided to the bias generator 2 (FIG. 1). The graph 208 plots a logic level of the synchronization signal 210 versus the time t. The logic level of the synchronization signal 210 is plotted on a y-axis and the time t is plotted on an x-axis.

The synchronization signal 210 pulses in the same manner as that of the synchronization signal 206 to create multiple pulses 210-1, 210-2, and 210-3 during the cycle 1. For example, the synchronization signal 210 is at the logic level 0 from the time t0 to the time t10. The synchronization signal 210 pulses at the time t10 to create the pulse 210-1. To illustrate, the synchronization signal 210 transitions from the logic level 0 to the logic level 1 at the time t10 and remains at the logic level 1 from the time t10 to the time t10.5. Also, the synchronization signal 210 transitions from the logic level 1 to a logic level 0 at the time t10.5, and remains at the logic level t10.5 from the time t10.5 to the time t12 to create the pulse 210-1. Similarly, the synchronization signal 210 pulses at the time t12 to create the pulse 210-2 and pulses at the time t14 to create the pulse 210-3. The synchronization signal 210 stops pulsing at the time t16. The synchronization signal 210 pulses in the same manner during the cycle 2 as that during the cycle 1.

In one embodiment, the synchronization signal 210 is different from the synchronization signal 206 (FIG. 2B). For example, instead of three consecutive pulses, the synchronization signal 210 includes another number, such as one or six, of consecutive pulses.

In an embodiment, a frequency of occurrence of pulses of the synchronization signal 210 is different from that illustrated in FIG. 2C. For example, instead of occurring at a time interval of two time units, the pulses of the synchronization signal 206 occur at a time interval of 2.5 time units. For example, instead of the pulse 210-2 occurring at the time t12, the pulse 210-2 occurs at a time t12.5 and the pulse 212-3 occurs at the time t15. The time t12.5 is at half of a time interval between the times t12 and t13. There is no pulse after the time t15 during the cycle 1 of the master clock signal 141. In this example, the cycle 1 includes three pulses. In this example, a time unit is defined as a time interval between two consecutive times, such as the times t0 and t1 or the times t1 and t2. The frequency of occurrence of pulses of the synchronization signal 210 is modified by the pulse controller or the module controller.

FIG. 2D depicts graph 212 to illustrate a variable 216 of the RF signal 102 (FIG. 1) that is generated by the TCP generator in synchronization with the synchronization signal 202 (FIG. 2A). The graph 212 plots multiple variable levels of the RF signal 102 versus the time t.

Each variable level of an RF signal corresponds to a state of the RF signal. For example, a first variable level is defined as a first state and a second variable level is defined as a second state.

As an example, a variable level, as used herein includes, of an RF signal at least one value of the variable of the RF signal. To illustrate, the first variable level has multiple values and the second variable level also has multiple values. The values of the first variable level are exclusive of the values of the second variable level. To further illustrate, a minimum of all the values of the first variable level is greater than a maximum of all the values of the second variable level for the first variable level to be greater than the second variable level. As another example, the variable level of the RF signal is an envelope of the RF signal. To illustrate, the variable level is a maximum magnitude of the RF signal as the RF signal pulses from the maximum magnitude to a minimum magnitude.

Pulsing of the RF signal 102 is synchronized with the pulsing of the synchronization signal 202. For example, each pulse of the RF signal 102 is generated in response to reception of a pulse of the synchronization signal 102. To illustrate, when the pulse 202-1 (FIG. 2A) of the synchronization signal 202 is received by the TCP generator, a pulse 216-1 of the variable 216 is generated by the TCP generator. When the pulse 202-1 of the synchronization signal 202 is received by the TCP generator, the TCP generator is enabled to generate the pulse 216-1. For example, the variable 216 of the RF signal 102 has a variable level V3 at the time t0, and remains at the variable level V3 from the time t0 to the time t1. The variable 216 transitions from the variable level V3 to a variable level V0 at the time t1. The variable 216 remains at the variable level V0 from the time t1 to the time t2 to create the pulse 216-1. As another example, at the time t0 at which the pulse 202-1 transitions from the logic level 0 to the logic level 1, the pulse 216-1 transitions from the variable level V0 to the variable level V3. The pulse 216-1 has a first instance of states S1 and S0 of variable 216 of the RF signal 102.

In the same manner, additional pulses 216-2, 216-3, 216-4, and 216-5 of the variable 216 are generated. The additional pulses 216-3 through 216-5 having the variable level V3 are generated by the TCP generator in synchronization with the pulses 202-2 through 202-5 (FIG. 2A). For example, the pulse 216-2 is generated in synchronization with the pulse 202-2, the pulse 216-3 is generated in synchronization with the pulse 202-3 and so on until the pulse 216-5 is generated in synchronization with the pulse 202-5. As another example, at the time t2 at which the pulse 202-2 (FIG. 2A) transitions from the logic level 0 to the logic level 1, the pulse 216-2 transitions from the variable level V0 to the variable level V3. The pulse 216-2 has a second instance of the states S1 and S0 of the variable 216 of the RF signal 102, and the pulse 216-3 has a third instance of the states S1 and S0 of the variable 216 of the RF signal 102, and so on until the pulse 216-5 has a fifth instance of the states S1 and S0 of the variable 216.

It should be noted that the variable levels V0 and V3 are examples of the information regarding variable levels received within the pulsing preset signal 138 (FIG. 1). Also, a duty cycle of each pulse 216-1 through 216-5 is an example of the information regarding duty cycles received within the pulsing preset signal 138. As an example, a duty cycle of each pulse 216-1 through 216-5 is 50%. To illustrate, a duty cycle of each pulse 216-1 through 216-5 is a time interval for which the pulse has the variable level V3.

The variable level V3 is greater than the variable level V0, and is referred to herein as a state S1 of the variable 216. Also, the variable level V0 is referred to herein as a state S0 of the variable 216.

As another illustration, pulses 216-6, 216-7, and 216-8 of the variable 216 are generated in synchronization with the pulses 202-6 through 202-8 of the synchronization signal 202 (FIG. 2A). In the illustration, when the pulse 202-6 (FIG. 2A) of the synchronization signal 102 is received by the TCP generator, a pulse 216-6 of the variable 216 is generated by the TCP generator. For example, the variable 216 of the RF signal 102 transitions from the variable level V0 to a variable level V4 at the time t10, and remains at the variable level V4 from the time t10 to the time t11. The variable 216 transitions from the variable level V4 to a variable level V0 at the time t11. The variable 216 remains at the variable level V0 from the time t11 to the time t12. As another example, at the time t12 at which the pulse 202-7 transitions from the logic level 0 to the logic level 1, the pulse 216-7 of the variable 216 transitions from the variable level V0 to the variable level V4. As yet another example, at the time t14 at which the pulse 202-8 of the synchronization signal 202 transitions from the logic level 0 to the logic level 1, the pulse 216-8 of the variable transitions from the variable level V0 to the variable level V4. The pulse 216-6 has a first instance of states S1 and S0 of the variable 216, the pulse 216-7 has a second instance of the states S1 and S0 of the variable 216, and the pulse 216-8 has a third instance of the states S1 and S0 of the variable 216.

It should be noted that the variable levels V0 and V4 are examples of the information regarding variable levels received within the pulsing preset signal 138 (FIG. 1). Also, a duty cycle of each pulse 216-6 through 216-8 is an example of the information regarding duty cycles received within the pulsing preset signal 138. As an example, a duty cycle of each pulse 216-1 through 216-8 is 50%. To illustrate, a duty cycle of each pulse 216-6 through 216-8 is a time interval for which the pulse has the variable level V4.

In addition, a time interval between the times t10 and t16 during which the state S1 of the RF signal 102 has the variable level V4 instead of the variable level V3 is an example of the information regarding a portion of the cycle 1 of the master clock signal 141 for which the states S1 and S0 of the RF signal 102 are to be generated. Also, a time interval between the times t0 and t10 during which the state S1 of the RF signal 102 has the variable level V3 is an example of the information regarding a portion of the cycle 1 of the master clock signal 141 for which the states S1 and S0 of the RF signal 102 are to be generated. The variable level V4 is greater than the variable level V3, and is referred to herein as a state S1 of the variable 216. As such, eight pulses 216-1 through 216-8 of the variable 216 are generated from the time t0 to the time t16 during the cycle 1 of the master clock signal 141.

In a time interval between the times t16 and t20, the synchronization signal 202 (FIG. 2A) does not include any pulses, and therefore, the variable 216 of the RF signal 102 does not include any pulses during the time interval between the times t16 and t20. During the time interval between the times t16 and t20 in which the synchronization signal 202 does not have a pulse, the TCP generator is disabled from generating any pulses of the variable 216. For example, the variable 216 of the RF signal 102 does not transition between multiple variable levels during the time interval between the times t16 and t20. The variable 216 of the RF signal has the variable level V0 during the time interval between the times t16 and t20. The variable 216 does not have any variable levels, other than the variable level V0, during the time interval between the times t16 and t20. As such, the variable 216 has the single variable level V0 during the time interval between the times t16 and t20. The single variable level V0 represents the single state S0. There are no variable levels, other than the variable level V0, during the single state S0. It should be noted that during the time interval between the times t16 and t20, there is a single logic level 0 of the synchronization signal 202. There are no other logic levels during the time interval between the times t16 and t20.

The pulses 216-1 through 216-5 are generated during the sub cycle 1 of the cycle 1 of the master clock signal 141. The pulses 216-6 through 216-8 are generated during the sub cycle 2 of the cycle 1 of the master clock signal 141. Also, no pulses of the variable 216 are generated during the sub cycle 3 of the cycle 1 of the master clock signal 141. During the cycle 2 of the master clock signal 141, eight pulses of the variable 216 are generated again by the TCP generator in the same manner in which the pulses 216-1 through 216-8 of the variable 216 are generated during the cycle 1 of the master clock signal 141.

It should be noted that a duty cycle of a state is a time interval for which the state occurs as a percentage of a total time interval of all states of the pulse. For example, a duty cycle of the state S1 of the pulse 216-1 is 50%.

In one embodiment, each pulse of the variable 216 has a duty cycle that is greater than or less than 50%. For example, each pulse of the variable 216 has a duty cycle of 25%. As another example, each pulse of the variable 216 has a duty cycle of 75%. As another example, each of the pulses 216-1 through 216-5 has a duty cycle of 25% and each pulse of cycle 2 has a duty cycle of 75%.

In an embodiment, the terms sub cycle and subcycle are used herein interchangeably.

In one embodiment, the variable level V0 is a zero power level of a variable.

In an embodiment, the variable level V0 is a positive power level of a variable.

In one embodiment, instead of transitioning to the variable level V4 from the variable level V0, the variable 216 transitions to another variable level, such as a variable level V2 or a variable level V6. The variable level V6 is greater than the variable level V4. The variable level V2 is greater than the variable level V0 and less than the variable level V3.

In an embodiment, instead of transitioning to the variable level V3 from the variable level V0, the variable 216 transitions to another variable level, such as the variable level V2 or a variable level V1. The variable level V1 is greater than the variable level V0 and is less than the variable level V2.

In one embodiment, the variable 216 has more than two states. For example, the variable 216 has three or four or five states. To illustrate, instead of transitioning between the variable levels V0 and V3, the variable 216 transitions among three variable levels each time a synchronization pulse of the synchronization signal 202 is received by the TCP generator. When the synchronization pulse 202-1 is received at the time t0 by the TCP generator, the variable 230 transitions among the three variable levels during the time interval between the times t0 and t2. When the synchronization pulse 202-2 is received at the time t2 by the TCP generator, the variable 216 again transitions among the three variable levels during the time interval between the times t2 and t4.

FIG. 2E depicts a graph 218 to illustrate a variable 220 of the RF signal 104 (FIG. 1) that is generated by the bias generator 1 in synchronization with the synchronization signal 206 (FIG. 2B). The graph 218 plots multiple variable levels of the RF signal 104 versus the time t.

Pulsing of the RF signal 104 is synchronized with the pulsing of the synchronization signal 206. For example, during the time interval between the times t0 and t10 in which the synchronization signal 206 does not have a pulse, the bias generator 1 is disabled from generating any pulses of the variable 220. To illustrate, in a time interval between the times t0 and t10, the synchronization signal 206 does not include any pulses, and therefore, the variable 220 of the RF signal 104 does not include any pulses during the same time interval. The variable 220 of the RF signal 104 does not transition between multiple variable levels during a time interval between the times t0 and t10. The variable 220 of the RF signal 104 has the variable level V0 during a time interval between the times t0 and t10. The variable 220 does not have any variable levels, other than the variable level V0 during the time interval between the times t0 and t10. As such, the variable 220 has the single variable level V0 during the time interval between the times t0 and t10.

As another example, each pulse of the RF signal 104 is generated in response to reception of a pulse of the synchronization signal 206. To illustrate, when the pulse 206-1 (FIG. 2B) of the synchronization signal 206 is received by the bias generator 1, a pulse 220-1 of the variable 220 is generated by the bias generator 1 and the pulse 220-1 is synchronized with the pulse 206-1. When the pulse 206-1 of the synchronization signal 206 is received by the bias generator 1, the bias generator 1 is enabled to generate the pulse 220-1. For example, the variable 220 of the RF signal 104 transitions from the variable level V0 to the variable level V6 at the time t10, and remains at the variable level V6 from the time t10 to the time t11. The variable 220 transitions from the variable level V6 to the variable level V0 at the time t11. The variable 220 remains at the variable level V0 from the time t11 to the time t12 to create the pulse 220-1. The pulse 220-1 has a first instance of the states S1 and S0 of the variable 220.

In the same manner in which the pulse 220-1 is generated, additional pulses 220-2 and 220-3 are generated by the bias generator 1 in synchronization with the pulses 206-2 and 206-3. For example, the pulse 220-2 is generated in synchronization with the pulse 206-2 and the pulse 220-3 is generated in synchronization with the pulse 206-3. As another example, at the time t12 at which the pulse 206-2 (FIG. 2B) transitions from the logic level 0 to the logic level 1, the pulse 220-2 transitions from the variable level V0 to the variable level V6. The pulse 220-2 has a second instance of the states S1 and S0 of the variable 220, and the pulse 220-3 has a third instance of the states S1 and S0 of the variable 220. As such, three pulses 220-1 through 220-3 of the variable 220 are generated from the time t10 to the time t16 during the cycle 1 of the master clock signal 141.

It should be noted that the variable levels V0 and V6 of the pulses 220-1 through 220-3 are examples of the information regarding variable levels received within the pulsing preset signal 138 (FIG. 1). Also, a duty cycle of each pulse 220-1 through 220-3 is an example of the information regarding duty cycles received within the pulsing preset signal 138. As an example, a duty cycle of each pulse 220-1 through 220-3 is 50%. To illustrate, a duty cycle of each pulse 220-1 through 220-3 is a time interval for which the pulse has the variable level V6.

The variable level V6 is referred to herein as a state S1 of the variable 220. Also, the variable level V0 is referred to herein as a state S0 of the variable 220.

No pulses of the variable 220 are generated during the sub cycle 1 of the cycle 1 of the master clock signal 141. The pulses 220-1 through 220-3 are generated during the sub cycle 2 of the cycle 1 of the master clock signal 141. Also, no pulses of the variable 220 are generated during the sub cycle 3 of the cycle 1 of the master clock signal 141. During the time interval for the sub cycle 3 in which the synchronization signal 206 does not have a pulse, the bias generator 1 is disabled from generating any pulses of the variable 220.

During the cycle 2 of the master clock signal 141, three additional pulses of the variable 220 are generated again by the bias generator 1 in the same manner in which the pulses 220-1 through 220-3 of the variable 220 are generated during the cycle 1 of the master clock signal 141. For example, three additional pulses of the variable 220 are generated in synchronization with three pulses of the synchronization signal 206 during the cycle 2 of the master clock signal 141 in the same manner in which the pulses 220-1 through 220-3 are synchronized with the pulses 206-1 through 206-3 of the synchronization signal 206 during the cycle 1 of the master clock signal 141.

In one embodiment, each pulse of the variable 220 has a duty cycle that is greater than or less than 50%. For example, each pulse of the variable 220 has a duty cycle of 25%. As another example, each pulse of the variable 220 has a duty cycle of 75%. As another example, each pulse of the variable 220 has a duty cycle of 25%.

In one embodiment, instead of transitioning to the variable level V6 from the variable level V0, the variable 220 transitions to another variable level, such as the variable level V2.

FIG. 2F depicts a graph 222 to illustrate a variable 224 of the RF signal 106 (FIG. 1) that is generated by the bias generator 2 in synchronization with the synchronization signal 210 (FIG. 2C). The graph 220 plots multiple variable levels of the RF signal 106 versus the time t.

Pulsing of the RF signal 106 is synchronized with the pulsing of the synchronization signal 210. For example, in a time interval between the times t0 and t10, the synchronization signal 210 does not include any pulses, and therefore, the variable 224 of the RF signal 106 does not include any pulses during the same time interval. The variable 224 of the RF signal 106 does not transition between multiple variable levels during a time interval between the times t0 and t10. The variable 224 of the RF signal 106 has the variable level V0 during a time interval between the times t0 and t10. The variable 224 does not have any variable levels, other than the variable level V0 during the time interval between the times t0 and t10. As such, the variable 224 has the single variable level V0 during the time interval between the times t0 and t10.

As another example, each pulse of the RF signal 106 is generated in response to reception of a pulse of the synchronization signal 210. When the pulse 210-1 of the synchronization signal 210 is received by the bias generator 2, the bias generator 2 is enabled to generate the pulse 224-1. To illustrate, after the pulse 210-1 (FIG. 2C) of the synchronization signal 210 is received by the bias generator 2, a pulse 224-1 of the variable 224 is generated by the bias generator 2 and the pulse 224-1 is synchronized with the pulse 210-1. For example, the variable 224 of the RF signal 106 remains at the variable level V0 from the time t10 to the time t11 and transitions from the variable level V0 to the variable level V2 at the time t11. The variable 224 transitions from the variable level V2 to the variable level V0 at the time t12 to create the pulse 224-1. The pulse 224-1 has a first instance of states S1 and S0 of the variable 224.

In the same manner in which the pulse 224-1 is generated, additional pulses 224-2 and 224-3 are generated by the bias generator 1 in synchronization with the pulses 210-2 and 210-3 of the synchronization signal 210. For example, the pulse 224-2 is generated in synchronization with the pulse 210-2 and the pulse 224-3 is generated in synchronization with the pulse 210-3. As another example, after the time t12 at which the pulse 210-2 (FIG. 2B) transitions from the logic level 0 to the logic level 1, the pulse 224-2 transitions from the variable level V0 to the variable level V2. The pulse 224-2 remains at the variable level V0 from the time t12 to the time t13 and transitions from the variable level V0 to the variable level V2 at the time t13. As such, three pulses 224-1 through 224-3 of the variable 220 are generated from the time t10 to the time t16 during the cycle 1 of the master clock signal 141. The pulse 224-2 has a second instance of the states S1 and S0 of the variable 224, and the pulse 224-3 has a third instance of the states S1 and S0 of the variable 224.

It should be noted that the variable levels V0 and V2 of the variable 224 are examples of the information regarding variable levels received within the pulsing preset signal 138 (FIG. 1). Also, a duty cycle of each pulse 224-1 through 224-3 is an example of the information regarding duty cycles received within the pulsing preset signal 138. As an example, a duty cycle of each pulse 224-1 through 224-3 is 50%. To illustrate, a duty cycle of each pulse 224-1 through 224-3 is a time interval for which the pulse has the variable level V2.

During the cycle 2 of the master clock signal 141, three additional pulses of the variable 224 are generated again by the bias generator 2 in the same manner in which the pulses 224-1 through 224-3 of the variable 224 are generated during the cycle 1 of the master clock signal 141. For example, three additional pulses of the variable 224 are generated in synchronization with three pulses of the synchronization signal 210 during the cycle 2 of the master clock signal 141 in the same manner in which the pulses 224-1 through 224-3 are synchronized with the pulses 210-1 through 210-3 of the synchronization signal 210.

The variable level V2 is referred to herein as a state S1 of the variable 224. Also, the variable level V0 is referred to herein as a state S0 of the variable 224.

No pulses of the variable 224 are generated during the sub cycle 1 of the cycle 1 of the master clock signal 141. During the time interval between the times t0 and t10 in which the synchronization signal 210 does not have a pulse, the bias generator 2 is disabled from generating any pulses of the variable 224. The pulses 224-1 through 224-3 are generated during the sub cycle 2 of the cycle 1 of the master clock signal 141. Also, no pulses of the variable 224 are generated during the sub cycle 3 of the cycle 1 of the master clock signal 141. During the time interval between the times t16 and t20 in which the synchronization signal 210 does not have a pulse, the bias generator 2 is disabled from generating any pulses of the variable 224.

In one embodiment, each pulse of the variable 224 has a duty cycle that is greater than or less than 50%. For example, each pulse of the variable 224 has a duty cycle of 25%. As another example, each pulse of the variable 224 has a duty cycle of 75%. As another example, each of the pulses 224-1 through 224-5 has a duty cycle of 25%.

In one embodiment, instead of transitioning to the variable level V2 from the variable level V0, the variable 224 transitions to another variable level, such as the variable level V6 or the variable level V3.

FIG. 2G depicts a graph 230 to illustrate a variable 232 of the RF signal 104 (FIG. 1) that is generated by the bias generator 1 in synchronization with the synchronization signal 206 (FIG. 2B). The graph 230 plots multiple variable levels of the variable 232 of the RF signal 104 versus the time t.

Pulsing of the variable 232 is synchronized with the pulsing of the synchronization signal 206. For example, in a time interval between the times t0 and t10, the synchronization signal 206 does not include any pulses, and therefore, the variable 232 of the RF signal 104 does not include any pulses during the same time interval. The variable 232 of the RF signal 104 does not transition between multiple variable levels during the time interval between the times t0 and t10. The variable 232 of the RF signal 104 has the variable level V0 during a time interval between the times t0 and t10. The variable 232 does not have any variable levels, other than the variable level V0 during the time interval between the times t0 and t10. As such, the variable 232 has the single variable level V0 during the time interval between the times t0 and t10.

As another example, each series of variable levels of the variable 232 is generated in response to reception of a pulse of the synchronization signal 206. To illustrate, when the pulse 206-1 (FIG. 2B) of the synchronization signal 206 is received by the bias generator 1, a series 232-1 of variable levels of the variable 232 is generated by the bias generator 1 and the series 232-1 of pulses is synchronized with the pulse 206-1. For example, the variable 232 of the RF signal 104 transitions from the variable level V0 to a variable level V5 at the time t10, and remains at the variable level V5 from the time t10 to the time t10.5. The variable level V5 is greater than the variable level V4 but less than the variable level V6. Also, the variable level V5 is defined as a state S4 of the variable 232. The variable 232 transitions from the variable level V5 to the variable level V4 at the time t10.5. The variable 232 remains at the variable level V4 from the time t10.5 to the time t11. The variable level V4 is defined as a state S3 of the variable 232. The variable 232 transitions from the variable level V4 to the variable level V3 at the time t11. The variable 232 remains at the variable level V3 from the time t11 to a time t11.5. The time t11.5 is at half of the time interval between the times t11 and t12. The variable level V3 is defined as a state S2 of the variable 232. The variable 232 transitions from the variable level V3 to the variable level V2 at the time t11.5. The variable 232 remains at the variable level V2 from the time t11.5 to the time t12 to create the series 232-1. The variable level V2 is defined as a state S1 of the variable 232.

The series 232-1 includes an occurrence, such as a first instance, of the states S4, S3, S2, and S1 of the variable 232. Each state S1 through S4 of the series 232-1 represents a different variable level of the RF signal 104. For example, the state S4 of the variable 232 is a first variable level of the RF signal 104, the state S3 of the variable 232 is a second variable level of the RF signal 104, the state S2 of the variable 232 is a third variable level of the RF signal 104, and the state S1 of the variable 232 is a fourth variable level of the RF signal 104. Also, each state S1 through S4 has a duty cycle. For example, a duty cycle of each state S1 through S4 of the series 232-1 is 25%.

In the same manner in which the series 232-1 of variable levels of the variable 232 is generated, additional series 232-2 and 232-3 of variable levels of the variable 232 are generated by the bias generator 1 in synchronization with the pulses 206-2 and 206-3. For example, the series 232-2 is generated in synchronization with the pulse 206-2 and the series 232-3 is generated in synchronization with the pulse 206-3. As another example, at the time t12 at which the pulse 206-2 (FIG. 2B) transitions from the logic level 0 to the logic level 1, the series 232-2 transitions from the variable level V0 to the variable level V5, further transitions from the variable level V5 to the variable level V4, transitions from the variable level V4 to the variable level V3, and transitions from the variable level V3 to the variable level V2. As such, three series 232-1 through 232-3 of multiple variable levels of the variable 232 are generated from the time t10 to the time t16 during the cycle 1 of the master clock signal 141. The series 232-2 includes a second instance of the states S4, S3, S2, and S1 of the variable 232, and the series 232-3 includes a third instance of the states S4, S3, S2, and S1 of the variable 232.

It should be noted that the variable levels V5, V4, V3, and V2 are examples of the information regarding variable levels received within the pulsing preset signal 138 (FIG. 1). Also, a duty cycle of each variable level of each series 232-1 through 232-3 is an example of the information regarding duty cycles received within the pulsing preset signal 138. As an example, a duty cycle of the state S4 of the series 232-1 is 25%, a duty cycle of the state S3 of the series 232-1 is 25%, a duty cycle of the state S2 of the series 232-1 is 25%, and a duty cycle of the state S1 of the series 232-1 is 25%. To illustrate, a duty cycle of each variable level of each series 232-1 through 232-3 is a time interval for which the variable level occurs.

No pulses of the variable 232 are generated during the sub cycle 1 of the cycle 1 of the master clock signal 141. The pulses 230-1 through 230-3 are generated during the sub cycle 2 of the cycle 1 of the master clock signal 141. Also, no pulses of the variable 232 are generated during the sub cycle 3 of the cycle 1 of the master clock signal 141.

During the cycle 2 of the master clock signal 141, three additional series of variable levels of the variable 232 are generated again by the bias generator 1 in the same manner in which the series 232-1 through 232-3 of the variable 232 are generated during the cycle 1 of the master clock signal 141. For example, three additional series of the variable levels V5, V4, V3, and V2 of the variable 232 are generated in synchronization with three pulses of the synchronization signal 206 during the cycle 2 of the master clock signal 141 in the same manner in which the series 232-1 through 232-3 are synchronized with the pulses 206-1 through 206-3 of the synchronization signal 206.

In one embodiment, a variable level of the variable 232 has a duty cycle that is different from, such as greater than or less than, one or more duty cycles of one or more remaining variable levels of the variable 232. For example, the variable level V4 of the series 232-1 has a duty cycle of 40% and the variable level V3 of the series 232-1 has a duty cycle of 30%. In this example, the variable level V2 of the series 232-1 has a duty cycle of 20% and the variable level V1 of the series 232-1 has a duty cycle of 10%. The duty cycles of the states S1 through S4 of the variable 232 amount or total to 100%. As another example, the variable level V4 of the series 232-1 has a duty cycle of 25% and the variable level V3 of the series 232-1 has a duty cycle of 25%. In this example, the variable level V2 of the series 232-1 has a duty cycle of 30% and the variable level V1 of the series 232-1 has a duty cycle of 20%.

In one embodiment, instead of transitioning from a first variable level to a second variable level, the variable 232 transitions to a third variable level, which is different from the second variable level. For example, instead of transitioning from the variable level V5 to the variable level V4, the variable 232 transitions from the variable level V5 to the variable level V3 or the variable level V6. As another example, instead of transitioning from the variable level V4 to the variable level V3, the variable 232 transitions from the variable level V4 to the variable level V2 or the variable level V5.

In an embodiment, the variable 232 includes a number of states different from four. For example, the variable 232 includes three states or five state or six states. As an illustration, during a time interval starting at the time t10 and ending at the time t12, a first series of three variable levels or three states of the variable 232 is formed when the variable 232 transitions from the variable level V0 to the variable level V5 at the time t10, further transitions from the variable level V5 to the variable level V3, and then transitions from the variable level V3 to the variable level V2 at the time t12. In the example, during a time interval starting at the time t12 and ending at the time t14, a second series of three variable levels of the variable 232 is formed when the variable 232 transitions from the variable level V2 to the variable level V5 at the time t12, further transitions from the variable level V5 to the variable level V3, and then transitions from the variable level V3 to the variable level V2 at the time t14. Also, in the example, during a time interval starting at the time t14 and ending at the time t16, a third series of three variable levels of the variable 232 is formed when the variable 232 transitions from the variable level V2 to the variable level V5 at the time t14, further transitions from the variable level V5 to the variable level V3, and then transitions from the variable level V3 to the variable level V2 at the time t16.

In one embodiment, a different number of series of variable levels of the variable is generated than that illustrated in FIG. 2G. For example, instead of the three series 232-1 through 232-3, only two series 232-1 and 230-2 are generated by the bias generator 1. As another example, in addition to the three series 232-1 through 232-3, a fourth series is generated by the bias generator 1. The fourth series is the same any of the three series 232-1 through 232-3.

In an embodiment, the variable 232 is generated by the bias generator 2 or the TCP generator. For example, when the synchronization signal 206 is an example of the synchronization signal 140 sent to the TCP generator, the variable 232 is of the RF signal 102 generated by the TCP generator (FIG. 1). As another example, when the synchronization signal 206 is an example of the synchronization signal 144 sent to the bias generator 2, the variable 232 is of the RF signal 106 generated by the bias generator 2 (FIG. 1).

In one embodiment, the terms series of pulses and pulse are used herein interchangeably. For example, the series 232-1 is a first pulse of the variable 232 and the series 232-2 is a second pulse of the variable 232.

In an embodiment, the same synchronization signal, such as a single synchronization signal, is sent from the pulse controller to two or more of the TCP generator, the bias generator 1, and the bias generator 2. For example, the synchronization signal 140 is sent to the TCP generator, the bias generator 1 and the bias generator 2. As another example, the synchronization signal 142 is sent to the TCP generator, the bias generator 1 and the bias generator 2. In the embodiment, the two or more of the TCP generator, the bias generator 1, and the bias generator 2 generate two or more of the RF signals 102, 104, and 106 in synchronization with the same synchronization signal. It should be noted that in the embodiment, variable levels of one of the RF signals 102, 104, and 106 can be different from variable levels of remaining of the RF signals 102, 104, and 106. To illustrate, the variable of the RF signal 102 has three states and the variable of the RF signal 104 has four states. Because the same synchronization signal is received by the two or more of the RF generators, a frequency of instances of states of the variable of the RF signals 102, 104, and 106 is the same. For example, when the synchronization signal 202 is received by the TCP generator and the bias generator 1, the TCP generator generates the RF signal 102 having a first instance of the three states of the variable at the time t0 and the bias generator 1 generates the RF signal 104 having a first instance of the four states of the variable at the time t0. In this example, the TCP generator generates the RF signal 102 having a second instance of the three states of the variable at the time t2 and the bias generator 1 generates the RF signal 104 having a second instance of the four states of the variable at the time t2.

FIG. 3 is an embodiment of a system 300 to illustrate use of Ethernet cables 302, 304, and 306 to transfer the information regarding variable levels and duty cycles, and the information regarding a portion of a cycle of the master clock signal 141 for which multiple states of an RF signal are to be generated. The system 300 is the same as the system 100 of FIG. 1 except that in the system 300, instead of the EtherCAT train, the information regarding variable levels and duty cycles, and the information regarding a portion of a cycle of the master clock signal 141 is transferred from the pulse controller via the Ethernet cables 302, 304, and 306 to the TCP generator and bias generators 1 and 2. The pulse controller is coupled to the TCP generator via the Ethernet cable 302, is coupled to the bias generator 1 via the Ethernet cable 304, and is coupled to the bias generator 2 via the Ethernet cable 306.

The system 300 includes the module controller, the pulse controller, the TCP generator, the bias generator 1, the bias generator 2, the TCP match, the bias match, and the plasma chamber 108. The module controller sends the pulsing preset signal 138 via the communication cable 116 to the pulse controller. Upon receiving the pulsing preset signal 138, the pulse controller identifies and extracts from the pulsing preset signal 138, information regarding variable levels and duty cycles of the RF signal 102 and information regarding a portion of a cycle of the master clock signal 141 for which multiple states of the RF signal 102 is to be generated. For example, the pulse controller identifies from the pulsing preset signal 138 that a duty cycle of the variable 216 (FIG. 2D) is 50% and that the variable 216 is to transition between the variable levels V3 and V0 for the time interval of the sub cycle 1 of the cycle 1 of the master clock signal 141. Also, the pulse controller identifies from the pulsing preset signal 138 that a duty cycle of the variable 216 is 50% and that the variable 216 is to transition between the variable levels V4 and V0 for the time interval of the sub cycle 2 of the cycle 1 of the master clock signal 141. Moreover, the pulse controller identifies from the pulsing preset signal 138 that a duty cycle of the variable 216 is 0% and that the variable 216 is remain at the variable level V0 for the time interval of the sub cycle 3 of the cycle 1 of the master clock signal 141. Also, the pulse controller identifies from the pulsing preset signal 138 that the variable levels and duty cycles of the variable 216 are to be repeated during the sub cycles 1, 2, and 3 of the cycle 2 of the master clock signal 141 in the same manner as that in which the variable levels and duty cycles of the variable 216 are to be generated during the sub cycles 1, 2, and 3 of the cycle 1 of the master clock signal 141.

The pulse controller generates a pulsing preset signal 308 having the information regarding variable levels and duty cycles of the RF signal 102 and information regarding a portion of a cycle of the master clock signal 141 for which multiple states of the RF signal 102 are to be generated, and sends the pulsing preset signal 308 via the Ethernet cable 302 to the TCP generator. Upon receiving the pulsing preset signal 308, the TCP generator stores the information regarding variable levels and duty cycles of the RF signal 102 and information regarding a portion of a cycle of the master clock signal 141 for which multiple states of the RF signal 102 are to be generated within the one or more memory devices of the TCP generator. Upon receiving the synchronization signal 140 via the transfer cable 120, the TCP generator generates, in synchronization with the synchronization signal 140, the RF signal 102 having the information regarding variable levels and duty cycles of the RF signal 102 and information regarding a portion of a cycle of the master clock signal 141 for which multiple states of the RF signal 102 are generated.

Similarly, upon receiving the pulsing preset signal 138, the pulse controller identifies and extracts from the pulsing preset signal 138, information regarding variable levels and duty cycles of the RF signal 104 and information regarding a portion of a cycle of the master clock signal 141 for which multiple states of the RF signal 104 is to be generated. For example, the pulse controller identifies from the pulsing preset signal 138 that a duty cycle of the variable 220 (FIG. 2E) is 0% and that the variable 220 is remain at the variable level V0 for the time interval of the sub cycle 1 of the cycle 1 of the master clock signal 141. Also, the pulse controller identifies from the pulsing preset signal 138 that a duty cycle of the variable 220 is 50% and that the variable 220 is to transition between the variable levels V6 and V0 for the time interval of the sub cycle 2 of the cycle 1 of the master clock signal 141. Also, the pulse controller identifies from the pulsing preset signal 138 that a duty cycle of the variable 220 is 0% and that the variable 220 is remain at the variable level V0 for the time interval of the sub cycle 3 of the cycle 1 of the master clock signal 141. Also, the pulse controller identifies from the pulsing preset signal 138 that the variable levels and duty cycles of the variable 220 are to be repeated during the sub cycles 1, 2, and 3 of the cycle 2 of the master clock signal 141 in the same manner as that in which the variable levels and duty cycles of the variable 220 are to be generated during the sub cycles 1, 2, and 3 of the cycle 1 of the master clock signal 141.

The pulse controller generates a pulsing preset signal 310 having the information regarding variable levels and duty cycles of the RF signal 104 and information regarding a portion of a cycle of the master clock signal 141 for which multiple states of the RF signal 104 is to be generated, and sends the pulsing preset signal 310 via the Ethernet cable 304 to the bias generator 1. Upon receiving the pulsing preset signal 310, the bias generator 1 stores the information regarding variable levels and duty cycles of the RF signal 104 and information regarding a portion of a cycle of the master clock signal 141 for which multiple states of the RF signal 104 are to be generated within the one or more memory devices of the bias generator 1. Upon receiving the synchronization signal 142 via the transfer cable 122, the bias generator 1 generates, in synchronization with the synchronization signal 142, the RF signal 104 having the information regarding variable levels and duty cycles of the RF signal 104 and information regarding a portion of a cycle of the master clock signal 141 for which multiple states of the RF signal 104 are generated.

Also, upon receiving the pulsing preset signal 138, the pulse controller identifies and extracts from the pulsing preset signal 138, information regarding variable levels and duty cycles of the RF signal 106 and information regarding a portion of a cycle of the master clock signal 141 for which multiple states of the RF signal 106 is to be generated. For example, the pulse controller identifies from the pulsing preset signal 138 that a duty cycle of the variable 224 (FIG. 2F) is 0% and that the variable 224 is remain at the variable level V0 for the time interval of the sub cycle 1 of the cycle 1 of the master clock signal 141. Also, the pulse controller identifies from the pulsing preset signal 138 that a duty cycle of the variable 224 is 50% and that the variable 224 is to transition between the variable levels V2 and V0 for the time interval of the sub cycle 2 of the cycle 1 of the master clock signal 141. Also, the pulse controller identifies from the pulsing preset signal 138 that a duty cycle of the variable 224 is 0% and that the variable 224 is remain at the variable level V0 for the time interval of the sub cycle 3 of the cycle 1 of the master clock signal 141. Also, the pulse controller identifies from the pulsing preset signal 138 that the variable levels and duty cycles of the variable 224 are to be repeated during the sub cycles 1, 2, and 3 of the cycle 2 of the master clock signal 141 in the same manner as that in which the variable levels and duty cycles of the variable 220 are to be generated during the sub cycles 1, 2, and 3 of the cycle 1 of the master clock signal 141.

The pulse controller generates a pulsing preset signal 312 having the information regarding variable levels and duty cycles of the RF signal 106 and information regarding a portion of a cycle of the master clock signal 141 for which multiple states of the RF signal 106 is to be generated, and sends the pulsing preset signal 312 via the Ethernet cable 306 to the bias generator 2. Upon receiving the pulsing preset signal 312, the bias generator 2 stores the information regarding variable levels and duty cycles of the RF signal 106 and information regarding a portion of a cycle of the master clock signal 141 for which multiple states of the RF signal 106 are to be generated within the one or more memory devices of the bias generator 2. Upon receiving the synchronization signal 144 via the transfer cable 124, the bias generator 2 generates, in synchronization with the synchronization signal 144, the RF signal 106 having the information regarding variable levels and duty cycles of the RF signal 106 and information regarding a portion of a cycle of the master clock signal 141 for which multiple states of the RF signal 106 are generated.

In one embodiment, instead of each of the Ethernet cables 302, 304, and 306, a connection cable is used. An example of the connection cable is a cable that can transfer data at speeds greater than 10 Gbps. The connection cable provides a CPU-to-CPU connection. For example, the connection cable can transfer data at speeds that range from 10 Gbps to 40 Gbps. Another example of the connection cable is a transfer cable.

FIG. 4 is a diagram of an embodiment of a system 400 to illustrate use of EtherCAT for sensing data from a sensor 402 within the TCP match and a sensor 404 within the bias match. An example of each sensor 402 and 404 is a voltage sensor, or a current sensor, or a complex voltage and current sensor, or a power sensor. To illustrate, each sensor 402 and 404 senses data, such as voltage data, or current data, or power values, or complex voltage and current values. As an example, the sensor 402 is coupled to the input I1 of the TCP match. As another example, the sensor 402 is coupled to the output O2 of the TCP match. As an example, the sensor 404 is coupled to the input I2 or I3 of the bias match. As another example, the sensor 404 is coupled to the output O4 of the bias match.

The system 400 is the same as the system 100 (FIG. 1) except that the system 400 includes a communication cable 406 and another communication cable 408. The system 400 further includes a voltage sensor system 410 and an optical emission spectrometer (OES) system 412.

The voltage sensor system 410 includes a voltage detector or sensor, a controller, and an analog-to-digital converter (ADC). The voltage sensor senses wafer bias, such as a voltage, at the substrate support 110. For example, the voltage sensor senses data, such as voltage data or voltage values. The controller of the voltage sensor system 410 is coupled to the ADC of the voltage sensor system 410 and to the voltage sensor. The OES system 412 includes an OES, a controller, and an ADC. The controller of the OES system 412 is coupled to the ADC of the OES system 412 and to the OES. The OES senses intensity of light emitted from plasma within the plasma chamber 108. For example, the OES measures data of intensities of light that is reflected from a top surface of the substrate S towards the OES.

The system 400 includes the module controller, the pulse controller, the TCP generator, the bias generators 1 and 2, the plasma chamber 108, the TCP match having the sensor 402, the bias match having the sensor 404, the voltage sensor system 410, and the OES system 412. The communication cable 406 couples the pulse controller to the TCP match and the communication cable 408 couples the TCP match to the bias match. The pulse controller is coupled via a transfer cable 414 to the TCP match and is coupled via a transfer cable 417 to the bias match.

The voltage sensor system 410 is coupled to the substrate support 110. Also, the OES system 412 is located besides a side wall 424 of the plasma chamber 108. For example, there is a window placed in the side wall 424 and the OES of the OES system 412 faces the window. Also, the pulse controller is coupled via a transfer cable 420 to the voltage sensor system 410 and is coupled via a transfer cable 422 to the OES system 412.

The pulse controller generates a factor control signal 415, which is an EtherCAT train, and sends the factor control signal 415 via the communication cable 406 to the TCP match. The factor control signal 415 includes an instruction for a match controller within the TCP match to change a factor, such as a capacitance, or an inductance, or a combination thereof, of the TCP match to achieve a pre-determined factor. The factor control signal 415 further includes another instruction for a match controller within the bias match to change the factor of the bias match to achieve a pre-set factor.

Upon receiving the factor control signal 415, the TCP match obtains the pre-determined factor for the TCP match from the factor control signal 415. Based on the pre-determined factor, the match controller of the TCP match controls a TCP motor within the TCP match to further control a circuit component of the TCP match. The circuit component of the TCP match is controlled to change the factor of the circuit component to achieve the pre-determined factor. For example, the motor of the TCP match controls a first plate of a capacitor of the TCP match to rotate with respect to a second plate of the capacitor to achieve a pre-determined capacitance.

After obtaining the pre-determined factor from the factor control signal 415, the TCP match sends the factor control signal 415 via the communication cable 408 to the bias match. Upon receiving the factor control signal 415, the bias match obtains the pre-set factor for the bias match from the factor control signal 415. Based on the pre-set factor, the match controller of the bias match 1 controls a bias motor within the bias match to further control a circuit component of the bias match. The circuit component of the bias match is controlled to change the factor of the circuit component to achieve the pre-set factor. For example, the motor controls a first plate of a capacitor of the bias match to rotate with respect to a second plate of the capacitor to achieve a pre-set capacitance.

After obtaining the pre-set factor from factor control signal 415, the bias match sends the factor control signal 415 via the communication cable 408 back to the TCP match. The TCP match sends the factor control signal 415 received from the bias match back to the pulse controller.

Also, after the instruction for achieving the pre-determined factor is applied by the match controller of the TCP match and the RF signals 102, 104, and 106 are generated, the pulse controller generates a synchronization signal 416 and sends the synchronization signal 416 via the transfer cable 414 to the TCP match. Moreover, after the instruction for achieving the pre-set factor is applied by the match controller of the bias match and the RF signals 102, 104, and 106 are generated, the pulse controller generates another synchronization signal 418 and sends the synchronization signal 418 via the transfer cable 417 to the bias match. The synchronization signal 416 is labeled as sync4a in FIG. 4 and the synchronization signal 418 is labeled as sync4b in FIG. 4.

In response to the reception of the synchronization signal 416, the match controller within the TCP match controls an ADC of the TCP match to collect the data sensed by the sensor 402 in synchronization with the synchronization signal 416. The data collected is sent to the pulse controller from the TCP match. For example, the synchronization signal 416 includes a series of pulses including a first pulse and a second pulse. In response to reception of the first pulse of the synchronization signal 416 for a first time interval, the match controller of the TCP match controls the ADC of the TCP match to convert data sensed by the sensor 402 from an analog form to a digital form for the first time interval to output digital data for the first time interval. The ADC of the TCP match is coupled to the sensor 402. The match controller of the TCP match receives the digital data output for the first time interval from the ADC of the TCP match, and stores the digital data within a memory device of the match controller. When the factor control signal 415 is received back from the bias match, the match controller accesses the digital data for the first time interval from the memory device. The digital data for the time interval is then embedded within the factor control signal 415, which is sent via the communication cable 406 to the pulse controller.

Similarly, in response to reception of the second pulse of the synchronization signal 416 for a second time interval, the match controller of the TCP match controls the ADC of the TCP match to convert data sensed by the sensor 402 from an analog form to a digital form for the second time interval to output digital data for the second time interval. The match controller of the TCP match receives the digital data output for the second time interval from the ADC of the TCP match, and stores the digital data within the memory device of the match controller. When the factor control signal 415 is received back from the bias match, the match controller accesses the digital data for the second time interval from the memory device. The digital data for the second time interval is embedded within the factor control signal 415, which is sent via the communication cable 406 to the pulse controller. During a time interval in which a pulse of the synchronization signal 416 is not received by the TCP match, the match controller of the TCP match does not control the ADC to convert data sensed by the sensor 402 from the analog form to the digital form.

In a similar manner, in response to the reception of the synchronization signal 418, the match controller within the bias match controls the sensor 404 to provide the data sensed by the sensor 404 to the pulse controller in synchronization with the synchronization signal 418. For example, the synchronization signal 418 includes a series of pulses including a first pulse and a second pulse. In response to reception of the first pulse of the synchronization signal 418 for a first time interval, the match controller of the bias match controls an ADC of the bias match to convert data sensed by the sensor 404 from an analog form to a digital form for the first time interval to output digital data for the first time interval. The ADC of the bias match is coupled to the sensor 404. The match controller of the bias match receives the digital data output for the first time interval from the ADC of the bias match, and stores the digital data within a memory device of the match controller. When the factor control signal 415 is received from the TCP match, the match controller accesses the digital data for the first time interval from the memory device. The digital data for the first time interval is embedded within the factor control signal 415, which is sent via the communication cable 408 back to the TCP match and from the TCP match via the communication cable 408 back to the pulse controller.

Similarly, in response to reception of the second pulse of the synchronization signal 418 for a second time interval, the match controller of the bias match controls the ADC of the bias match to convert data sensed by the sensor 404 from an analog form to a digital form for the second time interval to output digital data for the second time interval. The match controller of the bias match receives the digital data output for the second time interval from the ADC of the bias match, and stores the digital data within the memory device of the match controller. When the factor control signal 415 is received from the bias match, the match controller accesses the digital data for the second time interval from the memory device. The digital data for the second time interval is then embedded within the factor control signal 415, which is sent via the communication cable 408 back to the TCP match and from the TCP match back to the pulse controller. During a time interval in which a pulse of the synchronization signal 418 is not received by the bias match, the match controller of the bias match does not control the ADC to convert data sensed by the sensor 404 from the analog form to the digital form.

Also, the pulse controller generates a synchronization signal 426 and sends the synchronization signal 426 via the transfer cable 420 to the voltage sensor system 410. The synchronization signal 426 is labeled as sync5 in FIG. 4. In response to the reception of the synchronization signal 426, a controller within the voltage sensor system 410 controls the voltage sensor of the voltage sensor system 410 to provide the data sensed by the voltage sensor to the pulse controller in synchronization with the synchronization signal 426. As an example, the synchronization signal 426 includes a series of pulses including a first pulse and a second pulse. In response to reception of the first pulse of the synchronization signal 426 for a first time interval, the controller of the voltage sensor system 410 controls an ADC of the voltage sensor system 410 to convert data sensed by the voltage sensor from an analog form to a digital form for the first time interval to output digital data for the first time interval. The ADC of the voltage sensor system 410 is coupled to the voltage sensor of the voltage sensor system 410. The controller of the voltage sensor system 410 receives the digital data output for the first time interval from the ADC of the voltage sensor system 410, and sends the digital data to the pulse controller via the transfer cable 420. Similarly, in response to reception of the second pulse of the synchronization signal 426 for a second time interval, the controller of the voltage sensor system 410 controls the ADC of the voltage sensor system 410 to convert data sensed by the voltage sensor from an analog form to a digital form for the second time interval to output digital data for the second time interval. The controller of the voltage sensor system 410 receives the digital data output for the second time interval from the ADC of the voltage sensor system 410, and sends the digital data to the pulse controller via the transfer cable 420. During a time interval in which a pulse of the synchronization signal 426 is not received by the voltage sensor system 410, the controller of the voltage sensor system 410 does not control the ADC of the voltage sensor system 410 to convert data sensed by the voltage sensor from the analog form to the digital form.

Moreover, the pulse controller generates a synchronization signal 428 and sends the synchronization signal 428 via the transfer cable 422 to the OES system 412. The synchronization signal 428 is labeled as sync6 in FIG. 4. In response to the reception of the synchronization signal 428, a controller within the OES system 412 controls the OES of the OES system 412 to provide the data sensed by the OES to the pulse controller in synchronization with the synchronization signal 428. As an example, the synchronization signal 428 includes a series of pulses including a first pulse and a second pulse. In response to reception of the first pulse of the synchronization signal 428 for a first time interval, the controller of the OES system 412 controls an ADC of the OES system 412 to convert data sensed by the OES from an analog form to a digital form for the first time interval to output digital data for the first time interval. The controller of the OES system 412 receives the digital data output for the first time interval from the ADC of the OES system 412, and sends the digital data to the pulse controller via the transfer cable 422. Similarly, in response to reception of the second pulse of the synchronization signal 428 for a second time interval, the controller of the OES system 412 controls the ADC of the OES system 412 to convert data sensed by the OES from an analog form to a digital form for the second time interval to output digital data for the second time interval. The controller of the OES system 412 receives the digital data output for the second time interval from the ADC of the OES system 412, and sends the digital data to the pulse controller via the transfer cable 422. During a time interval in which a pulse of the synchronization signal 428 is not received by the OES system 412, the controller of the OES system 412 does not control the ADC of the OES system 412 to convert data sensed by the OES from the analog form to the digital form.

The synchronization signals 416, 418, 426, and 428 are generated by the pulse controller in synchronization with the master clock signal 141. For example, each of the synchronization signals 416, 418, 426, and 428 has a series of pulses that repeat during each cycle of the master clock signal 141.

In one embodiment, instead of the voltage sensor of the voltage sensor system 410, a power sensor or a complex voltage and current sensor is used.

In one embodiment, instead of the sensor 402 being located within the TCP match, the sensor 402 is located outside the TCP match.

In an embodiment, instead of the sensor 404 being located within the bias match, the sensor 404 is located outside the TCP match.

In one embodiment, the system 400 excludes one or more but not all of the sensor 402, the sensor 404, the voltage sensor system 410, and the OES system 412.

In an embodiment, the module controller generates the factor control signal 415 and sends the factor control signal 415 via the communication cable 116 to the pulse controller. The pulse controller sends the factor control signal 415 via the communication cable 406 to the TCP match.

In an embodiment, the terms data and values are used herein interchangeably.

FIG. 5A depicts a graph 500 to illustrate a plot of intensity 502 of plasma versus the time t. The intensity 502 is detected by the OES. The intensity 502 is plotted on a y-axis and the time t is plotted on an x-axis.

FIG. 5B depicts a graph 504 for illustrating a synchronization signal 506 versus the time t. The graph 504 plots a logic level of the synchronization signal 506 on a y-axis and the time t on an x-axis. The synchronization signal 506 is an example of the synchronization signal 428 (FIG. 4).

The synchronization signal 506 does not pulse from the time t0 to the time t6. For example, the synchronization signal 506 has the logic level 0 from the time t0 to the time t6. The synchronization signal 506 pulses at the time t6. For example, the synchronization signal 506 transitions from the logic level 0 at the time t6 to the logic level 1 and remains at the logic level 1 from the time t6 to the time t6.5, which is at half of a time interval between the times t5 and t6. Also, the synchronization signal 506 transitions from the logic level 1 to the logic level 0 at the time t6.5 to form a pulse 506-1, and remains at the logic level 0 from the time t6.5 to the time t9. The synchronization signal 506 pulses again at the time t9. For example, the synchronization signal 506 transitions from the logic level 0 at the time t9 to the logic level 1 and remains at the logic level 1 from the time t9 to a time t10. Also, the synchronization signal 506 transitions from the logic level 1 to the logic level 0 at the time t10 to form a pulse 506-2, and remains at the logic level 0 from the time t10 to the time t20, which occurs at an end of the cycle 1 of the master clock signal 141.

During the cycle 1 of the master clock signal 141, the synchronization signal 506 includes a time interval of no pulses between the times t0 and t6 followed by the pulse 506-1. Also, during the cycle 1 of the master clock signal 141, the pulse 506-1 is followed by a time interval of no pulses between the times t6.5 and t9, and the time interval is followed by the pulse 506-2. During the cycle 1 of the master clock signal 141, the pulse 506-2 is followed by a time interval of no pulses between the times t10 and t20 during the cycle 1 of the master clock signal 141.

In the same manner as that during the cycle 1 of the master clock signal 141, the synchronization signal 506 does not pulse from the time t20 to the time t26, pulses at the time t26, does not pulse between a time t26.5 and the time t29, pulses again at the time t29, and does not pulse between the times t30 and t40 during the cycle 2 of the master clock signal 141. The time t26.5 is at half of a time interval between the times t26 and t27.

The ADC of the OES system 412 (FIG. 4) starts and ends sampling data sensed by the OES from an analog form to a digital form in synchronization with the synchronization signal 506. For example, during the time interval between the times t0 and t6, the intensity 502 that is detected by the OES is not sampled by the ADC of the OES system 412. In the example, during the time interval between the times t6 and t6.5, the intensity 502 that is detected by the OES is sampled by the ADC of the OES system 412. The intensity that is sampled during the time interval between the times t6 and t6.5 is represented by a portion 502-1. Also, in the example, during the time interval between the times t6.5 and t9, the intensity 502 that is detected by the OES is not sampled by the ADC of the OES system 412. Continuing with the example, during the time interval between the times t9 and t10, the intensity 502 that is detected by the OES is sampled by the ADC of the OES system 412. The intensity that is sampled during the time interval between the times t9 and t10 is represented by a portion 502-2. Also, in the example, during the time interval between the times t10 and t20, the intensity 502 that is detected by the OES is not sampled by the ADC of the OES system 412. In the same manner as that during the cycle 1 of the master clock signal 141, the intensity 502 is sampled or not sampled by the ADC of the OES system 412 during the cycle 2 of the master clock signal 141.

In an embodiment, all pulses of the synchronization signal 506 are of the same duration. For example, the pulse 506-2 transitions from the logic level 1 to the logic level 0 at a time t9.5 instead of transitioning at the time t10. The time t9.5 is at half of a time interval between the times t9 and t10. In the embodiment, the ADC that is coupled to the OES converts data sensed by the OES from an analog form to a digital form when each pulse of the synchronization signal 506 is received by the ADC. The ADC converts the data sensed by the OES for a pre-determined amount of time for each pulse of the synchronization signal 506. For example, the ADC converts the data sensed by the OES for the pre-determined amount of time between the times t6 and t9 when a rising edge of the pulse 506-1 is received by the ADC and converts the data sensed by the OES for the pre-determined amount of time between the times t9 and t12 when a rising edge of the pulse 506-2 is received by the ADC. The pre-determined amount of time starts from the time t6 at which the rising edge of the pulse 506-1 occurs. An example of the pre-determined amount of time is a time interval, which is a difference of one time unit or two time units or 2.5 time units. In this example, a time unit is defined as a time interval between two consecutive times, such as the times t0 and t1 or the times t1 and t2. The ADC stops sampling the data sensed by the OES after the pre-determined amount of time until a next consecutive pulse of the synchronization signal 506 is received by the ADC. The data sensed by the OES is sampled again by the ADC of the OES system 412 starting at the time t9 for the pre-determined amount of time. At the time t9, a rising edge of the pulse 506-2 occurs. It should be noted that a rising edge of a pulse, as used herein, is an edge that transitions from the logic level 0 to the logic level 1. It should be noted that a rising edge of a pulse, as used herein, is an edge that transitions from the logic level 1 to the logic level 0.

In one embodiment, instead of initiating collection of data sensed by the OES at a rising edge of each pulse of the synchronization signal 506, the collection is initiated for the pre-determined amount of time at a falling edge of the pulse. For example, suppose the pulse 506-2 transitions from the logic level 1 to the logic level 0 at the time t9.5 instead of the time t10. In the embodiment, the ADC that is coupled to the OES converts data sensed by the OES from an analog form to a digital form at a time of the falling edge of each pulse of the synchronization signal 506 received by the ADC. The ADC converts the data sensed by the OES for the pre-determined amount of time starting at the falling edge of the pulse of the synchronization signal 506. For example, the ADC converts the data sensed by the OES for the pre-determined amount of time between the times t6.5 and t9.5, and the pre-determined amount of time starts at the time t6.5 at which the falling edge of the pulse 506-1 is received by the ADC. The ADC stops sampling the data sensed by the OES after the pre-determined amount of time until a falling edge of a next consecutive pulse, such as the falling edge of the pulse 506-2, of the synchronization signal 506 is received by the ADC. The data sensed by the OES is sampled again starting at the time t9.5 for the pre-determined amount of time. It should be noted that a falling edge of a pulse, as used herein, is an edge that transitions from the logic level 0 to the logic level 1.

In one embodiment, instead of two consecutive pulses, the synchronization signal 506 includes another number, such as three or four, of consecutive pulses.

In an embodiment, a frequency of occurrence of pulses of the synchronization signal 506 is different from that illustrated in FIG. 5B. For example, instead of occurring at a time interval of three time units, the pulses of the synchronization signal 506 occur at a time interval of two time units. For example, instead of the pulse 506-2 occurring at the time t9, the pulse 506-2 occurs at the time t8. In this example, a time unit is defined as a time interval between two consecutive times, such as the times t0 and t1 or the times t1 and t2.

FIG. 6A depicts a graph 600 to illustrate a plot of voltage 602 versus the time t. The voltage 602 is measured by the sensor 402 (FIG. 4). The voltage 602 is plotted on a y-axis and the time t is plotted on an x-axis. The voltage 602 varies between a maximum value Vmax and a minimum value Vmin.

FIG. 6B depicts a graph 604 for illustrating a synchronization signal 606 versus the time t. The graph 604 plots a logic level of the synchronization signal 606 on a y-axis and the time t on an x-axis. The synchronization signal 606 is an example of the synchronization signal 416 (FIG. 4).

The synchronization signal 606 pulses at the time t0. For example, the synchronization signal 606 transitions from the logic level 0 at the time t0 to the logic level 1 and remains at the logic level 1 from the time t0 to the time t0.5. Also, the synchronization signal 606 transitions from the logic level 1 to the logic level 0 at the time t0.5 to form a pulse 606-1, and remains at the logic level 0 from the time t0.5 to the time t4.

The synchronization signal 606 does not pulse from the time t0.5 to the time t4. For example, the synchronization signal 606 has the logic level 0 from the time t0.5 to the time t4. The synchronization signal 606 pulses at the time t4. For example, the synchronization signal 606 transitions from the logic level 0 at the time t4 to the logic level 1 and remains at the logic level 1 from the time t4 to the time t5. Also, the synchronization signal 606 transitions from the logic level 1 to the logic level 0 at the time t5 to form a pulse 606-2, and remains at the logic level 0 from the time t5 to the time t20.

During the cycle 1 of the master clock signal 141, the pulse 606-1 is followed by a time interval of no pulses between the times t0.5 and t4, and the time interval is followed by the pulse 606-2. During the cycle 1 of the master clock signal 141, the synchronization signal 606 includes a time interval of no pulses of the synchronization signal 606 between the times t5 and t20.

In the same manner as that during the cycle 1 of the master clock signal 141, the synchronization signal 606 pulses during the time interval between the times t20 and t20.5, does not pulse from the time t20.5 to the time t24, pulses during the time interval between the times t24 and t25, and does not pulse between the time t25 and the time t40 during the cycle 2 of the master clock signal 141.

The ADC that is coupled to the sensor 402 (FIG. 4) starts and ends sampling data sensed by the sensor 402 from an analog form to the digital form in synchronization with the synchronization signal 606. For example, during the time interval between the times t0 and t0.5, the voltage 602 that is measured by the sensor 402 is sampled by the ADC, which is coupled to the sensor 402. The voltage that is sampled during the time interval between the times t0 and t0.5 is represented by a portion 602-1. In the example, during the time interval between the times t0.5 and t4, the voltage 602 that is measured by the sensor 402 is not sampled by the ADC coupled to the sensor 402. In the example, during the time interval between the times t4 and t5, the voltage 602 that is detected by the sensor 402 is sampled by the ADC coupled to the sensor 402. The voltage 602 that is sampled during the time interval between the times t4 and t5 is represented by a portion 602-2. Also, in the example, during the time interval between the times t5 and t20, the voltage 602 that is detected by the sensor 402 is not sampled by the ADC that is coupled to the sensor 402. In the same manner as that during the cycle 1 of the master clock signal 141, the voltage 602 is sampled or not sampled by the ADC coupled to the sensor 402 during the cycle 2 of the master clock signal 141.

In one embodiment, instead of two consecutive pulses, the synchronization signal 606 includes another number, such as three or four, of consecutive pulses.

In an embodiment, a frequency of occurrence of pulses of the synchronization signal 606 is different from that illustrated in FIG. 6B. For example, instead of occurring at a time interval of four time units, the pulses of the synchronization signal 606 occur at a time interval of three time units. For example, instead of the pulse 606-2 occurring at the time t4, the pulse 606-2 occurs at the time t3. In this example, a time unit is defined as a time interval between two consecutive times, such as the times t0 and t1 or the times t1 and t2.

In one embodiment, the voltage 602 is measured by the sensor 404 (FIG. 4) within the bias match instead of the sensor 402. In the embodiment, the synchronization signal 606 is an example of the synchronization signal 418 (FIG. 4) that is provided to the bias match for receiving measured data from the sensor 404 in synchronization with the synchronization signal 418.

In an embodiment, the voltage 602 is measured by the voltage sensor of the voltage sensor system 410 (FIG. 4) instead of the sensor 402. In the embodiment, the synchronization signal 606 is an example of the synchronization signal 426 (FIG. 4) that is provided to the voltage sensor system 410 for receiving measured data from the voltage sensor of the voltage sensor system 410 in synchronization with the synchronization signal 426.

In an embodiment, all pulses of the synchronization signal 606 are of the same duration. For example, the pulse 606-2 transitions from the logic level 1 to the logic level 0 at a time t4.5 instead of transitioning at the time t5. The time t4.5 is at half of a time interval between the times t4 and t5. In the embodiment, the ADC that is coupled to the sensor 402 converts data sensed by the sensor 402 from an analog form to a digital form when each pulse of the synchronization signal 606 is received by the ADC. The ADC converts the data sensed by the sensor 402 for the pre-determined amount of time for each pulse of the synchronization signal 606. For example, the ADC converts the data sensed by the sensor 402 for the pre-determined amount of time between the times t0 and t4 when a rising edge of the pulse 606-1 is received by the ADC and converts the data sensed by the sensor 402 for the pre-determined amount of time between the times t4 and t7 when a rising edge of the pulse 606-2 is received by the ADC. To illustrate, the ADC converts the data sensed by the sensor 402 from an analog form to a digital form starting at the time t0 until the pre-determined amount of time is reached. The ADC stops sampling the data sensed by the sensor 402 after the pre-determined amount of time until a next consecutive pulse of the synchronization signal 606 is received by the ADC. For example, the ADC stops converting the data from the time t2 until the time t4. The ADC converts the data sensed by the sensor 402 from an analog form to a digital form starting at the time t4 until the pre-determined amount of time is reached. The pre-determined amount of time is reached at the time t6.

In one embodiment, instead of initiating collection of data sensed by the sensor 402 at a rising edge of a pulse of the synchronization signal 606, the collection is initiated for the pre-determined amount of time and the pre-determined amount of time starts from a falling edge of the pulse. In the embodiment, the ADC that is coupled to the sensor 402 converts data sensed by the sensor 402 from an analog form to a digital form at a time of a falling edge of each pulse of the synchronization signal 606 received by the ADC. The ADC converts the data sensed by the sensor 402 for the pre-determined amount of time after the falling edge of the pulse of the synchronization signal 606. For example, the ADC converts the data sensed by the sensor 402 for the pre-determined amount of time between the times t0.5 and t4.5 after the falling edge of the pulse 606-1 is received by the ADC. The pre-determined amount of time starts at the time t0.5. The ADC stops sampling the data sensed by the sensor 402 after the pre-determined amount of time until a falling edge of a next consecutive pulse, such as the pulse 606-2, of the synchronization signal 606 is received by the ADC. The ADC further converts the data sensed by the sensor 402 for the pre-determined amount of time after the falling edge of the pulse 606-2. For example, suppose the pulse 606-2 transitions from the logic level 1 to the logic level 0 at the time t4.5 instead of transitioning at the time t5. The ADC converts the data sensed by the sensor 402 starting at the time t4.5 until the pre-determined amount of time is reached.

Figure 6C:
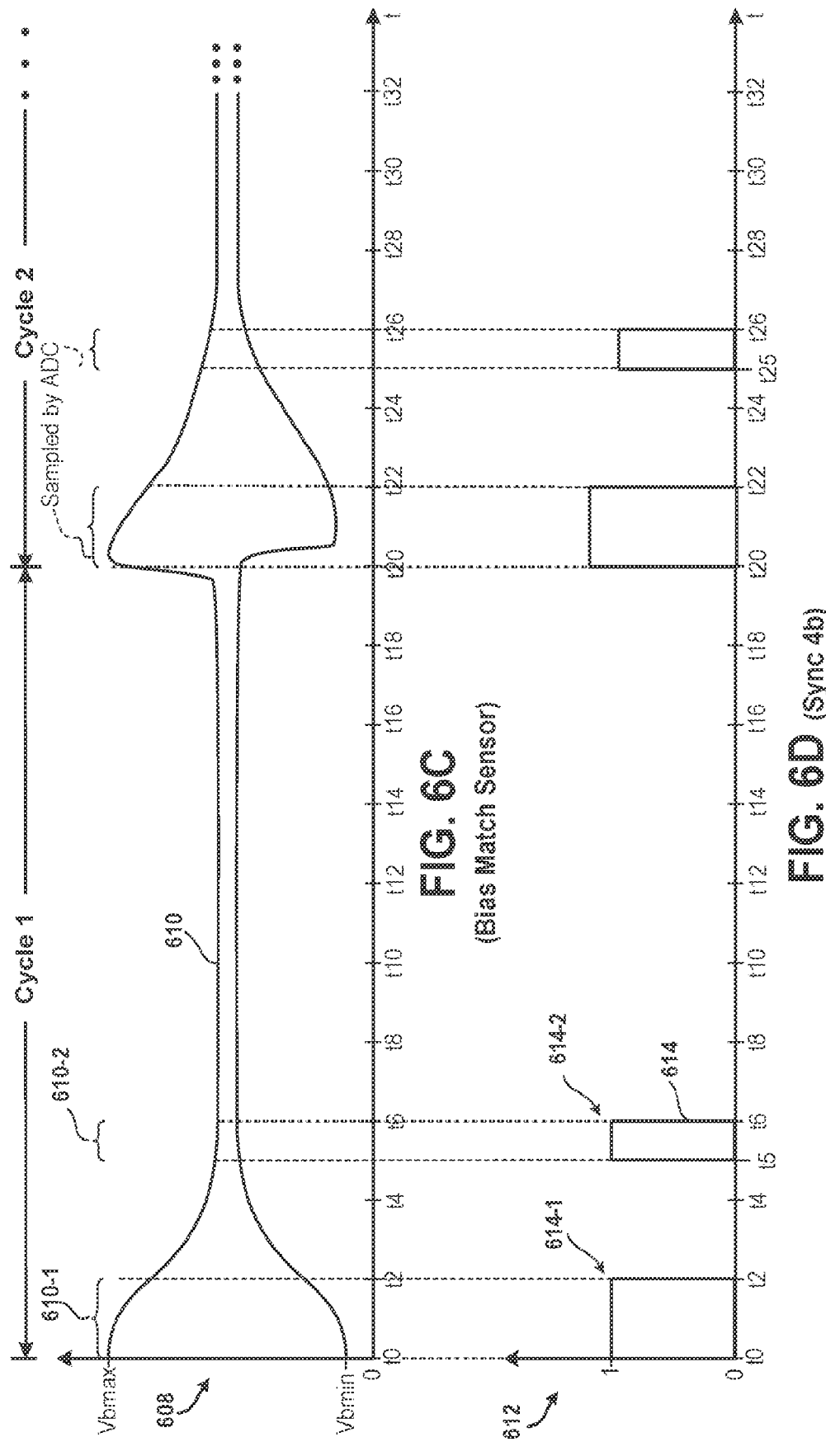
FIG. 6C depicts a graph to illustrate a plot of voltage versus the time.

FIG. 6C depicts a graph 608 to illustrate a plot of voltage 610 versus the time t. The voltage 610 is measured by the sensor 404 (FIG. 4) of the bias match. The voltage 610 is plotted on a y-axis and the time t is plotted on an x-axis. The voltage 610 varies between a maximum value Vbmax and a minimum value Vbmin.

FIG. 6D depicts a graph 612 for illustrating a synchronization signal 614 versus the time t. The graph 612 plots a logic level of the synchronization signal 614 on a y-axis and the time t on an x-axis. The synchronization signal 614 is an example of the synchronization signal 418 (FIG. 4) that is provided to the bias match.

The synchronization signal 614 pulses at the time t0. For example, the synchronization signal 614 transitions from the logic level 0 at the time t0 to the logic level 1 and remains at the logic level 1 from the time t0 to the time t2. Also, the synchronization signal 614 transitions from the logic level 1 to the logic level 0 at the time t2 to form a pulse 614-1, and remains at the logic level 0 from the time t2 to the time t5.

The synchronization signal 614 does not pulse from the time t2 to the time t5. For example, the synchronization signal 614 has the logic level 0 from the time t2 to the time t5. The synchronization signal 614 pulses at the time t5. For example, the synchronization signal 614 transitions from the logic level 0 at the time t5 to the logic level 1 and remains at the logic level 1 from the time t5 to the time t6. Also, the synchronization signal 614 transitions from the logic level 1 to the logic level 0 at the time t6 to form a pulse 614-2, and remains at the logic level 0 from the time t6 to the time t20.

During the cycle 1 of the master clock signal 141, the pulse 614-1 is followed by a time interval of no pulses between the times t2 and t5, and the time interval is followed by the pulse 614-2. During the cycle 1 of the master clock signal 141, the pulse 614-2 is followed by a time interval of no pulses of the synchronization signal 614 between the times t6 and t20.

In the same manner as that during the cycle 1 of the master clock signal 141, the synchronization signal 614 pulses during the time interval between the times t20 and t22, does not pulse from the time t22 to the time t25, pulses during the time interval between the times t25 and t26, and does not pulse between the time t26 and the time t40 during the cycle 2 of the master clock signal 141.

The ADC that is coupled to the sensor 404 (FIG. 4) starts and ends sampling data sensed by the sensor 404 from an analog form to the digital form in synchronization with the synchronization signal 614. For example, during the time interval between the times t0 and t2, the voltage 610 that is measured by the sensor 404 is sampled by the ADC, which is coupled to the sensor 404. The voltage that is sampled during the time interval between the times t0 and t2 is represented by a portion 610-1. In the example, during the time interval between the times t2 and t5, the voltage 610 that is measured by the sensor 404 is not sampled by the ADC coupled to the sensor 404. In the example, during the time interval between the times t5 and t6, the voltage 610 that is detected by the sensor 404 is sampled by the ADC coupled to the sensor 404. The voltage 610 that is sampled during the time interval between the times t5 and t6 is represented by a portion 610-2. Also, in the example, during the time interval between the times t6 and t20, the voltage 610 that is detected by the sensor 404 is not sampled by the ADC that is coupled to the sensor 404. In the same manner as that during the cycle 1 of the master clock signal 141, the voltage 610 is sampled or not sampled by the ADC coupled to the sensor 404 during the cycle 2 of the master clock signal 141.

In one embodiment, instead of two consecutive pulses, the synchronization signal 614 includes another number, such as three or four, of consecutive pulses.

In an embodiment, a frequency of occurrence of pulses of the synchronization signal 614 is different from that illustrated in FIG. 6D. For example, instead of occurring at a time interval of five time units, the pulses of the synchronization signal 614 occur at a time interval of six time units. For example, instead of the pulse 614-2 occurring at the time t5, the pulse 614-2 occurs at the time t6. In this example, a time unit is defined as a time interval between two consecutive times, such as the times t0 and t1 or the times t1 and t2.

In one embodiment, the voltage 610 is measured by the sensor 402 (FIG. 4) within the TCP match instead of the sensor 404. In the embodiment, the synchronization signal

614 is an example of the synchronization signal 416 (FIG. 4) that is provided to the TCP match for receiving measured data from the sensor 402 in synchronization with the synchronization signal 416.

In an embodiment, the voltage 610 is measured by the voltage sensor of the voltage sensor system 410 (FIG. 4) instead of the sensor 404. In the embodiment, the synchronization signal 614 is an example of the synchronization signal 426 (FIG. 4) that is provided to the voltage sensor system 410 for receiving measured data from the voltage sensor of the voltage sensor system 410 in synchronization with the synchronization signal 426.

In an embodiment, all pulses of the synchronization signal 614 are of the same duration. For example, suppose the pulse 614-2 transitions from the logic level 1 to the logic level 0 at the time t7 instead of transitioning at the time t6. In the embodiment, the ADC that is coupled to the sensor 404 of the bias match converts data sensed by the sensor 404 from an analog form to a digital form when each pulse of the synchronization signal 610 is received by the ADC. The ADC converts the data sensed by the sensor 404 for the pre-determined amount of time for each pulse of the synchronization signal 610. For example, the ADC converts the data sensed by the sensor 404 for the pre-determined amount of time between the times t0 and t5 when a rising edge of the pulse 614-1 is received by the ADC and converts the data sensed by the sensor 404 for the pre-determined amount of time between the times t5 and t10 when a rising edge of the pulse 614-2 is received by the ADC. To illustrate, the ADC converts the data sensed by the sensor 404 from an analog form to a digital form starting at the time t0 until the pre-determined amount of time is reached. The ADC stops sampling the data sensed by the sensor 404 after the pre-determined amount of time until a next consecutive pulse of the synchronization signal 614 is received by the ADC. For example, the ADC stops converting the data from the time t3 until the time t5. The ADC converts the data sensed by the sensor 404 from an analog form to a digital form starting at the time t5 until the pre-determined amount of time is reached.

In one embodiment, instead of initiating collection of data sensed by the sensor 404 at a rising edge of a pulse of the synchronization signal 614, the collection is initiated for the pre-determined amount of time and the pre-determined amount of time starts from a falling edge of the pulse. In the embodiment, the ADC that is coupled to the sensor 404 converts data sensed by the sensor 404 from an analog form to a digital form at a time of a falling edge of each pulse of the synchronization signal 614 received by the ADC. The ADC converts the data sensed by the sensor 404 for the pre-determined amount of time after the falling edge of the pulse of the synchronization signal 614. For example, the ADC converts the data sensed by the sensor 404 for the pre-determined amount of time between the times t2 and t3 after the falling edge of the pulse 614-1 is received by the ADC. The pre-determined amount of time starts at the time t2. The ADC stops sampling the data sensed by the sensor 404 after the pre-determined amount of time until a falling edge of a next consecutive pulse, such as the pulse 614-2, of the synchronization signal 614 is received by the ADC. The ADC further converts the data sensed by the sensor 404 for the pre-determined amount of time after the falling edge of the pulse 614-2. For example, suppose the pulse 614-2 transitions from the logic level 1 to the logic level 0 at the time t7 instead of transitioning at the time t6. The ADC converts the data sensed by the sensor 404 starting at the time t7 until the pre-determined amount of time is reached.

FIG. 7 is a diagram of an embodiment of a system 700 to illustrate use of one, such as a single, EtherCAT train, instead of multiple EtherCAT trains to transfer the pulsing preset signal 138 from the module controller to the bias match. The system 700 includes the same components as that of the system 400 of FIG. 4 except in the system 700, there is no use of the communication cable 126 that couples the TCP generator to the bias generator 1. Rather, the system 700 includes a communication cable 702 that couples the TCP generator to the TCP match, a communication cable 704 that couples the TCP match to the bias generator 1, and a communication cable 708 that couples the bias generator 2 to the bias match.

Moreover, the TCP generator includes a sensor 710, the bias generator 1 includes a sensor 712, and the bias generator 2 includes a sensor 714. An example of each sensor 710, 712, and 714 is a voltage sensor, or a current sensor, or a complex voltage and current sensor, or a power sensor. For example, data sensed by each sensor 710, 712, and 714 includes voltage values, or current values, or power values, or complex current and voltage values. The pulse controller is coupled to the TCP generator via a transfer cable 716, is coupled to the bias generator 1 via a transfer cable 718, and is coupled to the bias generator 2 via a transfer cable 720.

Also, in the system 700, the pulsing preset signal 138 includes the same instructions as those included within the factor control signal 415 (FIG. 4). For example, the pulsing preset signal 138 includes the instruction for the controller within the TCP match to change the factor of the TCP match to achieve the pre-determined factor. The pulsing preset signal 138 further includes another instruction for the controller within the bias match to change the factor of the bias match to achieve the pre-set factor.

The pulsing preset signal 138 is sent from the TCP generator via the communication cable 702 to the TCP match. Upon receiving the pulsing preset signal 138, the TCP match applies the instruction to change the factor of the TCP match to achieve the pre-determined factor and sends the pulsing preset signal 138 via the communication cable 704 to the bias generator 1. The bias generator 1 applies the same functions as those described above with respect to FIG. 1 to the pulsing preset signal 138 and sends the pulsing preset signal via the communication cable 128 to the bias generator 2. The bias generator 2 applies the same functions as those described above with reference to FIG. 1 to the pulsing preset signal 138, and sends the pulsing preset signal 138 via the communication cable 708 to the bias match.

Upon receiving the pulsing preset signal 138, the bias match applies the instruction to change the factor of the bias match to achieve the pre-set factor. Also, when the pulsing preset signal 138 is received from the bias generator 2, the match controller of the bias match receives and collects data sensed by the sensor 404 in the manner described above with reference to FIG. 4. The collected data is accessed by the match controller of the bias match. The collected data is then embedded by the bias match within the pulsing preset signal 138. After embedding the data, the bias match sends the pulsing preset signal 138 via the communication cable 708 to the bias generator 2.

The pulse controller generates a synchronization signal 724 and sends the synchronization signal 724 via the transfer cable 716 to the TCP generator. Similarly, the pulse controller generates a synchronization signal 726 and sends the synchronization signal 726 via the transfer cable 718 to the bias generator 1. Also, the pulse controller generates a synchronization signal 728 and sends the synchronization signal 728 via the transfer cable 720 to the bias generator 2.

In response to the reception of the synchronization signal 728, a controller within the bias generator 2 controls an ADC of the bias generator 2 to collect the data sensed by the sensor 714 in synchronization with the synchronization signal 728. The collected data is sent from the bias generator 2 via the communicable cable 128 to the bias generator 1 for sending the collected data back to the pulse controller. For example, the synchronization signal 728 includes a series of pulses including a first pulse and a second pulse. In response to reception of the first pulse of the synchronization signal 728 for a first time interval, the controller of the bias generator 2 controls the ADC coupled to the sensor 714 to convert data sensed by the sensor 714 from an analog form to a digital form for the first time interval to output digital data for the first time interval. The controller of the bias generator 2 receives the digital data output for the first time interval from the ADC, and stores the digital data within a memory device of the controller. When the pulsing preset signal 138 is received from the bias match, the controller accesses the digital data for the first time interval from the memory device. The digital data for the first time interval is embedded within the pulsing preset signal 138, which is sent via the communication cable 128 to the bias generator 1. Similarly, in response to reception of the second pulse of the synchronization signal 728 for a second time interval, the controller of the bias generator 2 controls the ADC coupled to the sensor 714 to convert data sensed by the sensor 714 from an analog form to a digital form for the second time interval to output digital data for the second time interval. The controller of the bias generator 2 receives the digital data output for the second time interval from the ADC of the bias generator 2, and stores the digital data within the memory device of the controller. When the pulsing preset signal 138 is received from the bias match, the controller of the bias generator 2 accesses the digital data for the second time interval from the memory device of the bias generator 2. The digital data for the second time interval is embedded within the pulsing preset signal 138, which is sent via the communication cable 128 to the bias generator 1. During a time interval in which a pulse of the synchronization signal 728 is not received by the bias generator 2, the controller of the bias generator 2 does not control the ADC of the bias generator 2 to convert data sensed by the sensor 714 from the analog form to the digital form.

Similarly, in response to the reception of the synchronization signal 726, a controller within the bias generator 1 controls an ADC of the bias generator 1 to collect the data sensed by the sensor 712 in synchronization with the synchronization signal 726. The collected data is then sent via the communication cable 704 to the TCP match for sending the collected data back to the pulse controller. For example, the synchronization signal 726 includes a series of pulses including a first pulse and a second pulse. In response to reception of the first pulse of the synchronization signal 726 for a first time interval, the controller of the bias generator 1 controls the ADC coupled to the sensor 712 to convert data sensed by the sensor 712 from an analog form to a digital form for the first time interval to output digital data for the first time interval. The controller of the bias generator 1 receives the digital data output for the first time interval from the ADC, and stores the digital data within a memory device of the controller. When the pulsing preset signal 138 is received from the bias generator 2, the controller accesses the digital data for the first time interval from the memory device, embeds the digital data within the pulsing preset signal 138, which is sent via the communication cable 704 to the TCP match. Similarly, in response to reception of the second pulse of the synchronization signal 726 for a second time interval, the controller of the bias generator 1 controls the ADC coupled to the sensor 712 to convert data sensed by the sensor 712 from an analog form to a digital form for the second time interval to output digital data for the second time interval. The controller of the bias generator 1 receives the digital data output for the second time interval from the ADC of the bias generator 1, and stores the digital data within the memory device of the controller. When the pulsing preset signal 138 is received from the bias generator 1, the controller of the bias generator 1 accesses the digital data for the second time interval from the memory device of the bias generator 1, embeds the digital data within the pulsing preset signal 138, which is sent via the communication cable 704 to the TCP match. During a time interval in which a pulse of the synchronization signal 726 is not received by the bias generator 1, the controller of the bias generator 1 does not control the ADC of the bias generator 1 to convert data sensed by the sensor 712 from the analog form to the digital form.

When the pulsing preset signal 138 is received from the bias generator 1, the match controller of the TCP match accesses data sensed by the sensor 402 from the memory device of the match controller. The accessed data is embedded by the TCP match within the pulsing preset signal 138 and sent via the communication cable 702 to the TCP generator.

In response to the reception of the synchronization signal 724, a controller within the TCP generator controls an ADC of the TCP generator to collect the data sensed by the sensor 710 in synchronization with the synchronization signal 724. The collected data is sent from the TCP generator to the pulse controller. For example, the synchronization signal 724 includes a series of pulses including a first pulse and a second pulse. In response to reception of the first pulse of the synchronization signal 724 for a first time interval, the controller of the TCP generator controls the ADC coupled to the sensor 710 to convert data sensed by the sensor 710 from an analog form to a digital form for the first time interval to output digital data for the first time interval. The controller of the TCP generator receives the digital data output for the first time interval from the ADC, and stores the digital data within a memory device of the controller. When the pulsing preset signal 138 is received from the TCP generator, the controller of the TCP generator accesses the digital data for the first time interval from the memory device. The digital data for the first time interval is embedded within the pulsing preset signal 138, which is sent via the communication cable 118 to the pulse controller. Similarly, in response to reception of the second pulse of the synchronization signal 724 for a second time interval, the controller of the TCP generator controls the ADC of the TCP generator to convert data sensed by the sensor 710 from an analog form to a digital form for the second time interval to output digital data for the second time interval. The controller of the TCP generator receives the digital data output for the second time interval from the ADC, and stores the digital data within the memory device of the controller. When the pulsing preset signal 138 is received from the TCP match, the controller accesses the digital data for the second time interval from the memory device. The digital data for the second time interval is embedded within the pulsing preset signal 138, which is sent via the communication cable 118 to the pulse controller. During a time interval in which a pulse of the synchronization signal 724 is not received by the TCP generator, the controller of the TCP generator does not control the ADC to convert data sensed by the sensor 710 from the analog form to the digital form.

In response to reception of data sensed by one or more of the sensors 710, 402, 712, 714, and 404, the pulse controller controls one or more of components, such as the TCP generator, the bias generator 1, the bias generator 2, the TCP match, and the bias match. For example, upon determining that reflected power sensed by the sensor 710 is high, the pulse controller controls the TCP generator to change a power level of the RF signal 102 (FIG. 1) to reduce an amount of power supplied by the TCP generator.

In one embodiment, the sensor 710 is located outside the TCP generator and is coupled to the output O1 of the TCP generator.

In an embodiment, the sensor 712 is located outside the bias generator 1 and is coupled to the output O3 of the bias generator 1.

In one embodiment, the sensor 714 is located outside the bias generator 2 and is coupled to the output O4 of the bias generator 2.

In an embodiment, the functions described herein as being performed by a controller are performed by a processor of the controller.

In an embodiment, the system 700 excludes one or more of the sensors 710, 712, and 714.

FIG. 8 is a diagram of an embodiment of a system 800 to illustrate that sensor data is sent from a sensor to the pulse controller via an Ethernet cable instead of via an EtherCAT train. The system 800 is the same in structure and function as the system 300 of FIG. 3 except that the system 800 includes the sensors 402 and 404, the voltage sensor system 410, and the OES system 412. The system 800 further includes an Ethernet cable 802 that couples the TCP match to the pulse controller, another Ethernet cable 804 that couples the bias match to the pulse controller, an Ethernet cable 806 that couples the voltage sensor system 410 to the pulse controller, and another Ethernet cable 808 that couples the OES system 412 to the pulse controller.

In response to receiving the synchronization signal 416 via the transfer cable 120, the ADC coupled to the sensor 402 converts data sensed by the sensor 402 from an analog form to a digital form in synchronization with pulses of the synchronization signal 416 to output digital measured data, and provides the digital measured data to the match controller of the TCP match. The match controller of the TCP match sends the digital measured data via the Ethernet cable 802 to the pulse controller.

Similarly, upon receiving the synchronization signal 418 via the transfer cable 417, the ADC coupled to the sensor 404 converts data sensed by the sensor 404 from an analog form to a digital form in synchronization with pulses of the synchronization signal 418 to output digital measured data, and provides the digital measured data to the controller of the TCP match. The controller of the bias match sends the digital measured data via the Ethernet cable 804 to the pulse controller.

Also, in response to receiving the synchronization signal 426 via the transfer cable 420, the ADC of the voltage sensor system 410 converts data sensed by the voltage sensor of the voltage sensor system 410 from an analog form to a digital form in synchronization with pulses of the synchronization signal 426 to output digital measured data, and sends the digital measured data to the controller of the voltage sensor system 410. The controller of the voltage sensor system 410 sends the digital measured data via the Ethernet cable 806 to the pulse controller.

In a similar manner, upon receiving the synchronization signal 428 via the transfer cable 422, the ADC of the OES system 412 converts data sensed by the OES of the OES system 412 from an analog form to a digital form in synchronization with pulses of the synchronization signal 428 to output digital measured data, and sends the digital measured data to the controller of the OES system 412. The controller of the OES system 412 sends the digital measured data via the Ethernet cable 808 to the pulse controller.

In one embodiment, the TCP generator includes the sensor 710 (FIG. 7), and is coupled to the pulse controller via an Ethernet cable. Upon receiving multiple pulses the synchronization signal 724 (FIG. 7) via the transfer cable 716 (FIG. 7), the ADC of the TCP generator converts data sensed by the sensor 710 in synchronization with the pulses from an analog form to a digital form to output measured digital data. The TCP generator sends the measured digital data via the Ethernet cable to the pulse controller.

In an embodiment, the bias generator 1 includes the sensor 712 (FIG. 7), and is coupled to the pulse controller via an Ethernet cable. Upon receiving multiple pulses of the synchronization signal 726 (FIG. 7) via the transfer cable 718 (FIG. 7), the ADC of the bias generator 1 converts data sensed by the sensor 712 in synchronization with the pulses from an analog form to a digital form to output measured digital data. The bias generator 1 sends the measured digital data via the Ethernet cable to the pulse controller.

In one embodiment, the bias generator 2 includes the sensor 714 (FIG. 7), and is coupled to the pulse controller via an Ethernet cable. Upon receiving multiple pulses the synchronization signal 728 via the transfer cable 720 (FIG. 7), the ADC of the bias generator 2 converts data sensed by the sensor 714 in synchronization with the pulses from an analog form to a digital form to output measured digital data. The bias generator 2 sends the measured digital data via the Ethernet cable to the pulse controller.

In one embodiment, instead of each of the Ethernet cables 802 and 804, the connection cable is used.

In an embodiment, instead of an Ethernet cable for each sensor of an RF generator, described herein, the connection cable is used to transfer measured digital data from the RF generator to the pulse controller.

Figures 9, 10:
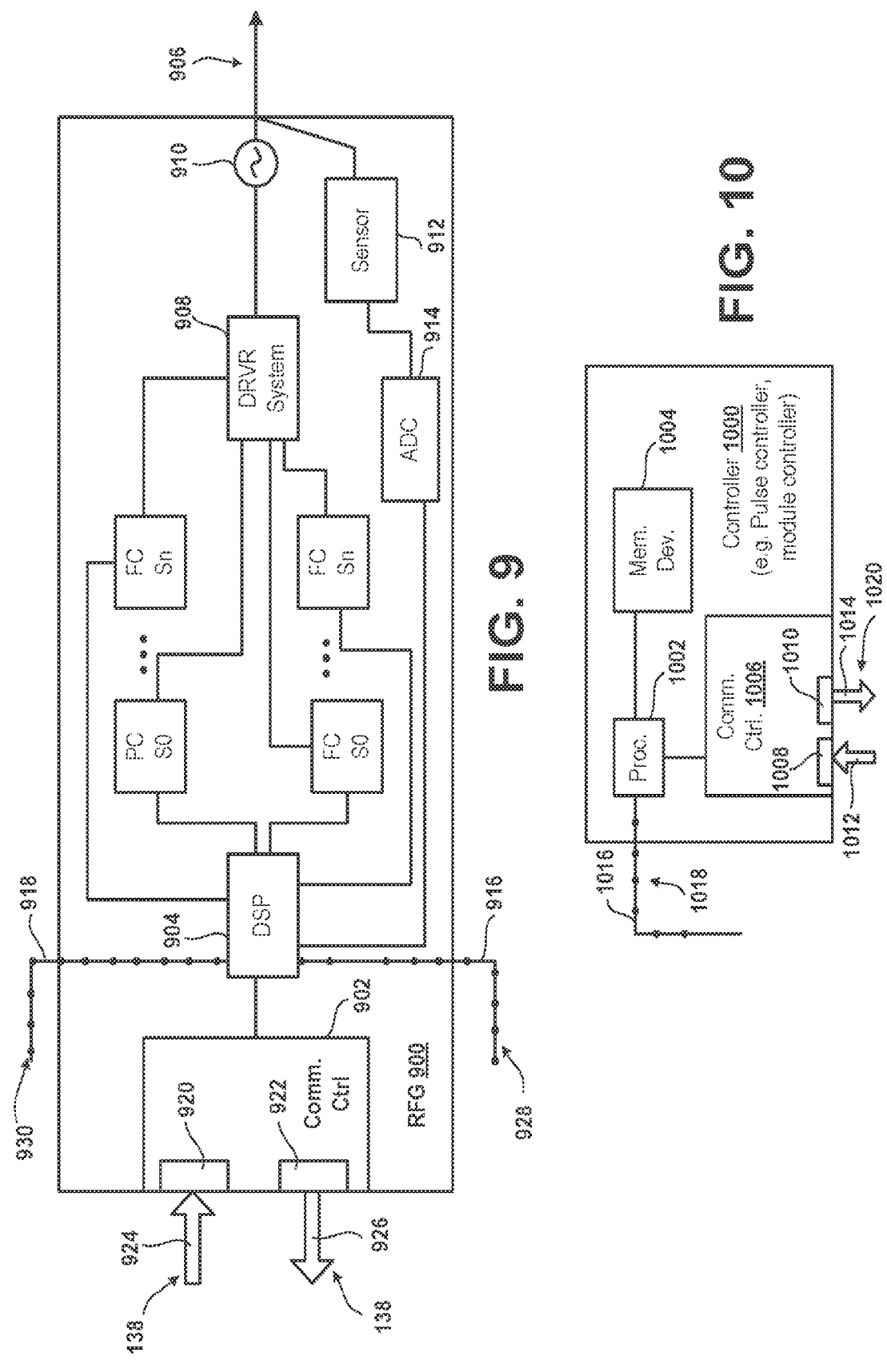
FIG. 9 is a diagram of an embodiment of an RF generator to illustrate components of the RF generator.
FIG. 10 is a diagram of an embodiment of a controller, which is an example of the pulse controller or the module controller.

FIG. 9 is a diagram of an embodiment of an RF generator 900 to illustrate components of the RF generator 900. The RF generator 900 is an example of the TCP generator, or the bias generator 1, or the bias generator 2 (FIG. 1). The RF generator 900 includes a communication controller 902 and a digital signal processor (DSP) 904. The RF generator 900 further includes multiple parameter controllers. For example, the RF generator 900 includes a parameter controller for each state. To illustrate, the RF generator 900 includes a parameter controller PCS0 for the state S0 of an RF signal 906 to be generated by the RF generator 900 and a parameter controller PCSn for a state Sn of the RF signal 906, where n is a positive integer. Examples of the parameter include power and voltage. As another example, the RF generator 900 includes a frequency controller for each state. To illustrate, the RF generator 900 includes a frequency controller FCS0 for the state S0 of the RF signal 906 and a parameter controller FCSn for the state Sn of the RF signal 906.

The RF signal 906 is an example of the RF signal 102, 104, or 106 (FIG. 1). For example, when the RF generator 900 is the TCP generator, the RF signal 906 is an example of the RF signal 102 and when the RF generator 900 is the bias generator 1, the RF signal 906 is an example of the RF signal 104.

The RF generator 900 includes a driver system 908, which includes one or more drivers that are coupled to each other. An example of each driver is a transistor. The RF generator 900 includes a power supply 910, such as an electronic oscillator or an RF oscillator that generates sinusoidal RF signals or sinusoidal RF waveforms. The RF generator 900 further includes a sensor 912 and an ADC 904. The sensor 912 is an example of the sensor 710, or the sensor 712, or the sensor 714 (FIG. 7).

The DSP 904 is coupled to the communication controller 902, to the parameter controllers PCS0 through PCSn, and to the frequency controllers FCS0 through FCSn. The DSP 904 is coupled to a transfer cable 916. The transfer cable 916 is an example of the transfer cable 120 or the transfer cable 122 or the transfer cable 124 (FIG. 1). The DSP 904 is coupled to another transfer cable 918, which is an example of the transfer cable 716 (FIG. 7) or the transfer cable 718 (FIG. 7) or the transfer cable 720 (FIG. 7).

The controllers PRS0 through PRSn and the frequency controllers FCS0 through FCSn are coupled to the driver system 908, which is coupled to the power supply 910. An output of the power supply 910 is coupled to the sensor 912. The sensor 912 is coupled to the ADC 914, which is coupled to the DSP 904.

The communication controller 902 includes a port 920 and a port 922. The port 920 is coupled to a communication cable 924 and the port 922 is coupled to a communication cable 926. When the RF generator 900 is the TCP generator, the communication cable 924 is an example of the communication cable 118 (FIG. 1) and the communication cable 926 is an example of the communication cable 126 (FIG. 1). Also, when the RF generator 900 is the bias generator 1, the communication cable 924 is an example of the communication cable 126 (FIG. 1) and the communication cable 926 is an example of the communication cable 128 (FIG. 1). Moreover, when the RF generator 900 is the bias generator 1, the communication cable 924 is an example of the communication cable 704 (FIG. 7) and the communication cable 926 is an example of the communication cable 128 (FIG. 7). When the RF generator 900 is the bias generator 2, the communication controller 902 excludes the port 926 and the communication cable 924 is an example of the communication cable 128 (FIGS. 1 and 7).

The communication controller 902 receives the pulsing preset signal 138 via the port 920 and determines whether an address within the pulsing preset signal 138 matches a pre-stored address of the RF generator 900. The pre-stored address is stored within one or more memory devices of the communication controller 902. The module controller or the pulse controller (FIG. 1) embeds the address of the RF generator 900 within the pulsing preset signal 138. Upon determining that the address within the pulsing preset signal 138 matches the pre-stored address of the RF generator 900, the communication controller 902 extracts the information regarding duty cycles and variables of the RF signal 906, and sends the information regarding duty cycles and variables to the DSP 904. Also, the communication controller 902 extracts the information regarding a portion of a cycle of the master clock signal 141 for which multiple states of the RF signal 906 are to be generated and provides the information to the DSP 904.

The DSP 904 identifies from the information regarding duty cycles and variables, information regarding duty cycles and parameter levels for each state of the parameter of the RF signal 906 and further identifies information regarding duty cycles and frequency levels for each state of the frequency of the RF signal 906. The DSP 904 sends the duty cycle and the parameter level for the state S0 to the parameter controller PRS0 for storage in one or more memory devices of the parameter controller PRS0 and sends the duty cycle0 and the parameter level for the state Sn to the parameter controller PRSn for storage in one or more memory devices of the parameter controller PRSn. Also, the DSP 904 sends the duty cycle0 and the frequency level for the state S0 to the frequency controller FCS0 for storage in one or more memory devices of the frequency controller FCS0 and sends the duty cycle and the frequency level for the state Sn to the frequency controller FCSn for storage in one or more memory devices of the frequency controller FCSn.

When a pulse of a synchronization signal 928 is received via the transfer cable 916, the DSP 904 sends the pulse to the parameter controllers PRS0 through PCSn and to the frequency controllers FCS0 through FCSn. The synchronization signal 928 is an example of the synchronization signal 140, or 142, or 144 (FIG. 1). Upon receiving the pulse of the synchronization signal 928, the parameter controller PRS0 generates a current signal based on the parameter level for the state S0 of the RF signal 906 for a time interval of the duty cycle of the state S0 and sends the current signal to the driver system 908. Also, upon receiving the pulse of the synchronization signal 928, the frequency controller FCS0 generates a current signal based on the frequency level for the state S0 of the RF signal 906 for the time interval of the duty cycle of the state S0 and sends the current signal to the driver system 908. Upon receiving the current signals for the state S0 from the controllers PCS0 and FCS0, the driver system 908 generates a current signal for the state S0 and sends the current signal to the power supply 910. Upon receiving the current signal, the power supply 910 generates the state S0 of the parameter and the frequency of the RF signal 906.

Similarly, upon receiving the pulse of the synchronization signal 928, the parameter controller PRSn generates a current signal based on the parameter level for the state Sn of the RF signal 906 for a time interval of the duty cycle of the state Sn and sends the current signal to the driver system 908. Also, upon receiving the pulse of the synchronization signal 928, the frequency controller FCSn generates a current signal based on the frequency level for the state Sn of the RF signal 906 for the time interval of the duty cycle of the state S0 and sends the current signal to the driver system 908. Upon receiving the current signals for the state Sn from the controllers PCSn and FCSn, the driver system 908 generates a current signal for the state Sn and sends the current signal to the power supply 910. Upon receiving the current signal, the power supply 910 generates the state Sn of the parameter and the frequency of the RF signal 906. In a similar manner, for each additional pulse of the synchronization signal 928, the states S0 through Sn of the parameter and of the frequency of the RF signal 906 are generated by the power supply 910.

It should be noted that during a time interval in which a pulse of the synchronization signal 928 is not received by the DSP 904, the states of the variable of the RF signal 906 are not generated by the power supply 910. For example, during a time interval in which the synchronization signal 928 does not include a pulse, the DSP 904 does not control the controllers PCS0 through PCSn and the frequency controllers FCS0 through FCSn to generate the states S0 through Sn of the variable of the RF signal 906. To illustrate, the RF signal 902 has a power level of zero during a time interval in which the synchronization signal 928 does not include a pulse.

Based on the information regarding a portion of a cycle of the master clock signal 141 for which multiple states of the RF signal 906 are to be generated, the DSP 904 sends different variable levels and different duty cycles to the controllers PCS0 through PCSn and FCS0 through FCSn. For example, upon determining that the count of a number of pulses of the synchronization signal 928 is exceeded, the DSP 904 sends different variables and different duty cycles to the controllers PCS0 through PCSn and FCS0 through FCSn than those sent before the count is exceeded. As another example, upon determining that a time interval of the cycle 1 after receiving a pulse of the synchronization signal 928 has passed, the DSP 904 sends different variables and different duty cycles to the controllers PCS0 through PCSn and FCS0 through FCSn than those sent before the time interval has passed.

When the RF signal 906 is generated, the sensor 912 senses data, such as voltage, or current, or complex voltage and current sensor, or power, at the output of the power supply 910, to provide measured data to the ADC 914. The DSP 904 receives a synchronization signal 930 via the transfer cable 918 and sends the synchronization signal 930 to the ADC 914. During a time interval in which a pulse of the synchronization signal 930 is received, the ADC 914 converts the measured data from an analog form to a digital form to output digital measured data and sends the digital measured data to one or more memory devices of the DSP 904. Also, during a time interval in which the synchronization signal 930 does not have a pulse, the ADC 914 does not convert the measured data from an analog form to a digital form and digital measured data is not output from the ADC 914. The synchronization signal 930 is an example of the synchronization signal 724 or 726 or 728 (FIG. 7).

The pulsing preset signal 138 is received by the communication controller 902 at the port 926. While the pulsing preset signal 138 is being transferred from the port 926 to the port 920, the communication controller 902 sends a request to the DSP 904 for the digital measured data stored within the one or more memory devices of the DSP 904. Upon receiving the request, the DSP 904 accesses the digital measured data from the one or more memory devices of the DSP 904 and sends the digital measured data to the communication controller 902. The communication controller 902 embeds the digital measured data within the pulsing preset signal 138 and sends the pulsing preset signal 138 via the port 920 to the communication cable 924.

In an embodiment in which the communication controller 902 includes the port 920 and excludes the port 922, the pulsing preset signal 138 is received at the port 920 and is routed back to the port 920 via the communication controller 902. While the pulsing preset signal 138 is routed back to the port 920, the request for the digital measured data is generated by the communication controller 902 and the digital measured data received is embedded within the pulsing preset signal 138.

In one embodiment, the functions described herein as being performed by a communication controller are performed by a processor of the communication controller.

In the embodiment in which one or more Ethernet cables are used for point-to-point communication, the one or more Ethernet cables are coupled to the DSP 904. In the embodiment, the RF generator 900 does not include the communication controller 902 used for generating EtherCAT trains but includes a communication controller for generating Ethernet packets and for extracting information from the Ethernet packets.

In an embodiment, the DSP 904 is an example of a controller.

In one embodiment, the functions described herein as being performed by the DSP 904, the controllers PCS0 through PCSn, and the controller FCS0 through FCSn are performed by one or more controllers.

In an embodiment, there is a switch, such as one or more transistors coupled to each other, coupled to the DSP 904. The switch couples the ADC 914 to the sensor 912. Upon receiving a pulse of the synchronization signal 928, the DSP 904 controls the switch to turn on the switch. The tuning on of the switch enables the ADC 914 to obtain data from the sensor 912 and convert the data from an analog format to a digital format. For example, the DSP 904 controls the switch to turn on for the pre-determined amount of time starting from a time at which the pulse of the synchronization signal 928 is received by the DSP 904. After the pre-determined amount of time, the DSP 904 controls the switch to turn off. The turning off of the switch disables the ADC 914 from receiving the data sensed by the sensor 912 and converting the data from an analog format to a digital format. As another example, the DSP 904 controls the switch to turn on for a time interval for which the pulse of the synchronization signal 928 has the logic level 1. At a time the pulse transitions to the logic level 0, the DSP 904 controls the switch to turn off.

FIG. 10 is a diagram of an embodiment of a controller 1000, which is an example of the pulse controller or the module controller (FIG. 1). The controller 1000 includes a processor 1002, a memory device 1004, and a communication controller 1006. The processor 1002 is coupled to the memory device 1004 and to the communication controller 1006. The communication controller 1006 includes a port 1008 and another port 1010.

The port 1008 is coupled to a communication cable 1012 and the port 1010 is coupled to another communication cable 1014. It should be noted that when the controller 1000 is the module controller, the communication controller 1006 excludes the port 1008. Also, when the communication controller 1006 is the module controller, the communication cable 1014 is an example of the communication cable 116 (FIG. 1). When the communication controller 1006 is the pulse controller, the communication cable 1012 is an example of the communication cable 116 and the communication cable 1014 is an example of the communication cable 118 (FIG. 1). The processor 1002 is coupled to a transfer cable 1016, which is an example of the transfer cable 120, or 122, or 124, or 414, or 417, or 420, or 422 (FIG. 4), or 716, or 718, or 720 (FIG. 7).

When the controller 1000 is the module controller, the communication controller 1002 generates a preset signal 1020, such as the pulsing preset signal 138 (FIG. 1) or the factor control signal 415 (FIG. 4), and sends the preset signal 1020 via the communication cable 1014 to the pulse controller. For example, the processor 1002 receives the information regarding duty cycles and variables for the RF signals 102, 104, and 106 from a user via an input device, and provides the information to the communication controller 1006. The communication controller 1006 embeds the information received from the processor 1002 within an EtherCAT train and sends the EtherCAT train via the communication cable 1014 to the pulse controller. The communication controller 1002 further embeds addresses of one or more components of the system 400 to which the EtherCAT train is to be sent. Examples of the components of the system 400 include the TCP generator, the bias generator 1, the bias generator 2, the TCP match, and the bias match. Examples of the input device includes a mouse, a keyboard, a touch-screen, and a stylus. The input device is coupled to the processor 1002.

As another example, the processor 1002 receives the pre-determined factor for the TCP match and the pre-set factor for the bias match from the input device, and generates the instruction for the match controller within the TCP match to change a factor to achieve the pre-determined factor, and the instruction for the match controller within the bias match to change a factor of the bias match to achieve the pre-set factor. The processor 1002 provides the instruction for the match controller within the TCP match to change a factor to achieve the pre-determined factor, and the instruction for the match controller within the bias match to change a factor of the bias match to achieve the pre-set factor to the communication controller 1006. The communication controller 1006 embeds, within the EtherCAT train, the instructions received from the processor 1002 and addresses of components of the system 400. Examples of components of the system 400 to which the EtherCAT train, such as the factor control signal 415, is to be sent include the TCP match and the bias match. The communication controller 1006 sends the EtherCAT train via the communication cable 1014 to the pulse controller.

When the communication controller 1000 is the pulse controller, the communication controller 1000 receives, at the port 1012, the pulsing preset signal 138 or the factor control signal 415 from the module controller via the communication cable 1012. The communication controller 1000 sends the pulsing preset signal 138 or the factor control signal 415 via the port 1010 and the communication cable 1014.

In an embodiment in which the controller 1000 is the pulse controller and one or more Ethernet cables are used for point-to-point communication, the Ethernet cables are coupled to the processor 1002. Also, in this embodiment, the controller 1000 excludes the communication controller 1006 used for generating EtherCAT trains but includes a communication controller for generating Ethernet packets and for extracting information from the Ethernet packets.

When the controller 1000 is the pulse controller, the processor 1002 generates a synchronization signal 1018, and sends the synchronization signal 1018 via the transfer cable 1016. The synchronization signal 1018 is an example of the synchronization signal 140, or 142, or 144, or 416, or 418, or 426, or 428 (FIG. 4), or 724, or 726, or 728 (FIG. 7).

In one embodiment, the communication controller 1000 includes a third port that is coupled to a third communication cable. The factor control signal 415 is sent via the third communication cable.

In an embodiment, the controller 1000 includes any number of processors and any number of memory devices, and the processors are coupled to the memory devices. The processors execute the same functions that are performed by the processor 1002.

Figure 11:
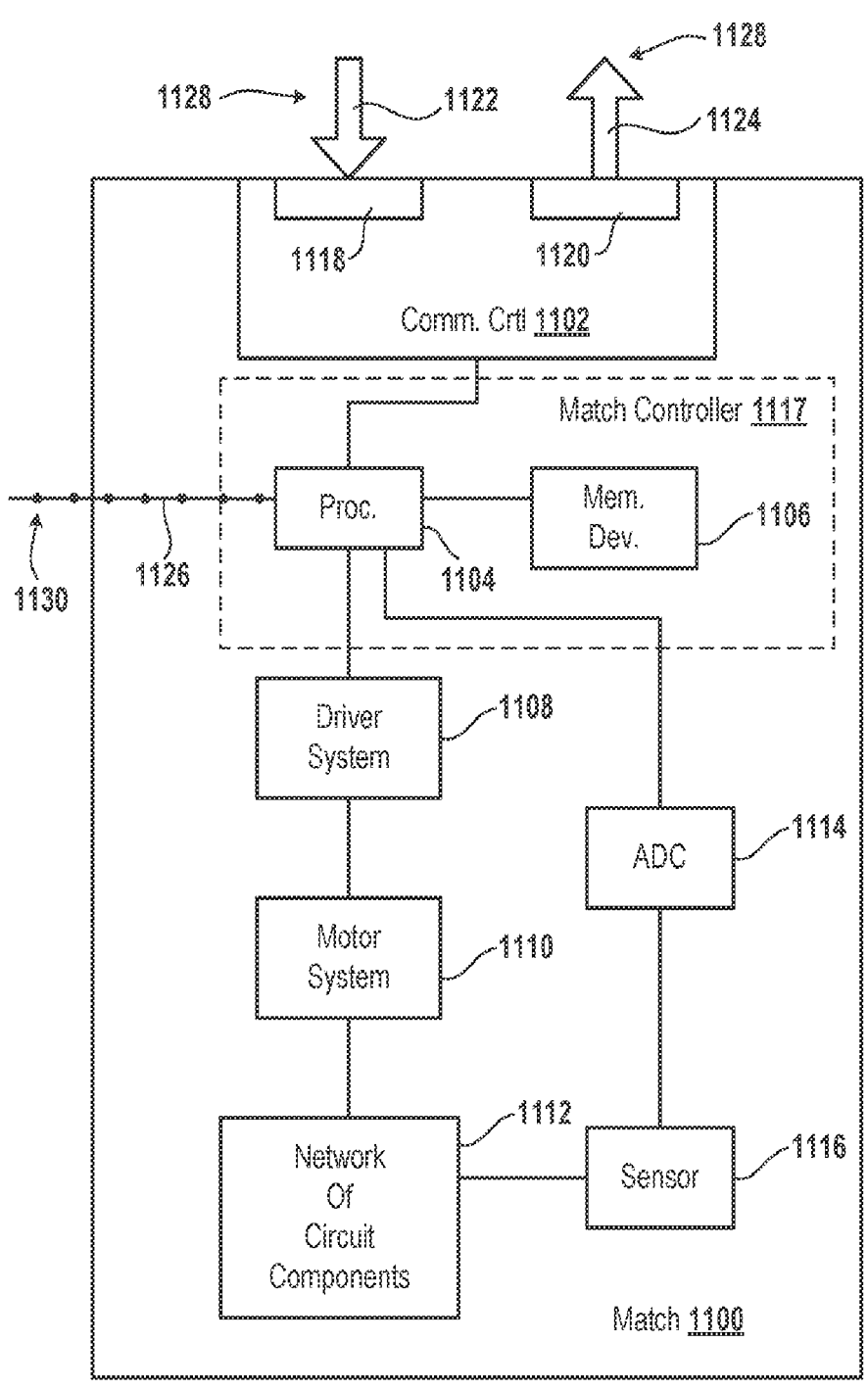
FIG. 11 is a diagram of an embodiment of a match, which is an example of the TCP match or the bias match.

FIG. 11 is a diagram of an embodiment of a match 1100, which is an example of the TCP match or the bias match (FIG. 1). The match 1100 includes a communication controller 1102, a processor 1104, a memory device 1106, a driver system 1108, a motor system 1110, a network 1112 of circuit components, an ADC 1114, and a sensor 1116. The processor 1104 and the memory device 1106 are components of a match controller 1117 of the match 1100. The sensor 1116 is an example of the sensor 402 or 404 (FIG. 4). The communication controller 1102 includes a port 1118 and another port 1120.

The driver system 1108 includes one or more drivers that are coupled to each other. The motor system 1110 includes one or more electric motors. Each motor is coupled to a circuit component, such as a variable inductor or a variable capacitor, of the match 1100. The network 1112 includes the circuit components, such as resistors, capacitors, or inductors, or a combination thereof.

The processor 1104 is coupled to the memory device 1106 and to the communication controller 1102. The processor 1104 is also coupled to the driver system 1108, which is coupled to the motor system 1110. The ADC 1114 is coupled to the sensor 1116 and to the processor 1104.

The processor 1104 is coupled to a transfer cable 1126. The transfer cable 1126 is an example of the transfer cable 414 or 417 (FIG. 4). The port 1118 is coupled to a communication cable 1122 and the port 1120 is coupled to the communication cable 1124. When the match 1100 is the TCP match, the communication cable 1122 is an example of the communication cable 406 and the communication cable 1124 is an example of the communication cable 408 (FIG. 4). When the match 1100 is the bias match, the communication controller 1102 excludes the port 1120. Also, when the match 1100 is the bias match, the communication cable 1122 is an example of the communication cable 408.

The sensor 1116 is coupled to the network 1112. For example, the sensor 1116 is coupled to an input of the network 1112 or an output of the network 1112. To illustrate, when the network 1112 includes a single branch circuit that is coupled to a single RF generator, such as the TCP generator, the sensor 1116 is coupled to an input of the signal branch circuit and the input is between the RF generator and the single branch circuit. As another illustration, when the network 1112 includes a single branch circuit that is coupled to a single RF generator, such as the TCP generator, the sensor 1116 is coupled to an output of the signal branch circuit and the output is between the single branch circuit and the plasma chamber 108 (FIG. 1). As yet another illustration, when the network 1112 includes a first branch circuit that is coupled to the bias generator 1 and a second branch circuit that is coupled to the bias generator 2, the sensor 1116 is coupled to an output of the first and second branch circuits or is coupled to an input of the first branch circuit or is coupled to an input of the second branch circuit. The input of the first branch circuit is between the first branch circuit and the bias generator 1 and the input of the second branch circuit is between the second branch circuit and the bias generator 2. The first and second branch circuits are coupled to each other at the output, which is coupled via the RF transmission line 139 (FIG. 1) to the substrate support 110 (FIG. 1).

The communication controller 1102 receives a preset signal 1128, such as the pulsing preset signal 138 or the factor control signal 415, via the communication cable 1122 and the port 1118 and determines whether an address within the preset signal 1128 matches a pre-stored address of the match 1100. The pre-stored address is stored within one or more memory devices of the communication controller 1102. The module controller or the pulse controller (FIG. 1) embeds the address of the match 1100 within the preset signal 1128. Upon determining that the address within the preset signal 1128 matches the pre-stored address of the match 1100, the communication controller 1102 extracts an instruction to achieve a pre-fixed factor, such as the instruction to achieve the pre-determined factor or the instruction to achieve the pre-set factor, from the preset signal 1128, and sends the instruction to the processor 1104.

The processor 1104 identifies the pre-fixed factor from the instruction. The processor 1104 generates and sends a control signal to execute the instruction to achieve the pre-fixed factor and sends the control signal to the driver system 1108. Upon receiving the control signal, the driver system 1108 generates a drive signal and sends the drive signal to the motor system 1110. A motor of the motor system 1110 operates based on the drive signal. When the motor operates, a circuit component of the network 1112 is controlled to achieve the pre-fixed factor. For example, when the motor operates, a plate of a variable capacitor moves with respect to another plate of the variable capacitor to achieve a pre-fixed capacitance.

When the match 1100 is the TCP match, the communication controller 1102 determines that the preset signal 1128 is to be sent to the bias match. The determination is made based on a comparison of an address of the bias match within the preset signal 1128 and a pre-stored address of the bias match. The pre-stored address of the bias match is stored within the one or more memory devices of the communication controller 1102. The communication controller 1102 sends the preset signal 1128 via the port 1120 and the communication cable 1124 to the bias match.

The sensor 1116 senses data, such as voltage, or current, or complex voltage and current sensor, or power, to provide measured data to the ADC 1114. The processor 1126 receives a synchronization signal 1130 via the transfer cable 1126 and sends the synchronization signal 1130 to the ADC 1114. During a time interval in which a pulse of the synchronization signal 1130 is received, the ADC 1114 converts the measured data from an analog form to a digital form to output digital measured data and sends the digital measured data to the processor 1104 for storage in the memory device 1106. For example, the processor 1104 collects, such as stores or writes, the digital measured data received from the ADC 1114 in the memory device 1106. Also, during a time interval in which the synchronization signal 1130 does not have a pulse, the ADC 1114 does not convert the measured data from an analog form to a digital form and digital measured data is not output from the ADC 1114. The synchronization signal 1130 is an example of the synchronization signal 416 or 418 (FIG. 4).

The pulsing preset signal 1128 is received by the communication controller 1102 at the port 1120. While the pulsing preset signal 1128 is being transferred from the port 1120 to the port 1118, the communication controller 1102 sends a request to the processor 1104 for the digital measured data stored within the memory device 1106. Upon receiving the request, the processor 1104 accesses the digital measured data from the memory device 1106 and sends the digital measured data to the communication controller 1102. The communication controller 1102 embeds the digital measured data within the pulsing preset signal 1128 and sends the pulsing preset signal 1124 via the port 1118 to the communication cable 1122.

In an embodiment in which the communication controller 1102 includes the port 1118 and excludes the port 1120, the pulsing preset signal 1128 is received at the port 1118 and is routed back to the port 1118 by the communication controller 1102. While the pulsing preset signal 1128 is routed back to the port 1118, the request for the digital measured data stored in the memory device 1106 is generated by the communication controller 1102. The digital measured data is received by the communication controller 1102 and embedded within the pulsing preset signal 1128.

In the embodiment in which one or more Ethernet cables are used for point-to-point communication, the Ethernet cables are coupled to the processor 1104. In the embodiment, the match 1100 does not include the communication controller 1102 used for generating EtherCAT trains but includes a communication controller for generating Ethernet packets and for extracting information from the Ethernet packets.

In one embodiment, the sensor 1116 is located outside the match 1110.

In an embodiment, the processor 1104, the memory device 1106, the ADC 1114, and the sensor 1116 are components of a sensor system.

In an embodiment, there is a switch, such as one or more transistors coupled to each other, coupled to the processor 1104. The switch couples the processor 1104 to the sensor 1116. Upon receiving a pulse of the synchronization signal 1130, the processor 1104 controls the switch to turn on the switch. The tuning on of the switch enables the ADC 1114 to obtain data from the sensor 1116 and convert the data from an analog format to a digital format. For example, the processor 1104 controls the switch to turn on for the pre-determined amount of time starting from a time at which the pulse of the synchronization signal 1130 is received by the processor 1104. After the pre-determined amount of time, the processor 1104 controls the switch to turn off. The turning off of the switch disables the ADC 1114 from receiving the data sensed by the sensor 1116 and converting the data from an analog format to a digital format. As another example, the processor 1104 controls the switch to turn on for a time interval for which the pulse of the synchronization signal 1130 has the logic level 1. At a time the pulse transitions to the logic level 0, the processor 1104 controls the switch to turn off.

Figure 12:
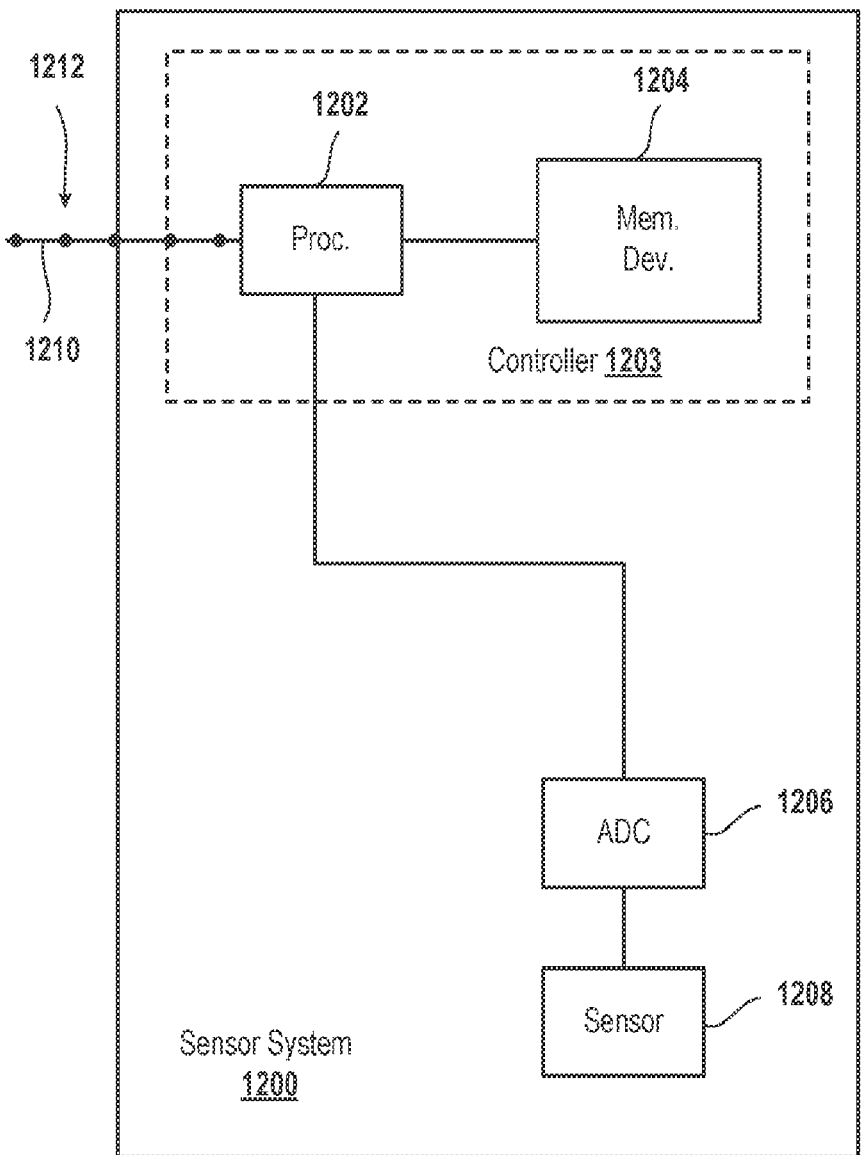
FIG. 12 is a diagram of an embodiment of a sensor system.

FIG. 12 is a diagram of an embodiment of a sensor system 1200, which is an example of the OES system 412 (FIG. 4) or the voltage sensor system 414 (FIG. 4). The sensor system 1200 includes a processor 1202, a memory device 1204, an ADC 1206, and a sensor 1208. The sensor 1208 is an example of the OES of the OES system 412 or the voltage sensor of the voltage sensor system 414. The processor 1202 and the memory device 1204 are components of a controller 1203 of the sensor system 1200.

The processor 1202 is coupled to a transfer cable 1210, which is an example of the transfer cable 420 or 422 (FIG. 4). The processor 1202 is coupled to the memory device 1204 and to the ADC 1206, which is coupled to the sensor 1208.

The sensor 1208 senses data, such as voltage, or intensity, to provide measured data to the ADC 1206. The processor 1202 receives a synchronization signal 1212 via the transfer cable 1210 and sends the synchronization signal 1212 to the ADC 1206. During a time interval in which a pulse of the synchronization signal 1212 is received, the ADC 1206 converts the measured data from an analog form to a digital form to output digital measured data and sends the digital measured data to the processor 1202. The processor 1202 sends the measured data for the time interval via the transfer cable 1212. Also, during a time interval in which the synchronization signal 1212 does not have a pulse, the ADC 1206 does not convert the measured data from an analog form to a digital form and digital measured data is not output from the ADC 1206. The synchronization signal 1212 is an example of the synchronization signal 426 or 428 (FIG. 4).

In an embodiment, there is a switch, such as one or more transistors coupled to each other, coupled to the processor 1202. The switch couples the processor 1202 to the sensor 1208. Upon receiving a pulse of the synchronization signal 1212, the processor 1202 controls the switch to turn on the switch. The tuning on of the switch enables the ADC 1206 to obtain data from the sensor 1208 and convert the data from an analog format to a digital format. For example, the processor 1202 controls the switch to turn on for the pre-determined amount of time starting from a time at which the pulse of the synchronization signal 1212 is received by the processor 1202. After the pre-determined amount of time, the processor 1202 controls the switch to turn off. The turning off of the switch disables the ADC 1206 from receiving the data sensed by the sensor 1208 and converting the data from an analog format to a digital format. As another example, the processor 1202 controls the switch to turn on for a time interval for which the pulse of the synchronization signal 1212 has the logic level 1. At a time the pulse transitions to the logic level 0, the processor 1202 controls the switch to turn off.

Figure 13:
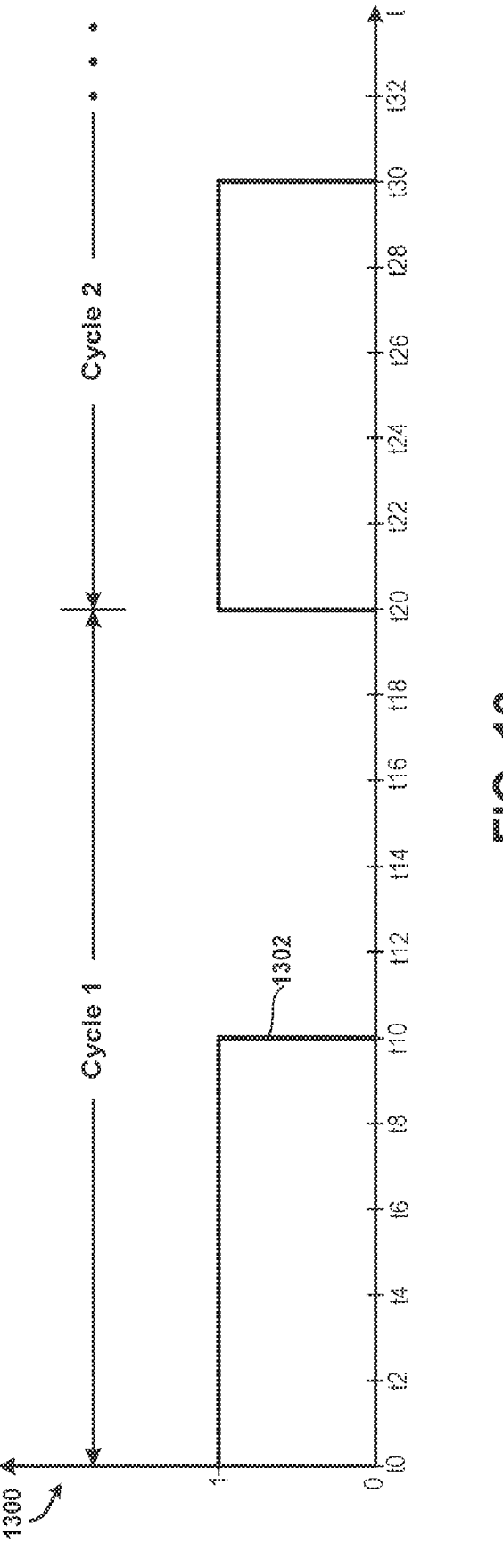
FIG. 13 depicts a graph to illustrate a clock signal.

FIG. 13 depicts a graph 1300 to illustrate a clock signal 1302. The clock signal 1302 is an example of the master clock signal 141 (FIG. 1). The graph 1300 plots a logic level of the clock signal 1302 on a y-axis and the time t on an x-axis. The clock signal 1302 pulses from the logic level 0 to the logic level 1 at the time t0 and remains at the logic level 1 from the time t0 to the time t10. The clock signal 1302 pulses from the logic level 1 to the logic level 0 at the time t10 and remains at the logic level 0 from the time t10 to the time t20 for the cycle 1 of the clock signal 1302. The clock signal 1302 pulses in the same manner during the cycle 2 of the clock signal 1302 as that during the cycle 1 of the clock signal 1302. For example, the clock signal 1302 pulses from the logic level 0 to the logic level 1 at the time t20 and remains at the logic level 1 from the time t20 to the time t30. The clock signal 1302 pulses from the logic level 1 to the logic level 0 at the time t30. The clock signal 1302 remains at the logic level 0 from the time t30 to the time t40 to form the cycle 2 of the clock signal 1302.

It should be noted that the clock signal 1302 is different from a synchronization signal, described herein. For example, the synchronization signal 202 (FIG. 2A) is periodic during one or more time intervals of each cycle of the clock signal 130 and is not periodic during one or more remaining time intervals of the cycle. To illustrate, the synchronization signal 202 pulses in a periodic manner for a time interval between the times t0 and t16 of each cycle of the clock signal 1302 and then stops pulsing during the remaining time interval between the times t16 and t20 of the cycle. The clock signal 1302 is periodic in that it has one pulse during each cycle of the clock signal 1302.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks coupled to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining the variables, the factors, the variables, etc., for carrying out a particular process on or for a semiconductor wafer or to a system. The program instructions are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change variables of current processing, to set processing steps to follow a current processing, or to start a new process.

In some embodiments, a remote computer (e.g. a server) provides process recipe to a system over a network, which includes a local network or the Internet. The remote computer includes a user interface that enables entry or programming of variables and/or settings, which are then communicated to the system from the remote computer. In some examples, the controller receives instructions in the form of data, which specify the variables, factors, and/or variables for each of the processing steps to be performed during one or more operations. It should be understood that the variables, factors, and/or variables are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems to which the methods, described herein, are applied include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semi-conductor processing systems that is associated or used in the fabrication and/or manufacturing of semiconductor wafers.

It is further noted that in some embodiments, the above-described operations apply to several types of plasma cham-bers, e.g., a plasma chamber including an inductively coupled plasma (ICP) reactor, a capacitively-coupled plasma (CCP) plasma chamber, a transformer coupled plasma chamber, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc. In the CCP plasma chamber, a top plate is used as a upper electrode instead of one or more RF coils.

As noted above, depending on the process step or steps to be performed by the tool, the host computer communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufactur-ing factory.

With the above embodiments in mind, it should be under-stood that some of the embodiments employ various com-puter-implemented operations involving data stored in com-puter systems. These operations are those physically manipulating physical quantities. Any of the operations described herein that form part of the embodiments are useful machine operations.

Some of the embodiments also relate to a hardware unit or an apparatus for performing these operations. The appa-ratus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-read-able medium. The non-transitory computer-readable medium is any data storage hardware unit, e.g., a memory device, etc., that stores data, which is thereafter be read by a computer system. Examples of the non-transitory com-puter-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a com-puter-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distrib-uted in a system which allows the occurrence of the method operations at various intervals, or are performed in a differ-ent order than that described above.

It should further be noted that in an embodiment, one or more features from any embodiment described above are combined with one or more features of any other embodi-ment without departing from a scope described in various embodiments described in the present disclosure.

Although the foregoing embodiments have been described in some detail for purposes of clarity of under-standing, it will be apparent that certain changes and modi-fications can be practiced within the scope of appended claims. Accordingly, the present embodiments are to be considered as illustrative and not restrictive, and the embodiments are not to be limited to the details given herein.

The invention claimed is:

1. A method comprising:

receiving, by a radio frequency (RF) generator, a first set of one or more variable levels and one or more duty cycles of an RF signal;

receiving, by the RF generator from a pulse controller, a synchronization signal having a plurality of pulses;

generating, during a clock cycle of a clock signal, mul-tiple instances of a first plurality of states of the RF signal in synchronization with the plurality of pulses of the synchronization signal, each of the first plurality of states of the RF signal has a corresponding one of the one or more variable levels of the first set and a corresponding one of the one or more duty cycles of the first set;

receiving a second set of one or more variable levels and one or more duty cycles of the RF signal;

receiving a count of a number of pulses of the synchro-nization signal after which the RF signal is to include the second set of one or more variable levels and one or more duty cycles, the synchronization signal is different from the clock signal;

determining whether the count is exceeded; and generating a first instance of a second plurality of states of the RF signal in response to determining that the count is exceeded, each of the second plurality of states of the RF signal has a corresponding one of the one or more variable levels of the second set and a corresponding one of the one or more duty cycles of the second set.

2. The method of claim 1, during a time interval between two consecutive ones of the plurality of pulses of the synchronization signal, a pulse of the synchronization signal is not received, the method further comprising:

generating an instance of a single state of the RF signal during the time interval.

3. The method of claim 1, the first set of one or more variable levels and one or more duty cycles is received by the RF generator before the synchronization signal is received.

4. The method of claim 1, a frequency of occurrence of the plurality of pulses is changeable by the pulse controller.

5. The method of claim 1, the plurality of states includes two states, or three states, or four states.

6. The method of claim 1, the one or more variable levels of the first set are one or more power levels.

7. The method of claim 1, each of the one or more duty cycles of the first set is of the corresponding one of the one or more variable levels of the first set.

8. The method of claim 1, the first instance of a second plurality of states of the RF signal is generated during the clock cycle of the clock signal.

9. The method of claim 1, the second set of one or more variable levels and one or more duty cycles is received by the RF generator before the synchronization signal is received.

10. The method of claim 1, the one or more variable levels of the second set are one or more power levels.

11. The method of claim 1, each of the one or more duty cycles of the second set is of the corresponding one of the one or more variable levels of the second set.

12. The method of claim 1, the first set of one or more variable levels and one or more duty cycles is received by the RF generator before the synchronization signal is received and the second set of one or more variable levels and one or more duty cycles is received by the RF generator before the synchronization signal is received.

* * * * *